(12) United States Patent
Düggeli et al.

(10) Patent No.: US 8,975,359 B2
(45) Date of Patent: Mar. 10, 2015

(54) DIKETOPYRROLOPYRROLE POLYMERS FOR USE IN ORGANIC SEMICONDUCTOR DEVICES

(75) Inventors: Mathias Düggeli, Thürnen (CH); Mahmoud Zaher Eteish, Huningue (FR); Pascal Hayoz, Hofstetten (CH); Olivier Frédéric Aebischer, Düdingen (CH); Marta Fonrodona Turon, Blanes (ES); Mathieu G. R. Turbiez, Rixheim (FR)

(73) Assignee: BASF SE, Ludwigshafen (DE)

( * ) Notice: Subject to any disclaimer, the term of this patent is extended or adjusted under 35 U.S.C. 154(b) by 341 days.

(21) Appl. No.: 13/126,178

(22) PCT Filed: Oct. 21, 2009

(86) PCT No.: PCT/EP2009/063769
§ 371 (c)(1),
(2), (4) Date: May 23, 2011

(87) PCT Pub. No.: WO2010/049323
PCT Pub. Date: May 6, 2010

(65) Prior Publication Data
US 2011/0215313 A1  Sep. 8, 2011

(30) Foreign Application Priority Data

Oct. 31, 2008 (EP) .................................. 08168010
Dec. 5, 2008 (EP) .................................. 08170823

(51) Int. Cl.
*C08G 14/06* (2006.01)
*C08G 61/12* (2006.01)
*H01L 51/00* (2006.01)
*C09B 69/10* (2006.01)

(52) U.S. Cl.
CPC ............ *C08G 61/124* (2013.01); *C08G 61/126* (2013.01); *H01L 51/0036* (2013.01); *H01L 51/0043* (2013.01); *H01L 51/0053* (2013.01); *C09B 69/109* (2013.01); *Y02E 10/549* (2013.01)
USPC .............................. 528/163; 257/40; 327/331

(58) Field of Classification Search
USPC .......... 257/40, E51.012; 427/331; 528/8, 367
See application file for complete search history.

(56) References Cited

U.S. PATENT DOCUMENTS

| | | |
|---|---|---|
| 5,856,434 A | 1/1999 | Stern |
| 6,451,459 B1 | 9/2002 | Tieke |
| 7,932,344 B2 | 4/2011 | Li |
| 2007/0228359 A1 | 10/2007 | Heim |
| 2009/0065878 A1 | 3/2009 | Li |
| 2009/0302311 A1 | 12/2009 | Turbiez |

FOREIGN PATENT DOCUMENTS

| | | |
|---|---|---|
| EP | 2033983 A2 | 3/2009 |
| EP | 2034537 A | 3/2009 |
| EP | 2075274 A | 7/2009 |
| JP | 4093083 A | 3/1992 |
| WO | 2005/049695 A | 6/2005 |
| WO | 2008/000664 A | 1/2008 |
| WO | 2009/047104 A | 4/2009 |
| WO | 2010/049321 A1 | 5/2010 |

OTHER PUBLICATIONS

Burgi et al., Advanced materials, vol. 20, Jun. 4, 2008, pp. 2217-2224.
Peet et al., Applied Physics letters, AIP, American Institute of Physics, Vo. 93, No. 16, Oct. 22, 2008 pp. 163306-1 thru 163306-3.
English Language Abstract of JP 4093083 Mar. 26, 1992.
Beyerlein, T. et al., "New photoluminescent conjugated polymers with 1,4-dioxo-3,6-diphenylpyrrolo[3,4-c]pyrrole (DPP) and 1,4-phenylene units in the main chain", Macromolecular Rapid Communications, 2000, vol. 21, Issue 4, pp. 182-189.
Beyerlein, T. et al., "Red electroluminescence from a 1,4-diketopyrrolo[3,4-c]pyrrole (DPP)-based conjugated polymer", Synthetic Metals, 2002, vol. 130, Issue 2, pp. 115-119.
Wienk, M.M. et al, "Narrow-Bandgap Diketo-Pyrrolo-Pyrrole Polymer Solar Cells: The Effect of Processing on the Performance", Advanced Materials, 2008, vol. 220, Issue 13, pp. 2556-2560.

*Primary Examiner* — Shane Fang
(74) *Attorney, Agent, or Firm* — Shruti Costales

(57) ABSTRACT

The present invention relates to polymers comprising one or more (repeating) unit(s) of the formula (I), and at least one (repeating) unit(s) which is selected from repeating units of the formula (II), (III) and (IV); and polymers of the formula III, or IV and their use as organic semiconductor in organic devices, especially in organic photovoltaics (solar cells) and photodiodes, or in a device containing a diode and/or an organic field effect transistor. The polymers according to the invention have excellent solubility in organic solvents and excellent film-forming properties. In addition, high efficiency of energy conversion, excellent field-effect mobility, good on/off current ratios and/or excellent stability can be observed, when the polymers according to the invention are used in organic field effect transistors, organic photovoltaics (solar cells) and photodiodes.

$\{A\text{-}D\}$  (I)

$\{B\text{-}D\}$  (II)

$\{A\text{-}E\}$  (III)

$\{B\text{-}E\}$  (IV)

16 Claims, No Drawings

DIKETOPYRROLOPYRROLE POLYMERS FOR USE IN ORGANIC SEMICONDUCTOR DEVICES

The present invention relates to polymers comprising one or more (repeating) unit(s) of the formula —[ A-D ]—, and at least one (repeating) unit(s) which is selected from repeating units of the formula —[ B-D ]—, —[ A-E ]—, and —[ B-E ]—; and polymers of the formula III, or IV and their use as organic semiconductor in organic devices, especially in organic photovoltaics (solar cells) and photodiodes, or in a device containing a diode and/or an organic field effect transistor. The polymers according to the invention have excellent solubility in organic solvents and excellent film-forming properties. In addition, high efficiency of energy conversion, excellent field-effect mobility, good on/off current ratios and/or excellent stability can be observed, when the polymers according to the invention are used in organic field effect transistors, organic photovoltaics (solar cells) and photodiodes.

U.S. Pat. No. 6,451,459 (cf. B. Tieke et al., Synth. Met. 130 (2002) 115-119; Macromol. Rapid Commun. 21 (4) (2000) 182-189) describes diketopyrrolopyrrole based polymers and copolymers comprising the following units

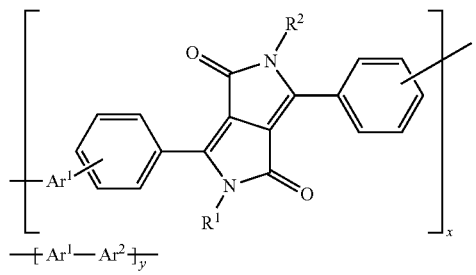

wherein x is chosen in the range of from 0.005 to 1, preferably from 0.01 to 1, and y from 0.995 to 0, preferably 0.99 to 0, and wherein x+y=1, and wherein $Ar^1$ and $Ar^2$ independently from each other stand for

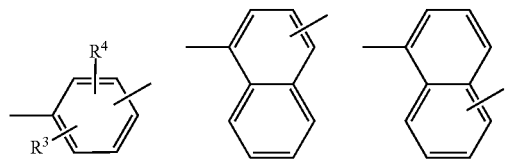

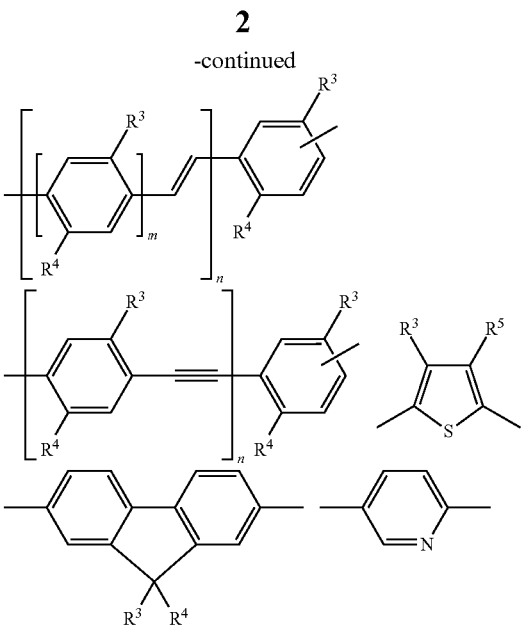

and m, n being numbers from 1 to 10, and $R^1$ and $R^2$ independently from each other stand for H, $C_1$-$C_{18}$alkyl, —C(O)O—$C_1$-$C_{18}$alkyl perfluoro-$C_1$-$C_{12}$alkyl, unsubstituted $C_6$-$C_{12}$aryl or one to three times with $C_1$-$C_{12}$alkyl, $C_1$-$C_{12}$alkoxy, or halogen substituted $C_6$-$C_{12}$aryl, $C_1$-$C_{12}$alkyl-$C_6$-$C_{12}$aryl, or $C_6$-$C_{12}$aryl-$C_1$-$C_{12}$alkyl, $R^3$ and $R^4$ preferably stand for hydrogen, $C_1$-$C_{12}$alkyl, $C_1$-$C_{12}$alkoxy, unsubstituted $C_6$-$C_{12}$aryl or one to three times with $C_1$-$C_{12}$alkyl, $C_1$-$C_{12}$alkoxy, or halogen substituted $C_6$-$C_{12}$aryl or perfluoro-$C_1$-$C_{12}$alkyl, and $R^5$ preferably stands for $C_1$-$C_{12}$alkyl, $C_1$-$C_{12}$alkoxy, unsubstituted $C_6$-$C_{12}$aryl or one to three times with $C_1$-$C_{12}$alkyl, $C_1$-$C_{12}$alkoxy, or halogen substituted $C_6$-$C_{12}$aryl, or perfluoro-$C_1$-$C_{12}$alkyl, and their use in EL devices. The following polymer

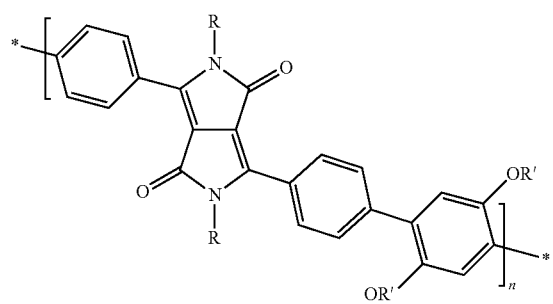

is explicitly disclosed in Tieke et al., Synth. Met. 130 (2002) 115-119. The following polymers

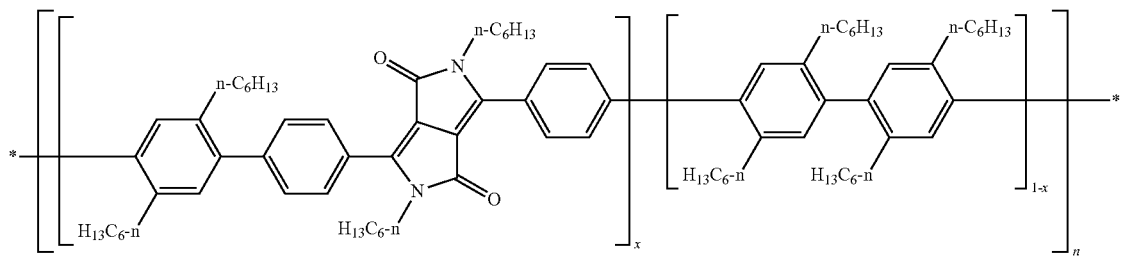

are explicitly disclosed in Macromol. Rapid Commun. 21 (4) (2000) 182-189.

WO05/049695 discloses diketopyrrolopyrrole (DPP) based polymers and their use in PLEDs, organic integrated circuits (O-ICs), organic field effect transistors (OFETs), organic thin film transistors (OTFTs), organic solar cells (O-SCs), or organic laser diodes, but fails to disclose the specific DPP based polymers of formula I.

A preferred polymer comprises a repeating unit of formula

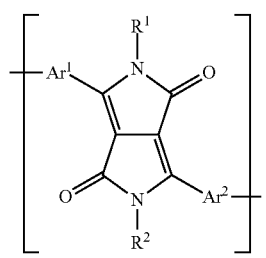

(I)

and a repeating unit $-\!\!+\!\!Ar^3\!\!+\!\!-$, wherein $R^1$ and $R^2$ are independently of each other a $C_1$-$C_{25}$alkyl group, especially a $C_4$-$C_{12}$alkyl group, which can be interrupted by one or more oxygen atoms, and $Ar^1$ and $Ar^2$ are independently of each other a group of formula

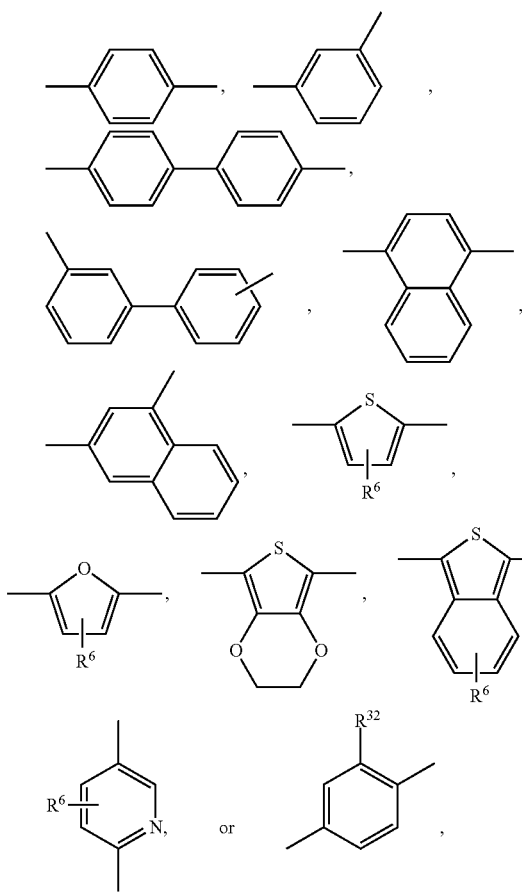

wherein —$Ar^3$— is a group of formula

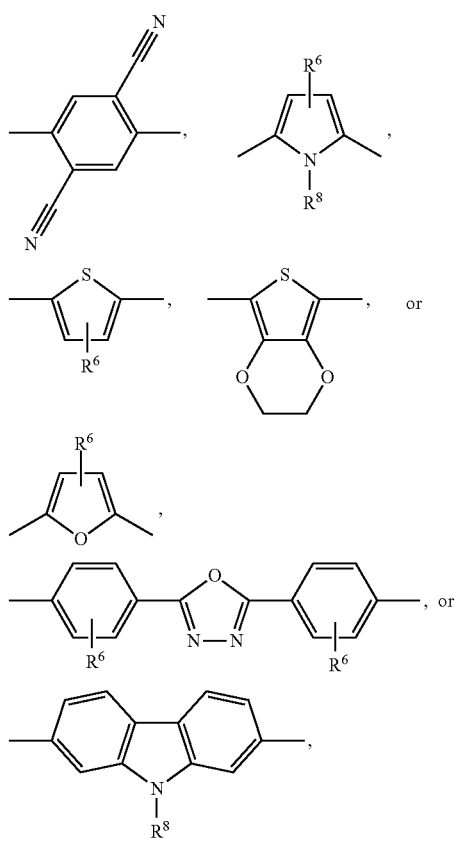

wherein $R^6$ is hydrogen, $C_1$-$C_{18}$alkyl, or $C_1$-$C_{18}$alkoxy, and $R^{32}$ is methyl, Cl, or OMe, and $R^8$ is H, $C_1$-$C_{18}$alkyl, or $C_1$-$C_{18}$alkyl which is substituted by E and/or interrupted by D, especially $C_1$-$C_{18}$alkyl which is interrupted by —O—.

In Example 12 the preparation of the following polymer is described:

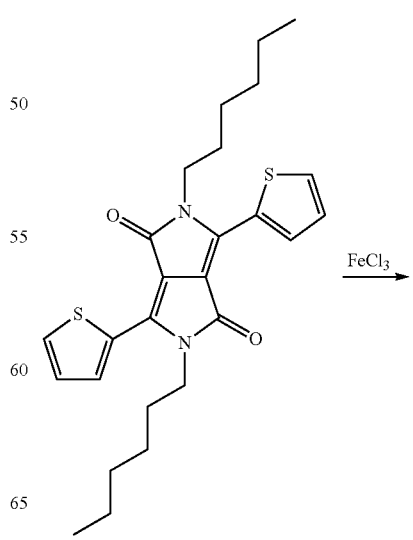

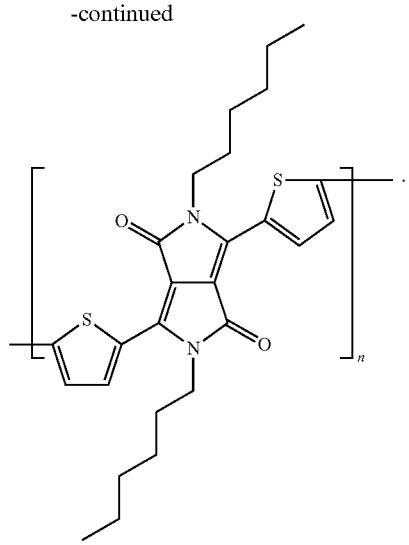

WO08/000664 describes polymers comprising (repeating) unit(s) of the formula

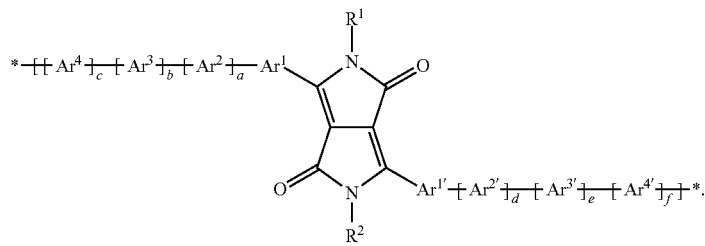

Ar$^1$ and Ar$^{1'}$ are preferably the same and are a group of formula

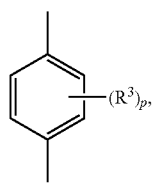

especially

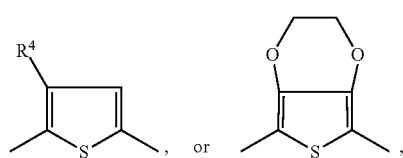

and

Ar$^2$, Ar$^{2'}$, Ar$^3$, Ar$^{3'}$, Ar$^4$ and Ar$^{4'}$ are independently of each other a group of formula

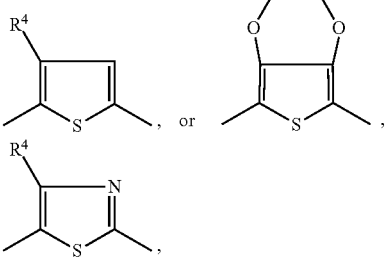

wherein p stands for 0, 1, or 2, R$^3$ may be the same or different within one group and is selected from C$_1$-C$_{25}$alkyl, which may optionally be substituted by E and/or interrupted by D, or C$_1$-C$_{18}$alkoxy, which may optionally be substituted by E and/or interrupted by D;

R$^4$ is C$_6$-C$_{25}$alkyl, which may optionally be substituted by E and/or interrupted by D, C$_6$-C$_{14}$aryl, such as phenyl, naphthyl, or biphenylyl, which may optionally be substituted by G, C$_1$-C$_{25}$alkoxy, which may optionally be substituted by E and/or interrupted by D, or C$_7$-C$_{15}$aralkyl, wherein ar may optionally be substituted by G, D is —CO—, —COO—, —S—, —SO—, —SO$_2$—, —O—, —NR$^{25}$—, wherein R$^{25}$ is C$_1$-C$_{12}$alkyl, such as methyl, ethyl, n-propyl, iso-propyl, n-butyl, isobutyl, or sec-butyl;

E is —OR$^{29}$; —SR$^{29}$; —NR$^{25}$R$^{25}$; —COR$^{28}$; —COOR$^{27}$; —CONR$^{25}$R$^{25}$; or —CN; wherein R$^{25}$, R$^{27}$, R$^{28}$ and R$^{29}$ are independently of each other C$_1$-C$_{12}$alkyl, such as methyl, ethyl, n-propyl, iso-propyl, n-butyl, isobutyl, sec-butyl, hexyl, octyl, or 2-ethyl-hexyl, or C$_6$-C$_{14}$ aryl, such as phenyl, naphthyl, or biphenylyl, G has the same preferences as E, or is C$_1$-C$_{18}$alkyl, especially C$_1$-C$_{12}$alkyl, such as methyl, ethyl, n-propyl, iso-propyl, n-butyl, isobutyl, sec-butyl, hexyl, octyl, or 2-ethyl-hexyl.

The following polymers were disclosed in the Examples:
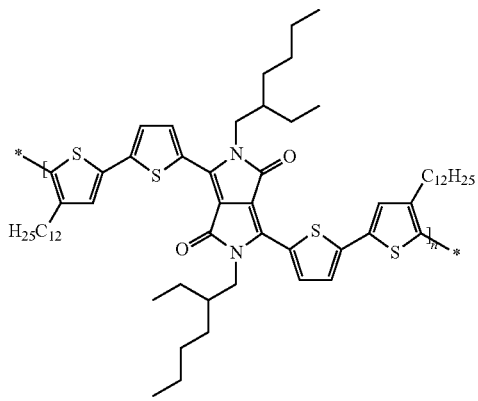
(Example 1, Homopolymer; Adv. Mat. 2008, 20, 13, 2556-2560);
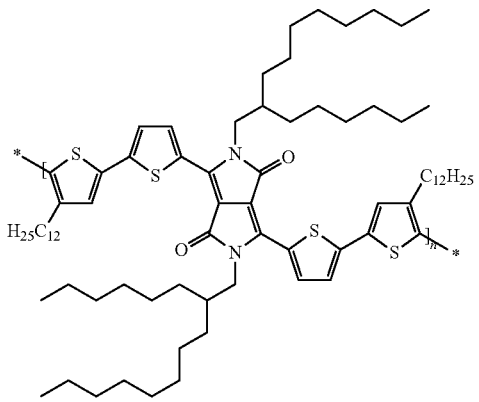
(Example 2, Homopolymer; Adv. Mat. 2008, 20, 11, 2217-2224);
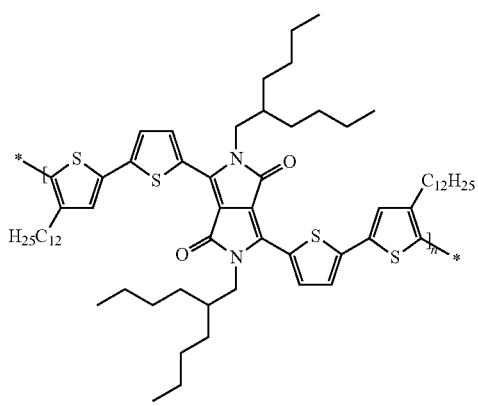
(Example 3, Homopolymer);
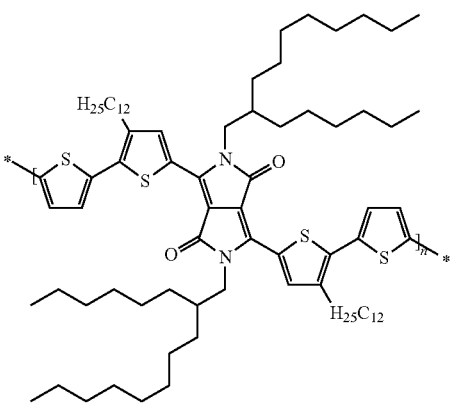
(Example 4, Homopolymer);
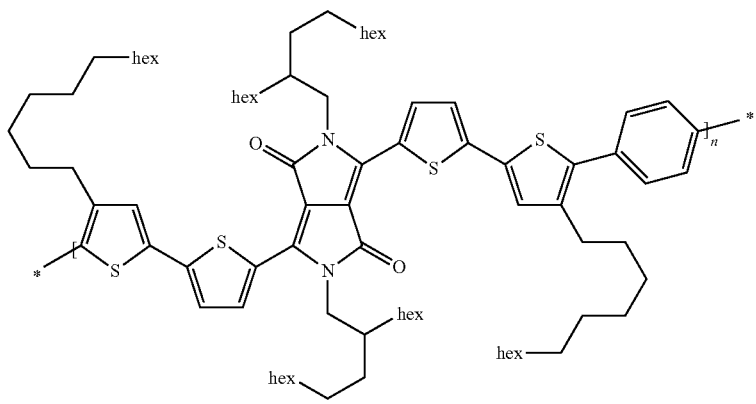
(Example 5, Co-polymer);

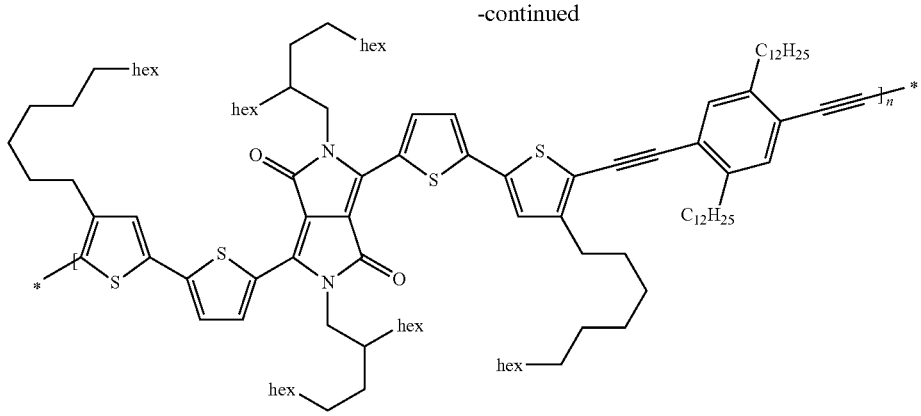

(Example 6, Co-polymer).

It is the object of the present invention to provide polymers, which show high efficiency of energy conversion, excellent field-effect mobility, good on/off current ratios and/or excellent stability, when used in organic field effect transistors, organic photovoltaics (solar cells) and photodiodes.

Said object has been solved by polymers comprising (repeating) unit(s) of the formula $-\!\!\!-\!\!\![A\text{-}D]\!\!\!-\!\!\!-$, and at least one (repeating) unit(s) which is selected from repeating units of the formula $-\!\!\!-\!\!\![B\text{-}D]\!\!\!-\!\!\!-$, $-\!\!\!-\!\!\![A\text{-}E]\!\!\!-\!\!\!-$, and $-\!\!\!-\!\!\![B\text{-}E]\!\!\!-\!\!\!-$, a polymer comprising one or more (repeating) unit(s) of the formula (III)

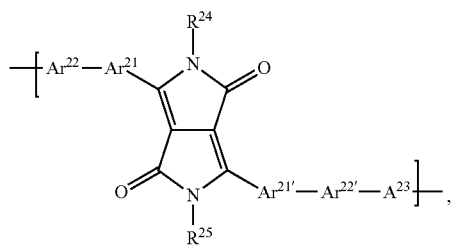

or a polymer comprising one or more (repeating) unit(s) of the formula (IV)

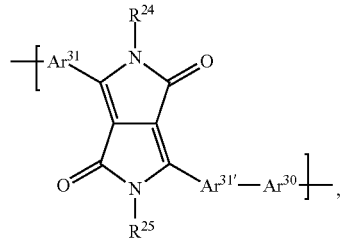

wherein
Ar$^{23}$ is a group of formula

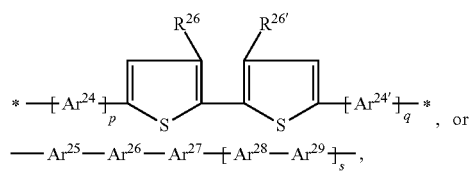

Ar$^{30}$ is a group of formula

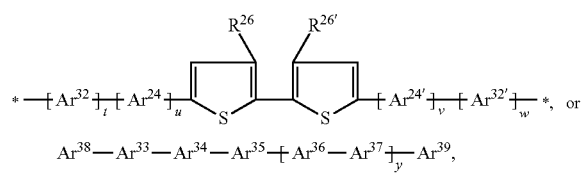

wherein
R$^{26}$ and R$^{26'}$ are independently of each other a $C_1$-$C_{25}$alkyl group, especially a $C_4$-$C_{18}$alkyl group,
A is a group of formula (I)

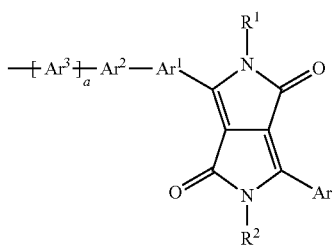

(V)

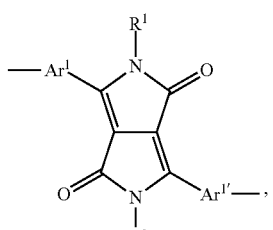
or (VI)

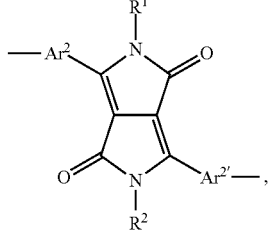

a is 0, or an integer of 1, or 2,
b is 0, or an integer of 1, or 2,
p is 0, or an integer of 1, or 2, y is 0, or 1,
q is 0, or an integer of 1, or 2, s is 0, or 1,
u is an integer of 1, or 2, t is 0, or 1,
v is an integer of 1, or 2, w is 0, or 1,
$Ar^{21}$, $Ar^{21'}$, $Ar^{24}$, $Ar^{24'}$, $Ar^{25}$, $Ar^{27}$, $Ar^{29}$, $Ar^{31}$, $Ar^{31'}$, $Ar^{38}$, $Ar^{34}$, $Ar^{36}$, $Ar^{39}$, $Ar^1$ and $Ar^{1'}$ are independently of each other a group of formula

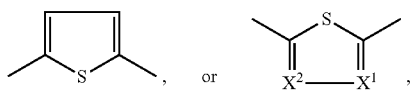

$Ar^3$ and $Ar^{3'}$ independently of each other have the meaning of $Ar^1$, or are a group of formula

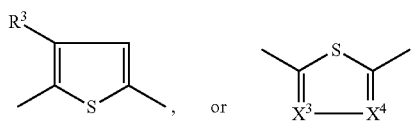

$Ar^2$, $Ar^{2'}$, $Ar^{26}$, $Ar^{28}$, $Ar^{33}$, $Ar^{35}$, $Ar^{37}$, $Ar^{32}$, $Ar^{32'}$, $Ar^{22}$ and $Ar^{22'}$ are independently of each other a group of formula

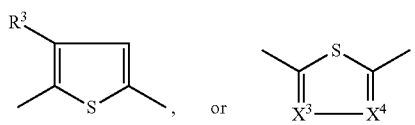

one of $X^1$ and $X^2$ is N and the other is CH,
one of $X^3$ and $X^4$ is N and the other is $CR^{3'}$,
$R^1$, $R^2$, $R^{24}$ and $R^{25}$ may be the same or different and are selected from hydrogen, a $C_1$-$C_{100}$alkyl group, especially a $C_6$-$C_{24}$alkyl group, a $C_6$-$C_{24}$aryl, in particular phenyl or 1- or 2-naphthyl which can be substituted one to three times with $C_1$-$C_8$alkyl, $C_1$-$C_8$thioalkoxy, and/or $C_1$-$C_8$alkoxy, or pentafluorophenyl,
$R^3$ and $R^{3'}$ are independently of each other a $C_1$-$C_{25}$alkyl group, especially a $C_4$-$C_{25}$alkyl, which may optionally be interrupted by one or more oxygen atoms, and
B, D and E are independently of each other a group of formula

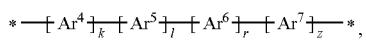

(II)

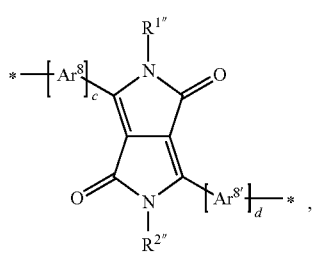

or formula I, with the proviso that in case B, D and E are a group of formula I, they are different from A, wherein
k is 1,
l is 0, or 1,
r is 0, or 1,
z is 0, or 1, and $Ar^4$, $Ar^5$, $Ar^6$ and $Ar^7$ are independently of each other a group of formula

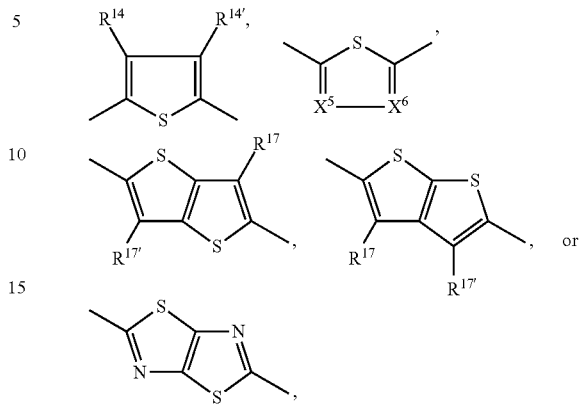

wherein one of $X^5$ and $X^6$ is N and the other is $CR^{14}$,
c is an integer of 1, 2, or 3,
d is an integer of 1, 2, or 3,
$Ar^8$ and $Ar^{8'}$ are independently of each other a group of formula

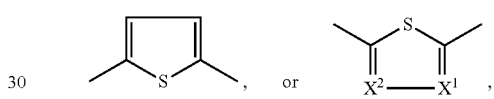

$X^1$ and $X^2$ are as defined above,
$R^{1''}$ and $R^{2''}$ may be the same or different and are selected from hydrogen, a $C_1$-$C_{36}$alkyl group, especially a $C_6$-$C_{24}$alkyl group, a $C_6$-$C_{24}$aryl, in particular phenyl or 1- or 2-naphthyl which can be substituted one to three times with $C_1$-$C_8$alkyl, $C_1$-$C_8$thioalkoxy, and/or $C_1$-$C_8$alkoxy, or pentafluorophenyl,
$R^{14}$, $R^{14'}$, $R^{17}$ and $R^{17'}$ are independently of each other H, or a $C_1$-$C_{25}$alkyl group, especially a $C_6$-$C_{25}$alkyl, which may optionally be interrupted by one or more oxygen atoms.

Polymers comprising (repeating) unit(s) of the formula $-\!\!\!+\!A\text{-}D\!+\!\!\!-$, and at least one (repeating) unit(s) which is selected from repeating units of the formula $-\!\!\!+\!B\text{-}D\!+\!\!\!-$, $-\!\!\!+\!A\text{-}E\!+\!\!\!-$, and $-\!\!\!+\!B\text{-}E\!+\!\!\!-$; are preferred against polymers of the formula III, or IV. A, B, D and E are different from each other. If the polymers comprise repeating units of the formula $-\!\!\!+\!A\text{-}D\!+\!\!\!-$ and $-\!\!\!+\!B\text{-}D\!+\!\!\!-$, they are preferably (random) copolymers of formula

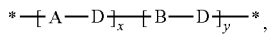

wherein x=0.995 to 0.005, y=0.005 to 0.995, especially x=0.2 to 0.8, y=0.8 to 0.2, and wherein x+y=1. If the polymers comprise repeating units of the formula $-\!\!\!+\!A\text{-}D\!+\!\!\!-$, $-\!\!\!+\!B\text{-}D\!+\!\!\!-$, $-\!\!\!+\!A\text{-}E\!+\!\!\!-$, and $-\!\!\!+\!B\text{-}E\!+\!\!\!-$; they are preferably (random) copolymers of formula

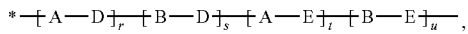

wherein r=0.985 to 0.005, s=0.005 to 0.985, t=0.005 to 0.985, u=0.005 to 0.985, and wherein r+s+t+u=1. The polymers of the present invention are preferably prepared (are obtainable)

by (Suzuki) polymerisation of a dihalogenide, such as a dibromide or dichloride, especially a dibromide of formula Br-A-Br Br and Br—B—Br and with an (equimolar) amount of a diboronic acid or diboronate of formula $X^{11}$—$[$D$]$—$X^{11}$, and optionally $X^{11}$—$[$E$]$—$X^{11}$, wherein $X^{11}$ is as defined below. Alternatively a diboronic acid or diboronate of formula $X^{11}$—$[$A$]$—$X^{11}$, and $X^{11}$—$[$B$]$—$X^{11}$, wherein $X^{11}$ is as defined below, is reacted with an (equimolar) amount of a dihalogenide, such as a dibromide or dichloride, especially a dibromide of formula Br-D-Br and optionally Br-E-Br.

Advantageously, the polymer of the present invention, or an organic semiconductor material, layer or component, comprising the polymer of the present invention can be used in organic photovoltaics (solar cells) and photodiodes, or in an organic field effect transistor (OFET).

The polymers of the present invention are copolymers. A copolymer is a polymer derived from more than one species of monomer, e.g. bipolymer, terpolymer, quaterpolymer, etc.

The term polymer comprises oligomers as well as polymers. The oligomers of this invention have a weight average molecular weight of <4,000 Daltons. The polymers of this invention preferably have a weight average molecular weight of 4,000 Daltons or greater, especially 4,000 to 2,000,000 Daltons, more preferably 10,000 to 1,000,000 and most preferably 10,000 to 100,000 Daltons. The at present most preferred polymers have a weight average molecular weight of 30,000 to 80,000 Daltons. Molecular weights are determined according to high-temperature gel permeation chromatography (HT-GPC) using polystyrene standards. The polymers of this invention preferably have a polydispersibility of 1.01 to 10, more preferably 1.1 to 3.0, most preferred 1.5 to 2.5.

$Ar^{21}$ and $Ar^{21'}$, $Ar^{24}$ and $Ar^{24'}$, $Ar^{31}$ and $Ar^{31'}$, $Ar^{8}$ and $Ar^{8'}$, $Ar^{1}$ and $Ar^{1'}$ can be the same and can be different, but are preferably the same. $Ar^{21}$, $Ar^{21'}$, $Ar^{24}$, $Ar^{24'}$, $Ar^{25}$, $Ar^{27}$, $Ar^{29}$, $Ar^{31}$, $Ar^{31'}$, $Ar^{38}$, $Ar^{34}$, $Ar^{36}$, $Ar^{39}$, $Ar^{8}$, $Ar^{8'}$, $Ar^{1}$ and $Ar^{1'}$ can be a group of formula

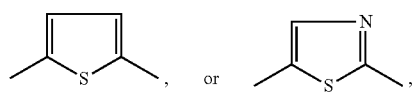

wherein a group of formula

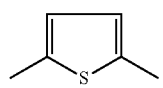

is preferred.

$Ar^{3}$ and $Ar^{3'}$ have preferably the meaning of $Ar^{1}$.

$Ar^{2}$ and $Ar^{2'}$, $Ar^{32}$ and $Ar^{32'}$, $Ar^{22}$ and $Ar^{22'}$ can be the same and can be different, but are preferably the same. $Ar^{2}$, $Ar^{2'}$, $Ar^{26}$, $Ar^{28}$, $Ar^{33}$, $Ar^{35}$, $Ar^{37}$, $Ar^{32}$, $Ar^{32'}$, $Ar^{22}$ and $Ar^{22'}$ can be a group of formula

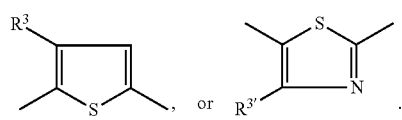

If a is equal to 2, $Ar^{2}$ can be composed of groups of formula

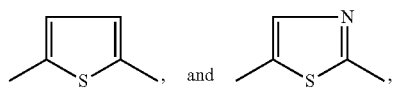

i.e. can, for example, be a group of formula

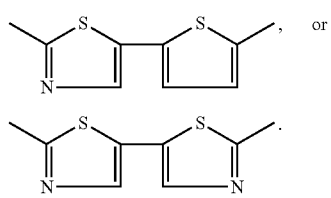

As indicated by the formula

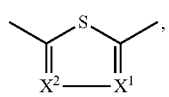

the group

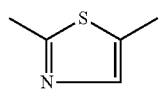

can be attached to the DPP basic unit, or arranged in the polymer chain in two ways

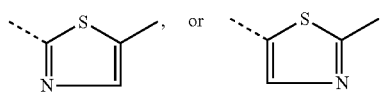

(- - - attachment to the DPP basic structure). The notation

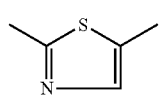

should comprise both possibilities.

The group

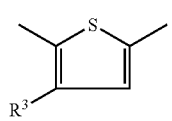

can be attached to the DPP basic unit, or arranged in the polymer chain in two ways

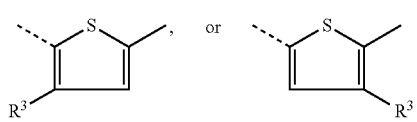

(- - - attachment to the DPP basic structure).
The notation

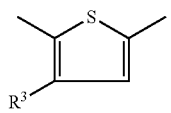

should comprise both possibilities.
The group

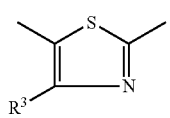

can be attached to the DPP basic unit, or arranged in the polymer chain in two ways

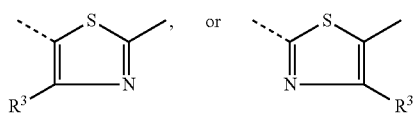

(- - - attachment to the DPP basic structure).
The notation

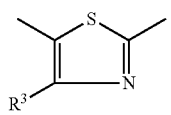

should comprise both possibilities.

$R^{24}$ and $R^{25}$, $R^1$ and $R^2$ can be different, but are preferably the same. $R^{24}$, $R^{25}$, $R^1$ and $R^2$ can be linear, but are preferably branched. $R^{24}$, $R^{25}$, $R^1$ and $R^2$ are preferably a $C_8$-$C_{36}$alkyl group, especially a $C_{12}$-$C_{24}$alkyl group, such as n-dodecyl, tridecyl, tetradecyl, pentadecyl, hexadecyl, 2-ethyl-hexyl, 2-butyl-hexyl, 2-butyl-octyl, 2-hexyldecyl, 2-decyl-tetradecyl, heptadecyl, octadecyl, eicosyl, heneicosyl, docosyl, or tetracosyl. The $C_8$-$C_{36}$alkyl and $C_{12}$-$C_{24}$alkyl group can be linear, or branched, but are preferably branched. In a particularly preferred embodiment of the present invention $R^{24}$, $R^{25}$, $R^1$ and $R^2$ are a 2-hexyldecyl or 2-decyl-tetradecyl group.

Advantageously, the groups $R^{24}$, $R^{25}$, $R^1$ and $R^2$ can be represented by formula

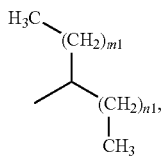

wherein $m1=n1+4$ and $m1+n1 \leq 22$.

Chiral side chains, such as $R^{24}$, $R^{25}$, $R^1$ and $R^2$, can either be homochiral, or racemic, which can influence the morphology of the polymers.

$R^{1'''}$ and $R^{2'''}$ may be the same or different and are selected from hydrogen, a $C_1$-$C_{36}$alkyl group, especially a $C_6$-$C_{24}$alkyl group.

$R^3$ and $R^{3'}$ are independently of each other a $C_1$-$C_{25}$alkyl group. $R^3$ and $R^{3'}$ can be branched, but are preferably linear. $R^3$ and $R^{3'}$ are especially a linear $C_4$-$C_{25}$alkyl group, very especially n-hexyl.

If groups $R^{15}$ and $R^3$ are present in a polymer of the presence invention, they are preferably identical.

In addition, polymers are preferred, wherein at least 5 thiophenes are present between two DPP structures

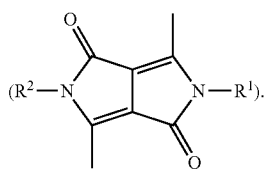

In a particularly preferred embodiment the present invent invention is directed to polymers of formula (VIIe)

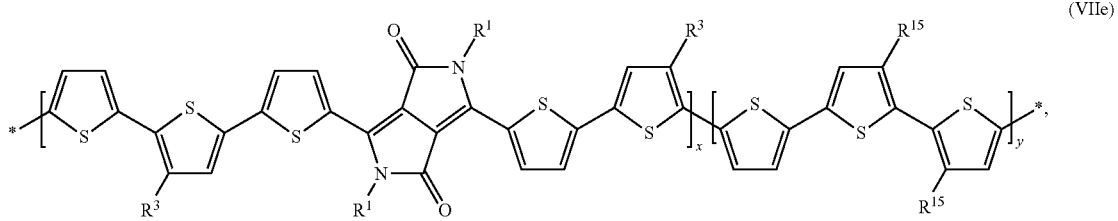

wherein
x is 0.01 to 0.99, especially 0.8 to 0.4 and y is 0.99 to 0.01, especially 0.2 to 0.6,
$R^1$ is a $C_8$-$C_{36}$alkyl group, especially hexyl-decyl, and
$R^3$ and $R^{15}$ are a $C_1$-$C_{18}$alkyl group, especially n-hexyl.
A is preferably a group of formula I, wherein $Ar^3$ and $Ar^{3'}$ have the meaning of $Ar^1$.

A is preferably a group of formula
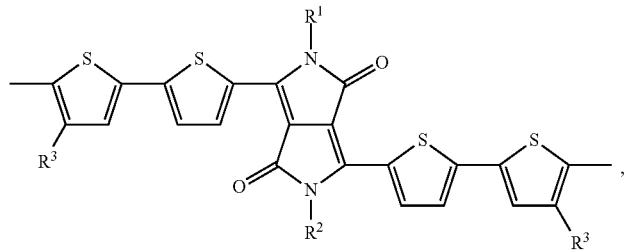
(Ia)
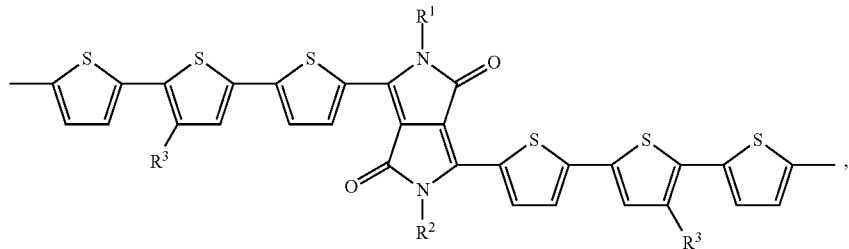
(Ib)
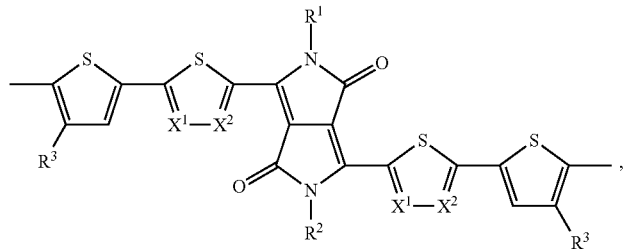
(Ic)
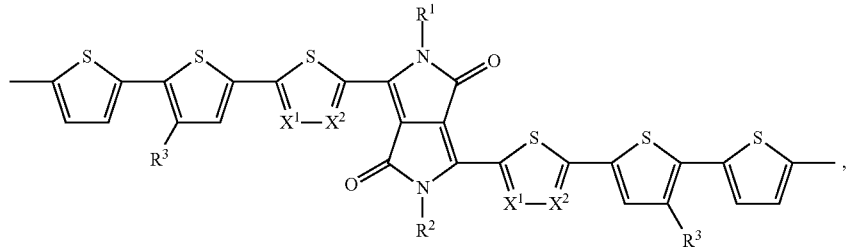
(Id)
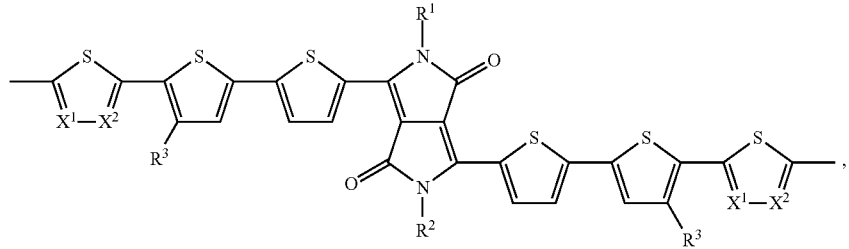
(Ie)
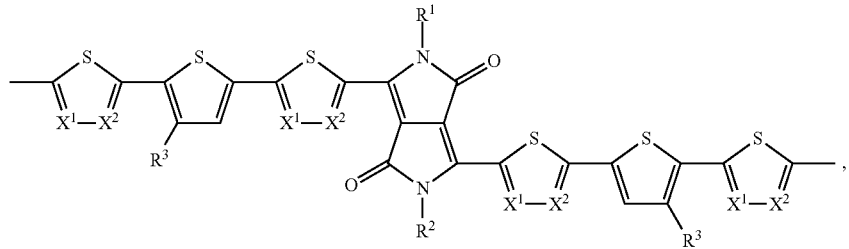
(If)

-continued

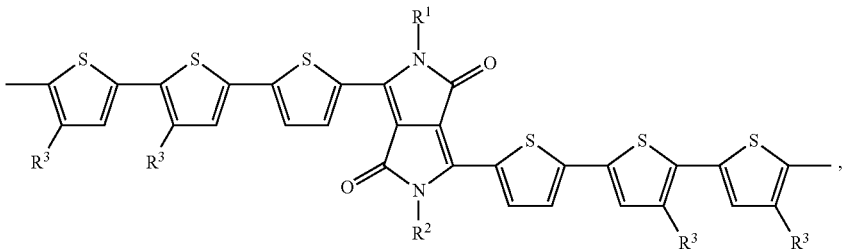
(Ig)

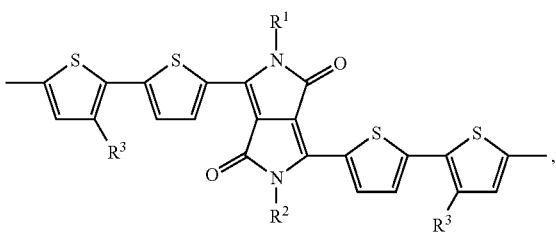
(Ih)

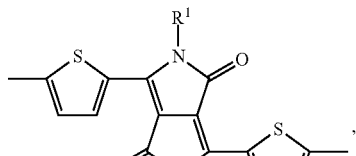
(Va)

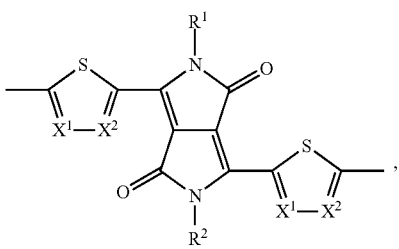
(Vb)

(VIa)

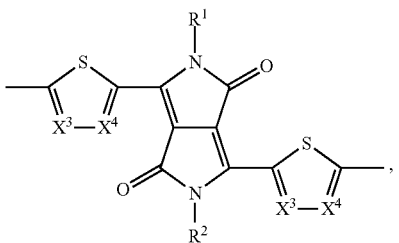
(VIb)

wherein $X^1$, $X^2$, $X^3$, $X^4$, $R^1$, $R^2$ and $R^3$ are as defined above. Groups of formula Ia to Ig are preferred against a group of formula Ih.

B, D and E are independently of each other a group of formula

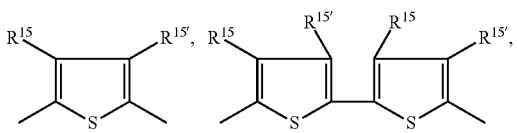

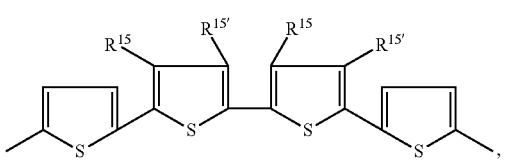

-continued

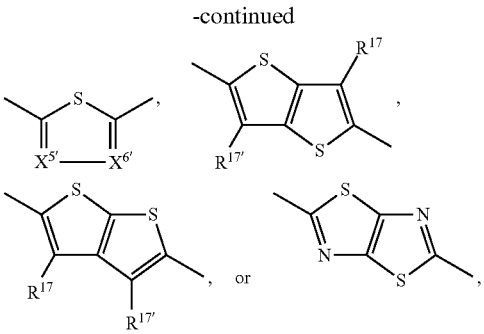

wherein one of $X^{5'}$ and $X^{6'}$ is N and the other is $CR^{14}$, or CH, $R^{15}$, $R^{15'}$, $R^{17}$ and $R^{17'}$ are independently of each other H, or a $C_1$-$C_{25}$alkyl group, especially a $C_6$-$C_{25}$alkyl, which may optionally be interrupted by one or more oxygen atoms, and $R^{14}$ is a $C_1$-$C_{25}$alkyl group, especially a $C_6$-$C_{25}$alkyl, which may optionally be interrupted by one or more oxygen atoms.

B, D and E are more preferably a group of formula

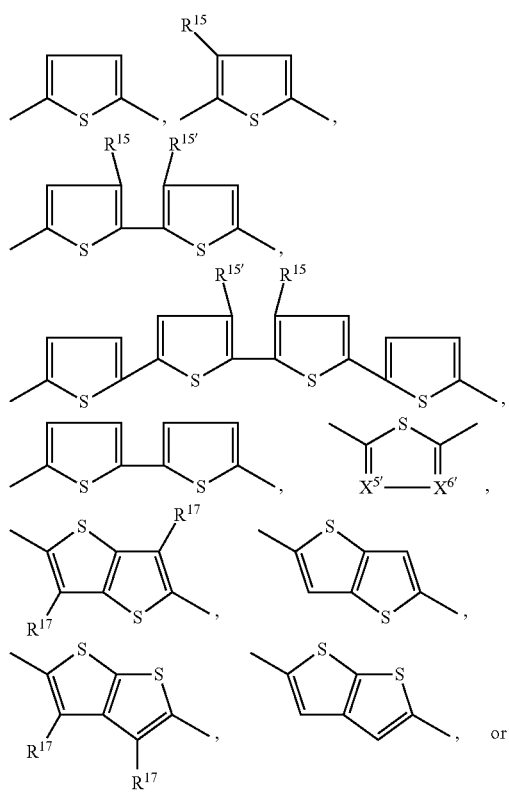
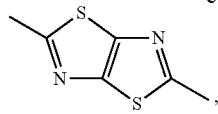
wherein one of $X^{5'}$ and $X^{6'}$ is N and the other is $CR^{14}$, or CH, and $R^{14}$, $R^{15}$, $R^{15'}$ and $R^{17}$ are independently of each other a $C_6$-$C_{25}$alkyl.
If B, D and E are a group of formula
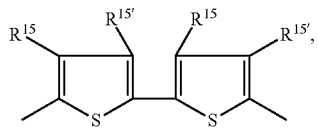
they are preferably a group of formula
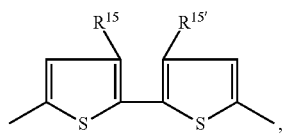
The head to tail arrangement of $R^{15}$ is important to introduce more solubility.
B is preferably a group of formula
(Va)
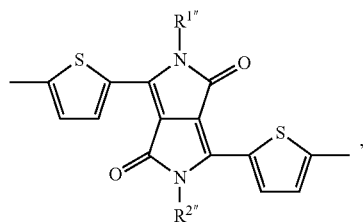
(IIb)
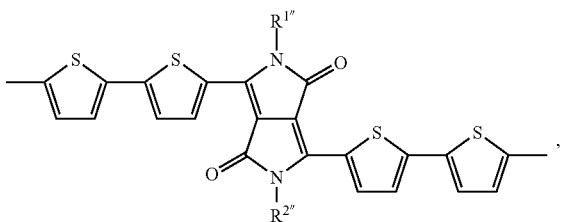
(IIc)
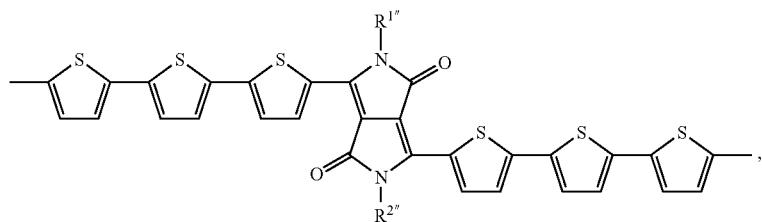
(IId)
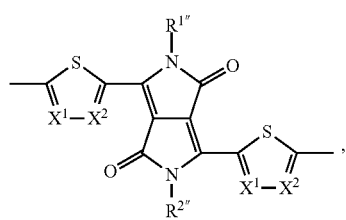
(IIe)
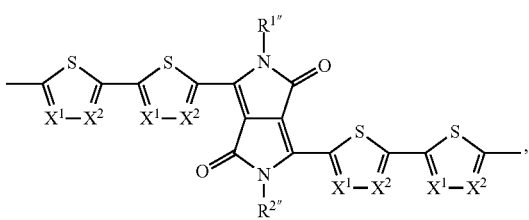

-continued

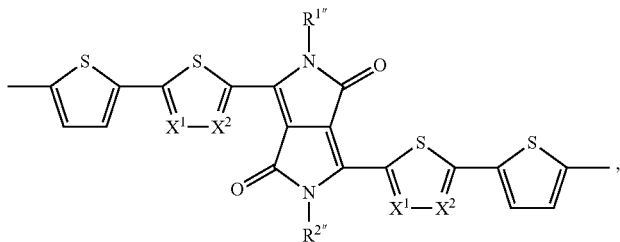
(IIf)

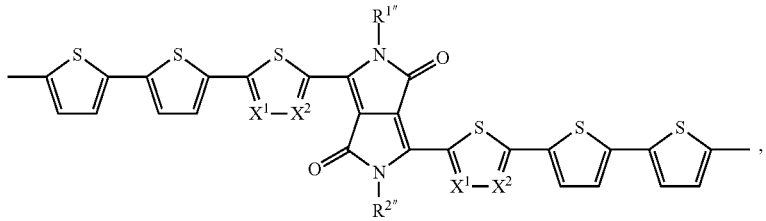
(IIg)

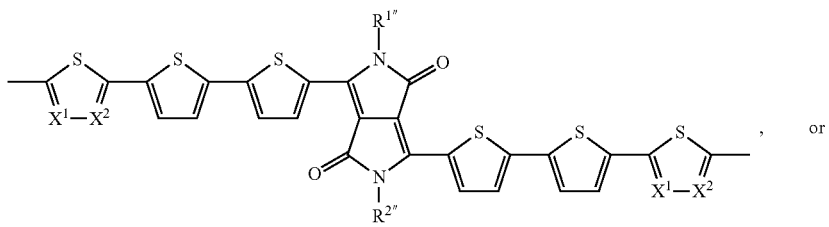
(IIh)

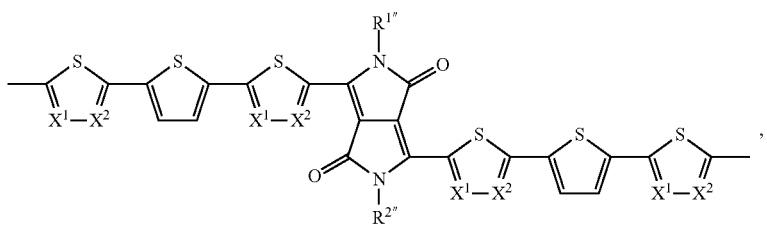
(IIi)

wherein
$X^1$, $X^2$, $R^{1''}$ and $R^{2''}$ are as defined above.

In another preferred embodiment B is a group of formula Ia, Ib, Ic, Id, Ie, If, Ig, or Ih, provided that B is different from A.

In a preferred embodiment of the present invention the polymers comprise repeating units of the formula

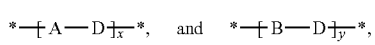

especially

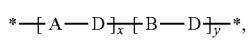

wherein A is a group of formula (Ia)

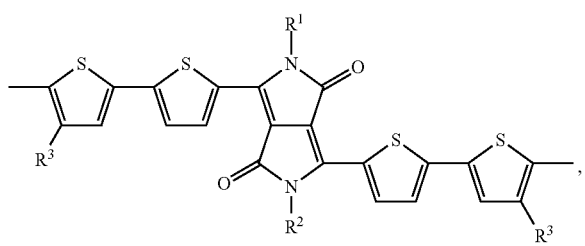

$R^1$ and $R^2$ are a $C_8$-$C_{35}$alkyl group, $R^3$ is a $C_1$-$C_{18}$alkyl group, B is a group of formula

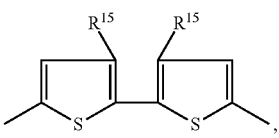

$R^{15}$ is a $C_4$-$C_{18}$alkyl group,

D is a group of formula

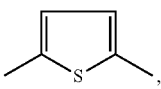

and x=0.995 to 0.005, y=0.005 to 0.995, especially x=0.4 to 0.9, y=0.6 to 0.1, and wherein x+y=1.

In another preferred embodiment of the present invention the polymers comprise repeating units of the formula

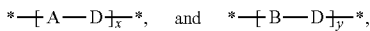

especially

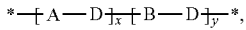

wherein
A is a group of formula Ia, Ib, Ic, Id, Ie, If, Ig, or Ih,
$R^1$ and $R^2$ are a $C_8$-$C_{35}$alkyl group,
$R^3$ is a $C_8$-$C_{18}$alkyl group, and
B is a group of formula Va, IIb, IIc, IId, IIe, IIf, IIg, IIh, or IIi, or a group of formula Ia, Ib, Ic, Id, Ie, If, or Ig, with the proviso that B is different from A,
$R^{1''}$ and $R^{2''}$ are a $C_8$-$C_{35}$alkyl group,
one of $X^1$ and $X^2$ is N and the other is CH,
D is a group of formula

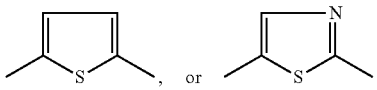

and
x=0.995 to 0.005, y=0.005 to 0.995, and wherein x+y=1.

If A is a group of formula I and B is a group of formula II x is preferably 0.2 to 0.8 and y is preferably 0.8 to 0.2. If A and B are both a group of formula II x is preferably 0.99 to 0.3 and y is preferably 0.01 to 0.7.

In said embodiment polymers are even more preferred, comprising repeating units of the formula

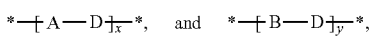

especially

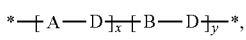

wherein
A is a group of formula (Ia)

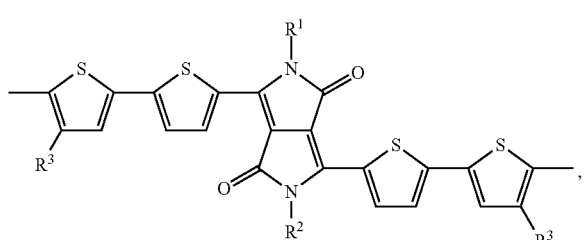

$R^1$ and $R^2$ are a $C_8$-$C_{35}$alkyl group,
$R^3$ is a $C_4$-$C_{18}$alkyl group, B is a group of formula (IIa)

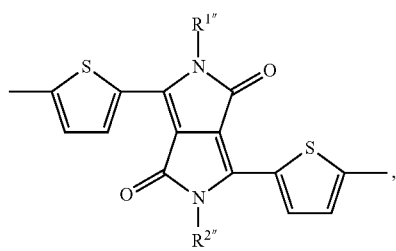

$R^{1''}$ and $R^{2''}$ are a $C_8$-$C_{35}$alkyl group,
D is a group of formula

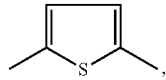

and
x=0.995 to 0.005, y=0.005 to 0.995, especially x=0.2 to 0.8, y=0.8 to 0.2, and wherein x+y=1; or
wherein A is a group of formula (Ia)

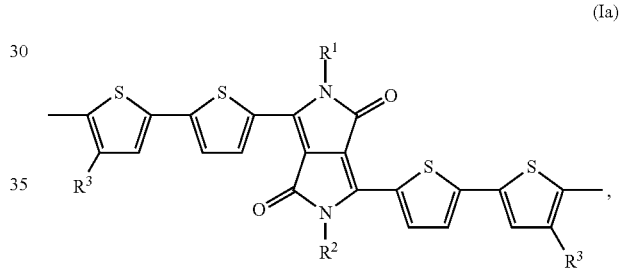

$R^1$ and $R^2$ are a $C_8$-$C_{35}$alkyl group,
$R^3$ is a $C_4$-$C_{18}$alkyl group,
B is a group of formula (Ia)

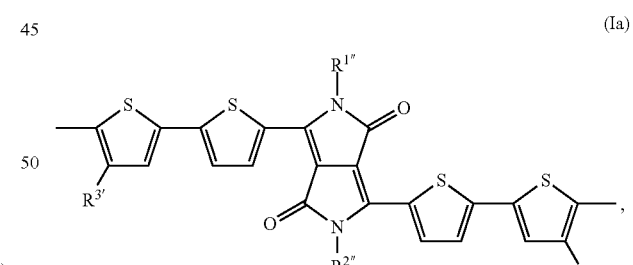

$R^{1''}$ and $R^{2''}$ are a $C_8$-$C_{35}$alkyl group,
$R^{3'}$ is a $C_4$-$C_{18}$alkyl group,
D is a group of formula

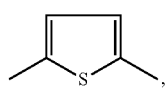

and
x=0.995 to 0.005, y=0.005 to 0.995, especially x=0.99 to 0.3, y=0.01 to 0.7, and wherein x+y=1.

Examples of preferred polymers are shown below:
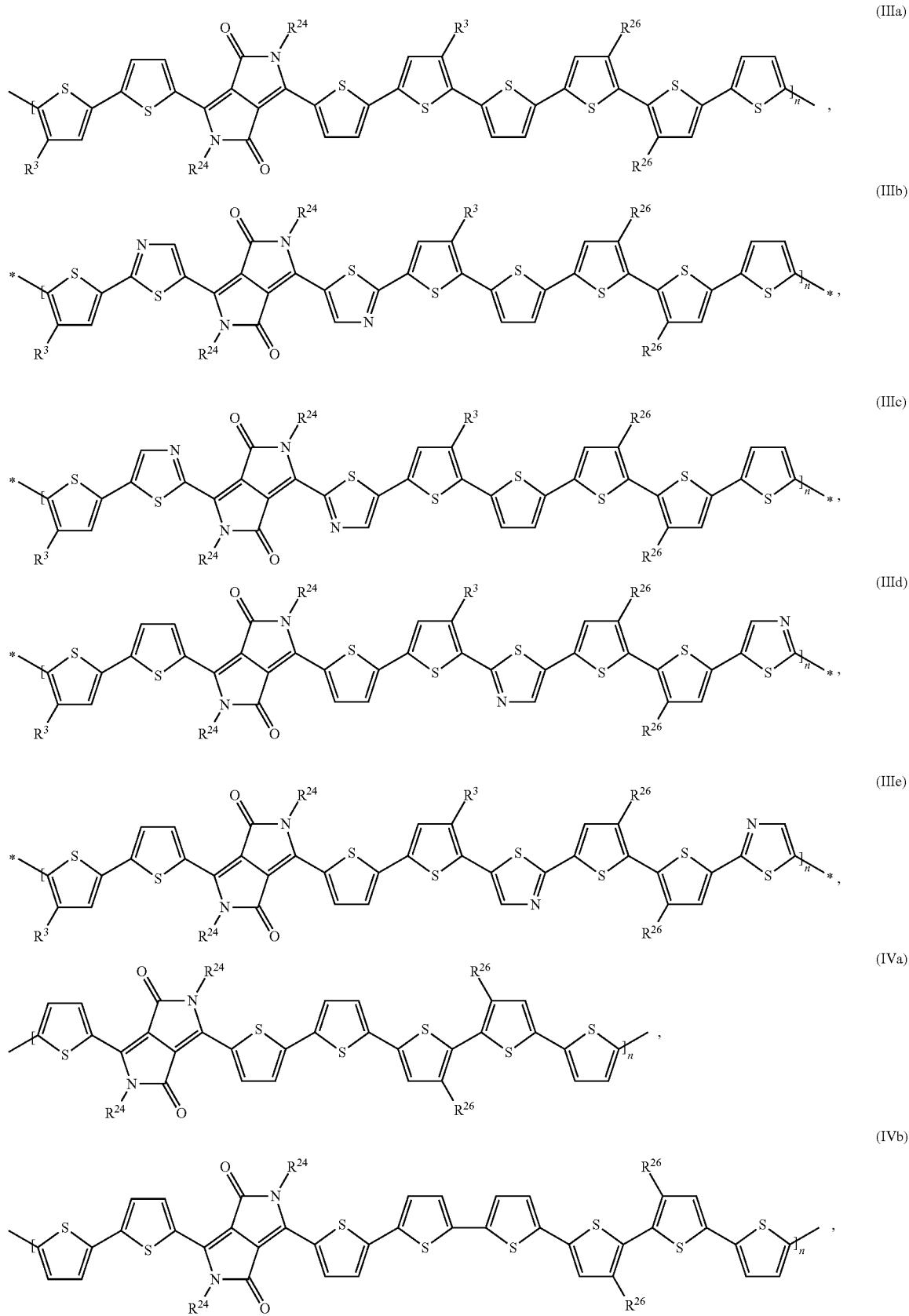

-continued
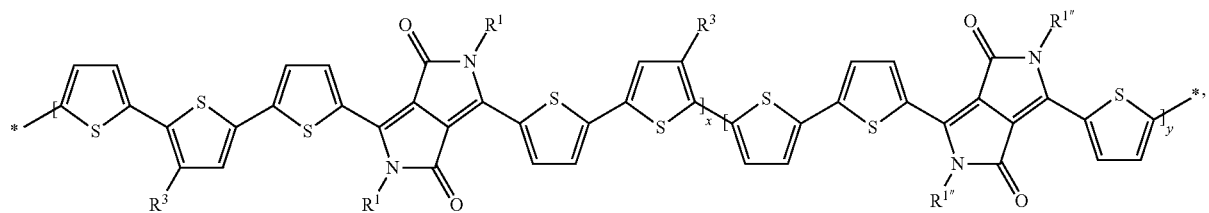
(VIIa)
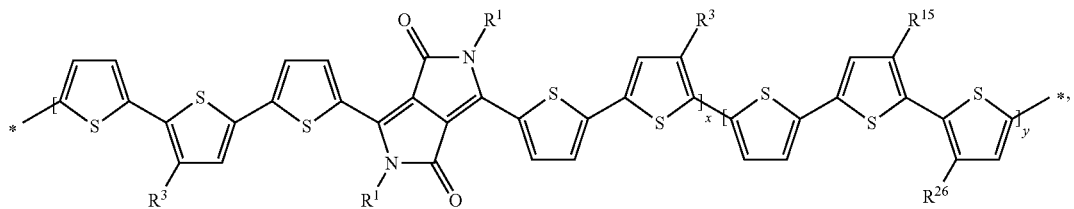
(VIIb)
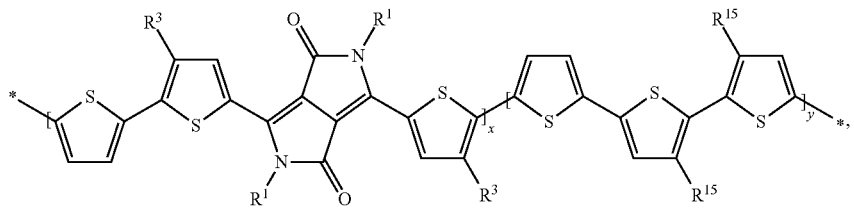
(VIIc)
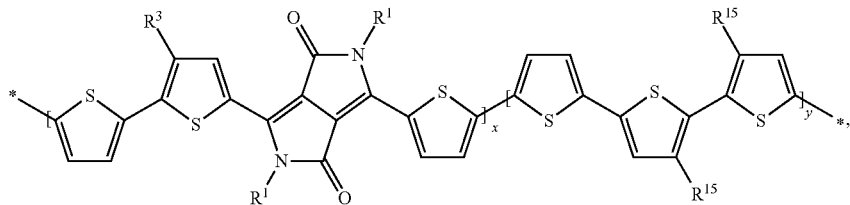
(VIId)
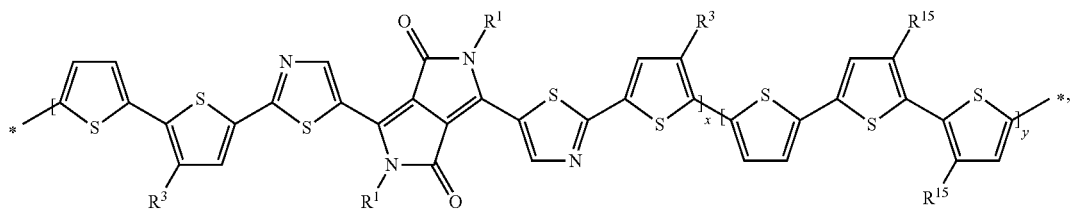
(VIIe)
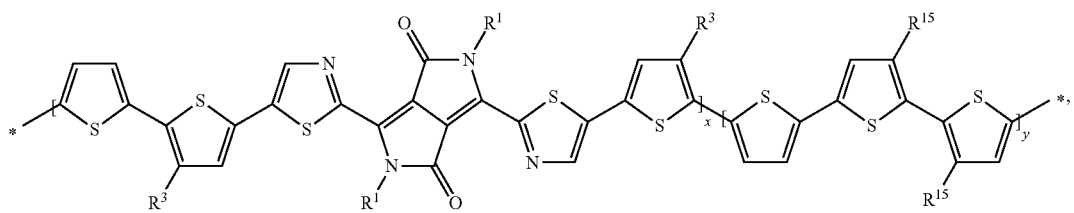
(VIIf)
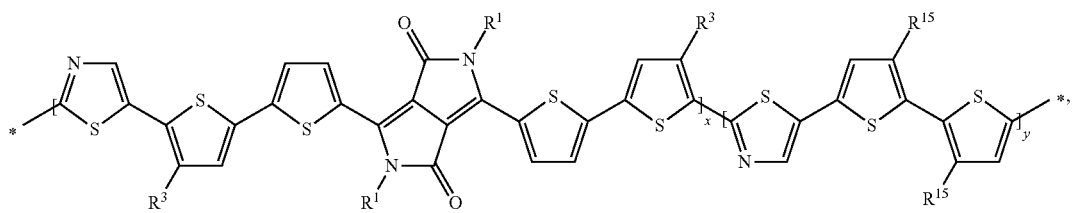
(VIIg)

-continued
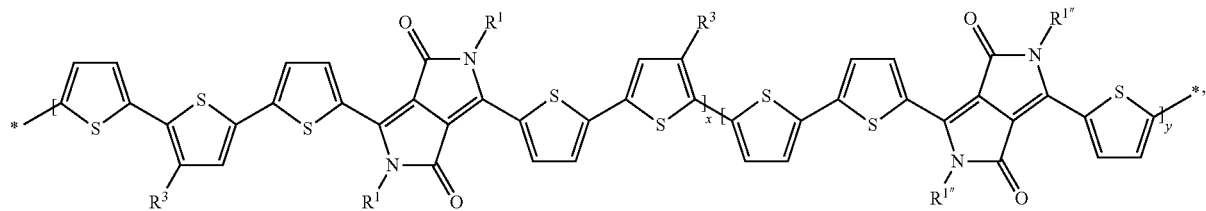
(VIIh)
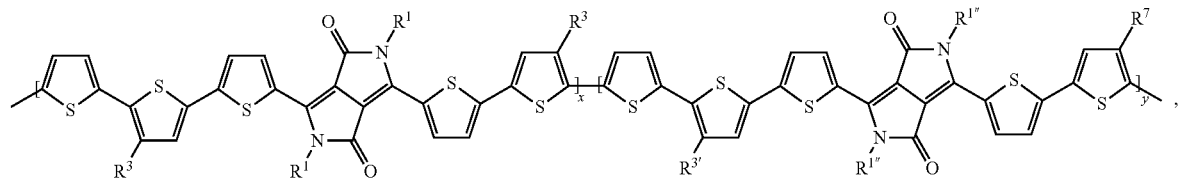
(VIIi)
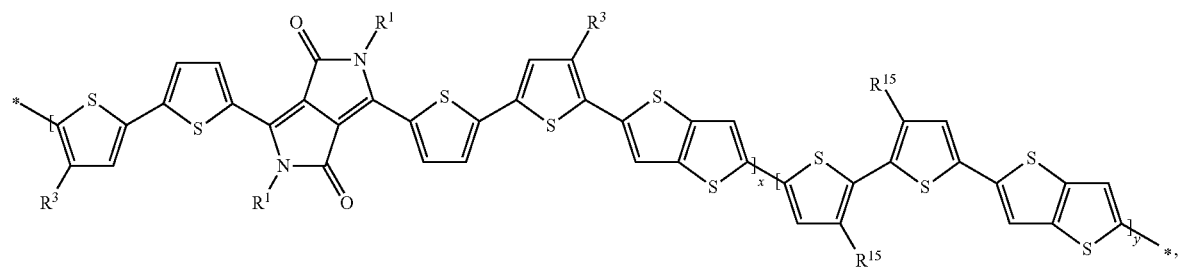
(VIIj)
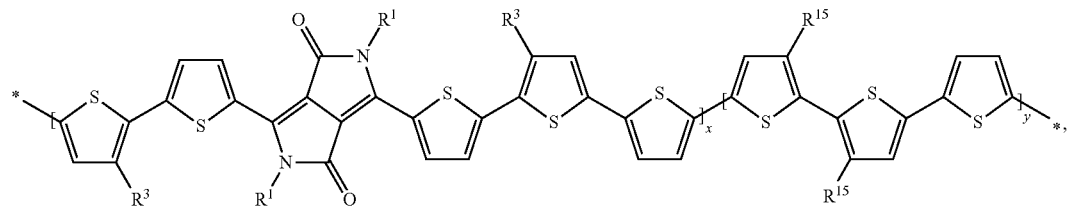
(VIIk)
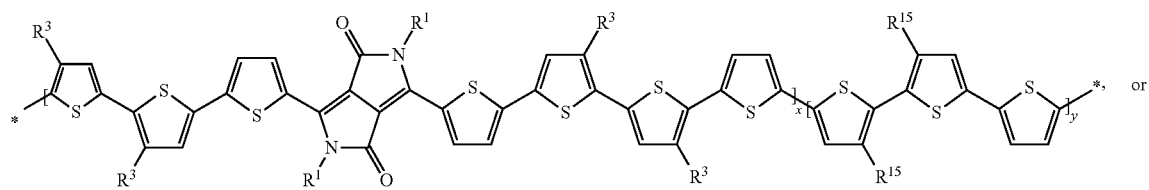
(VIIm) or
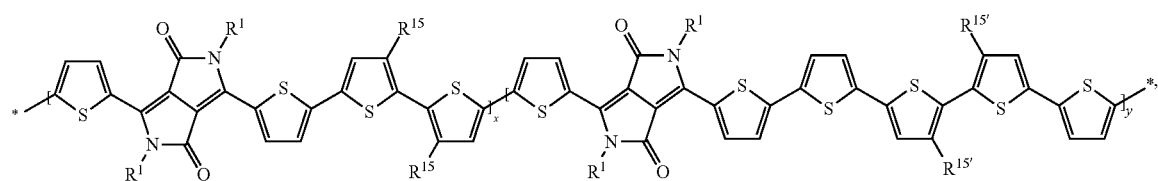
(VIIn)
wherein $R^{24}$, $R^1$ and $R^{1''}$ are a $C_8$-$C_{36}$alkyl group,
$R^{15}$, $R^{15'}$, $R^3$ and $R^{26}$ are a $C_1$-$C_{18}$alkyl group, especially a $C_4$-$C_{18}$alkyl group,
$R^{1'}$ is $C_8$-$C_{36}$alkyl,
$R^{3'}$ is $C_1$-$C_{18}$alkyl, especially a $C_4$-$C_{18}$alkyl group, $R^1 \neq R^{1'}$ and/or $R^3 \neq R^{3'}$,
n is 4 to 1000, especially 4 to 200, very especially 5 to 100,
x is 0.005 to 0.995, preferably 0.01 to 0.99, y is 0.995 to 0.005, preferably 0.99 to 0.01, and wherein x+y=1.
Examples of particularly preferred polymers are shown below:
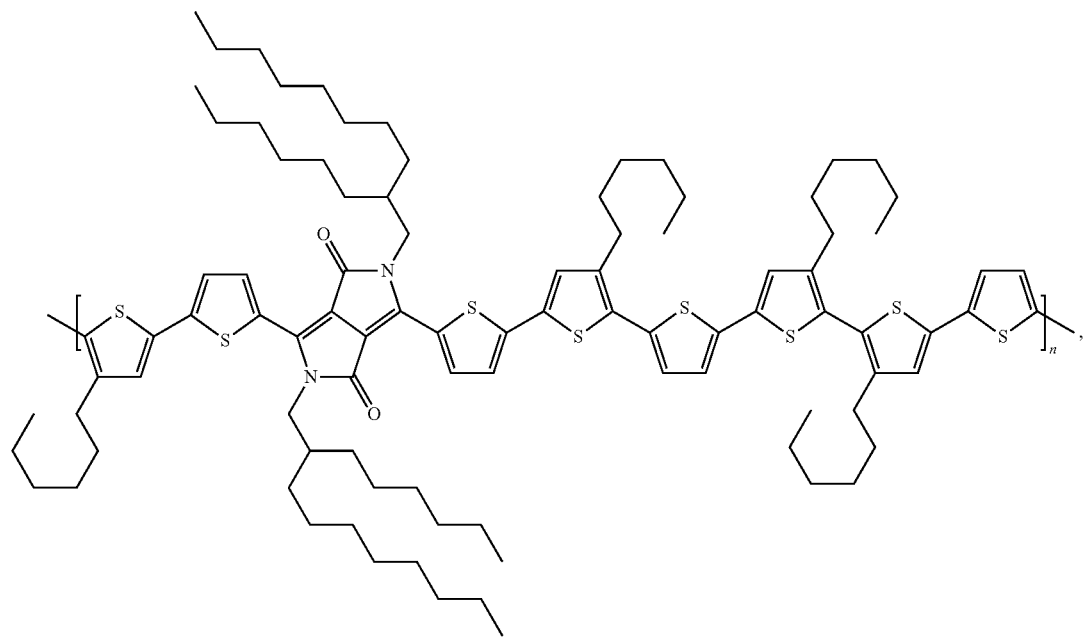
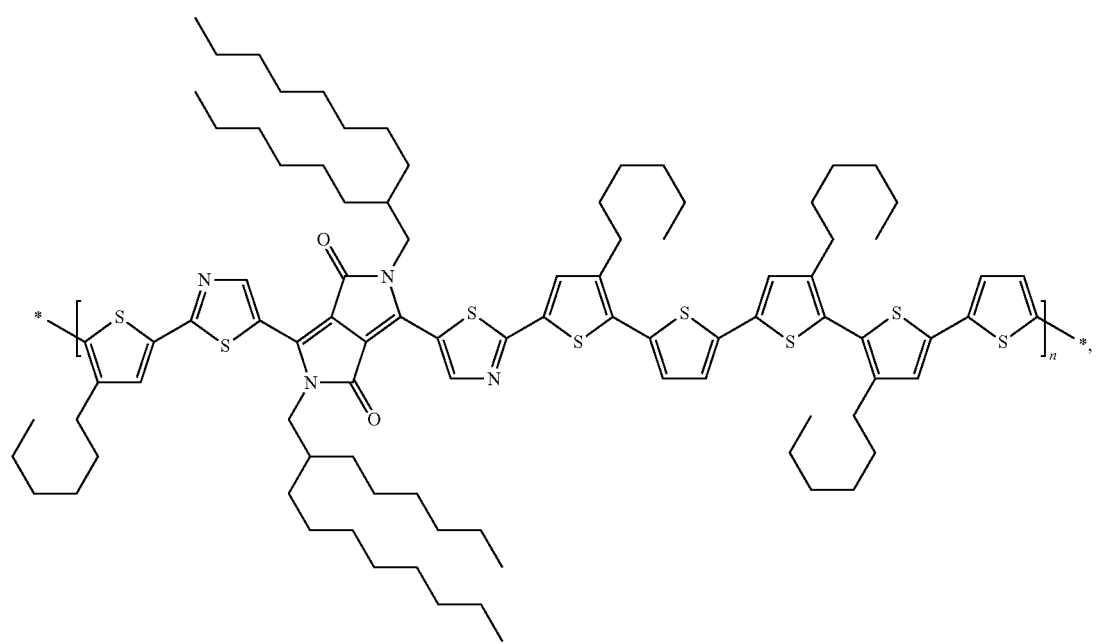

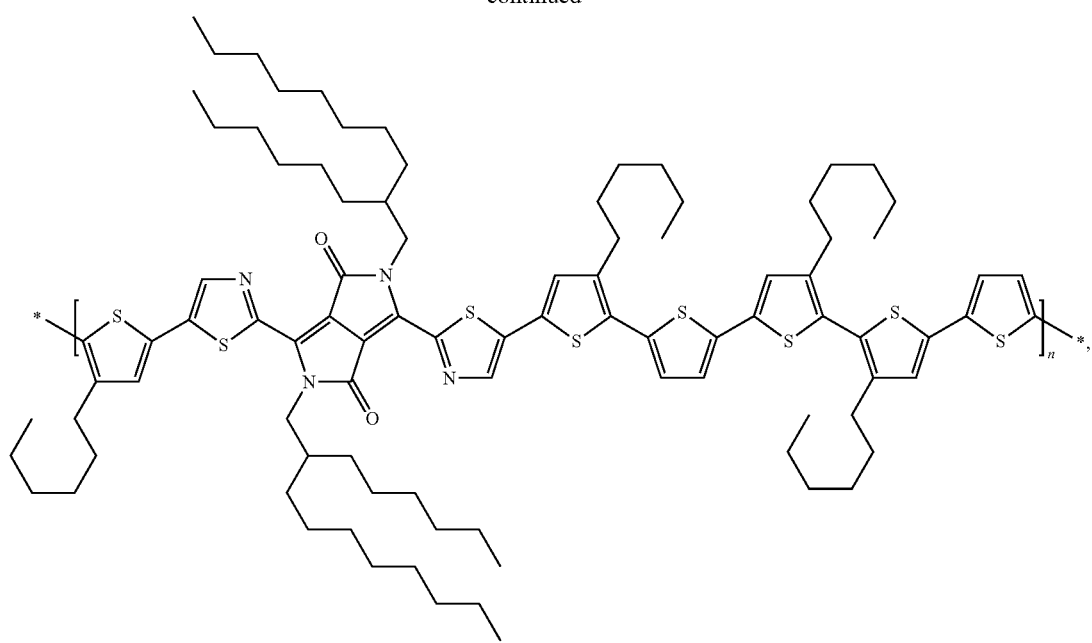
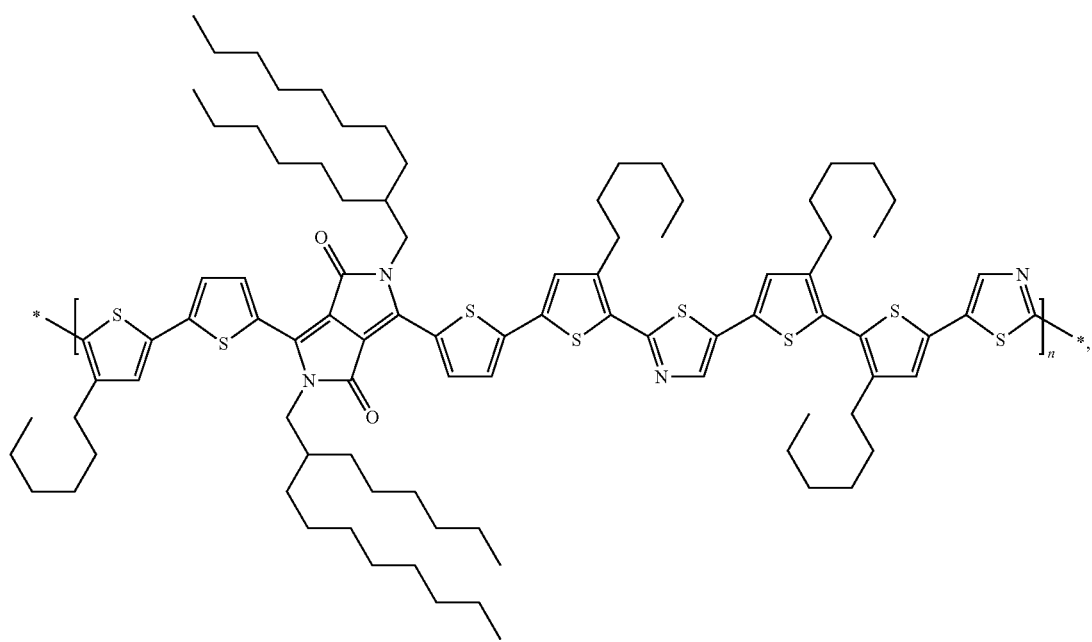

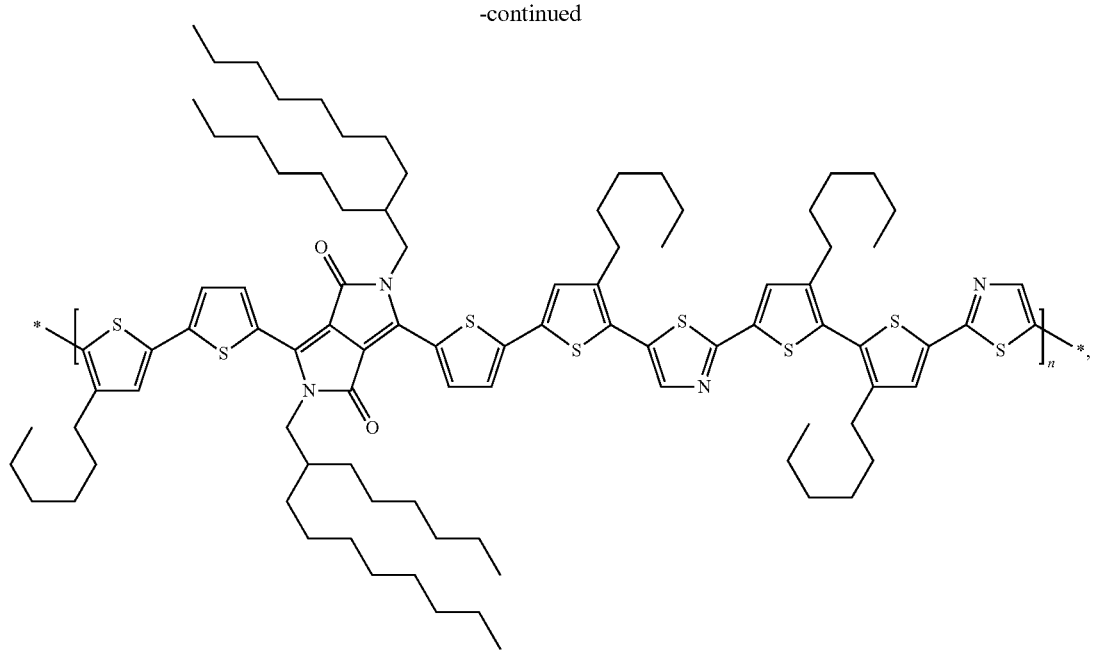
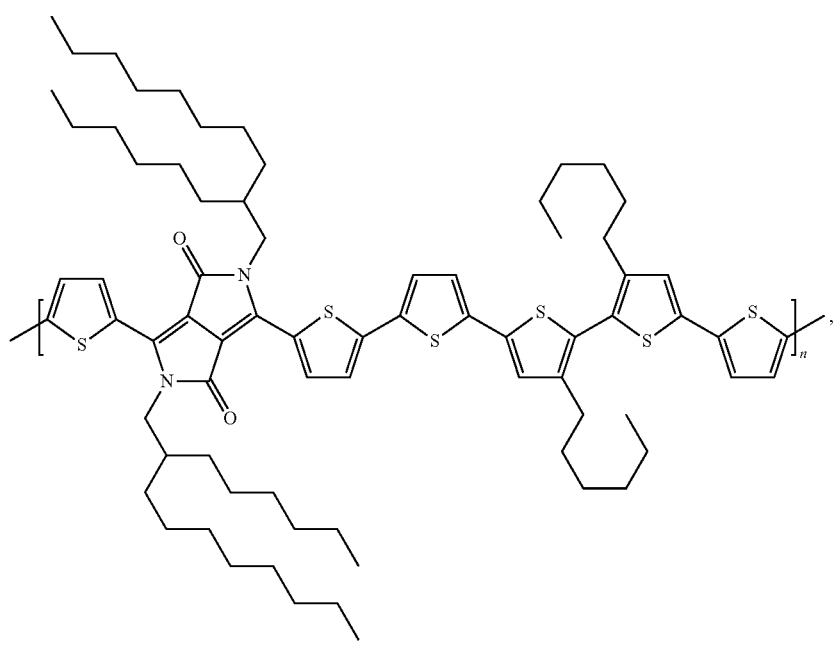
n is 4 to 200, very especially 5 to 100.

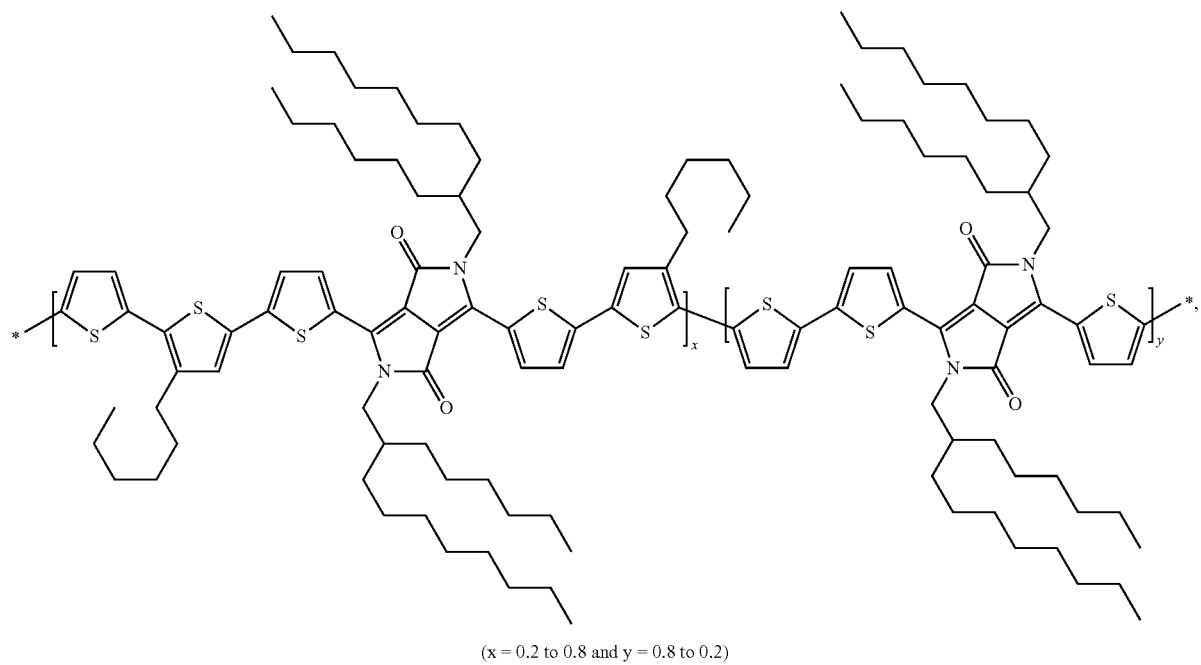
(x = 0.2 to 0.8 and y = 0.8 to 0.2)
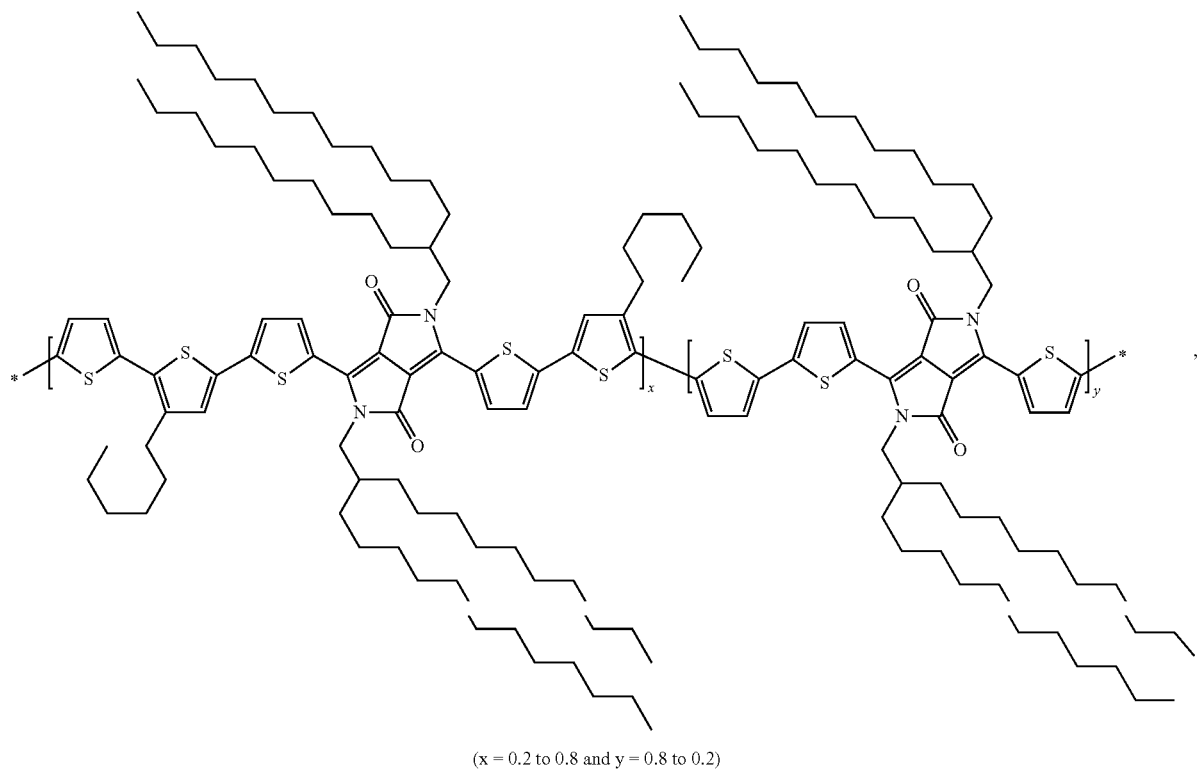
(x = 0.2 to 0.8 and y = 0.8 to 0.2)

-continued
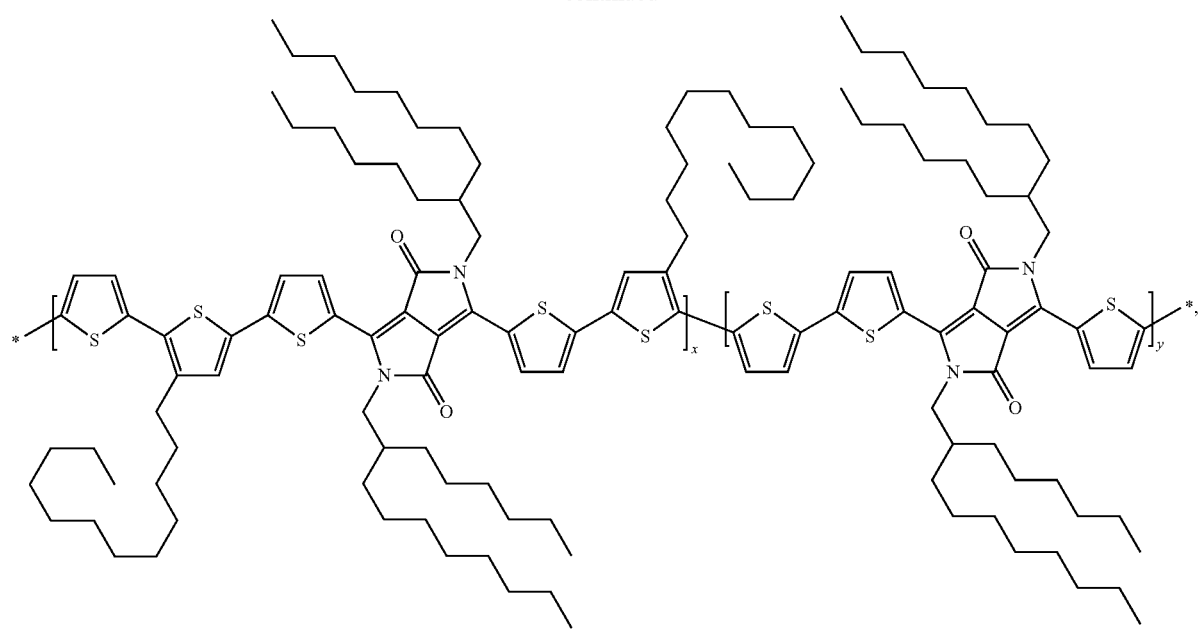
(x = 0.2 to 0.8 and y = 0.8 to 0.2)
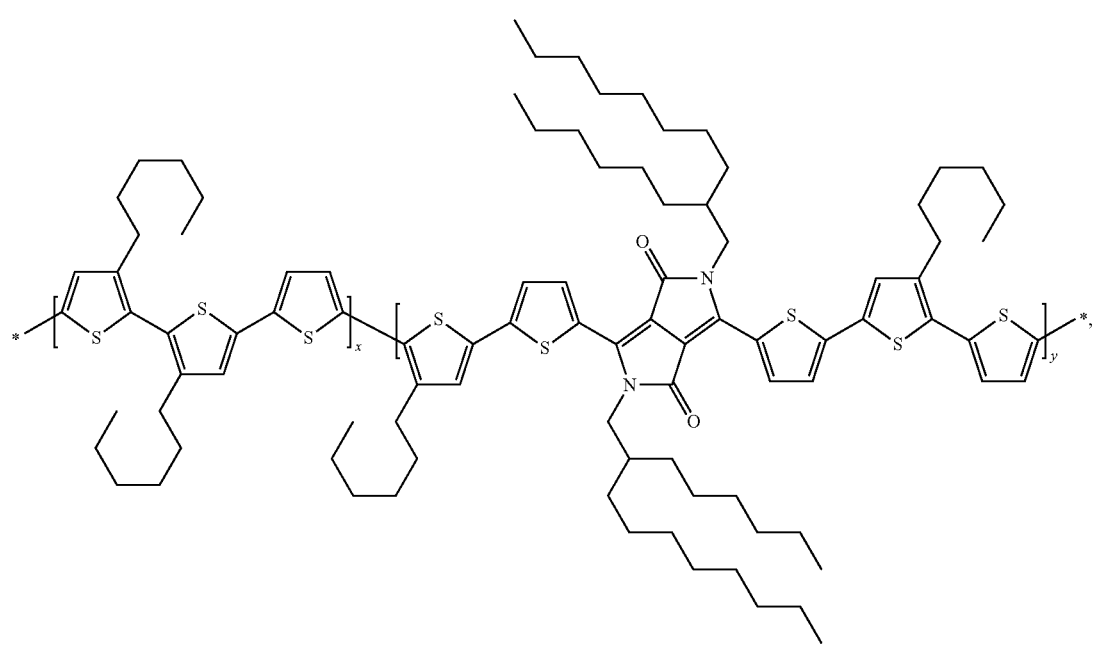
(x = 0.05 to 0.8 and y = 0.95 to 0.2)

-continued
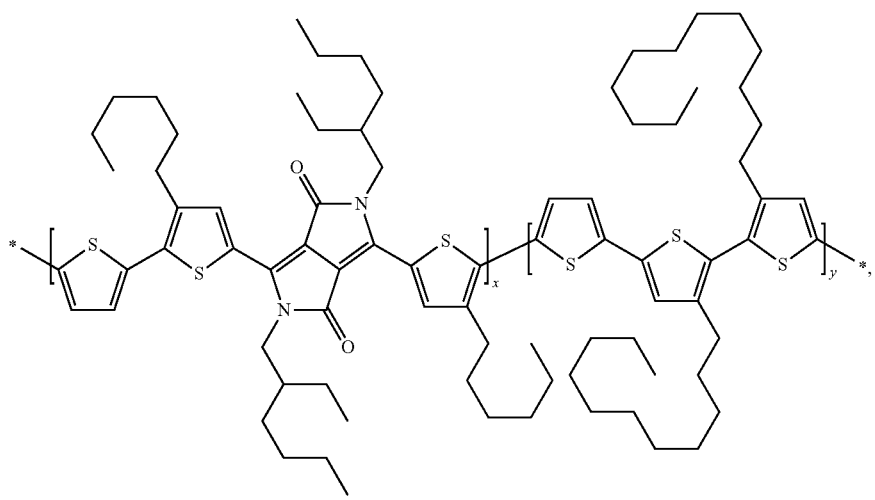
(x = 0.05 to 0.8 and y = 0.95 to 0.2)
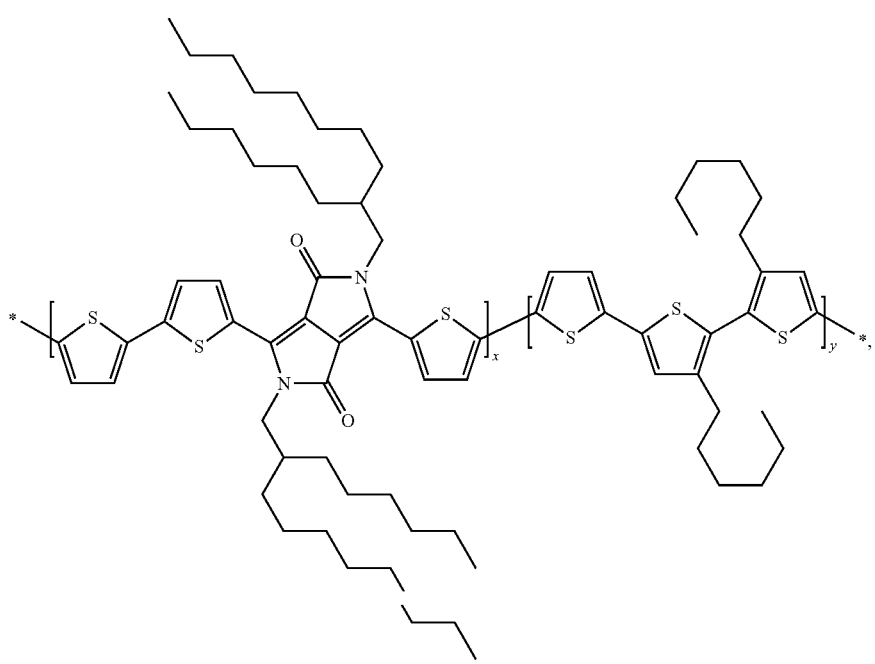
(x = 0.05 to 0.8 and y = 0.95 to 0.2)

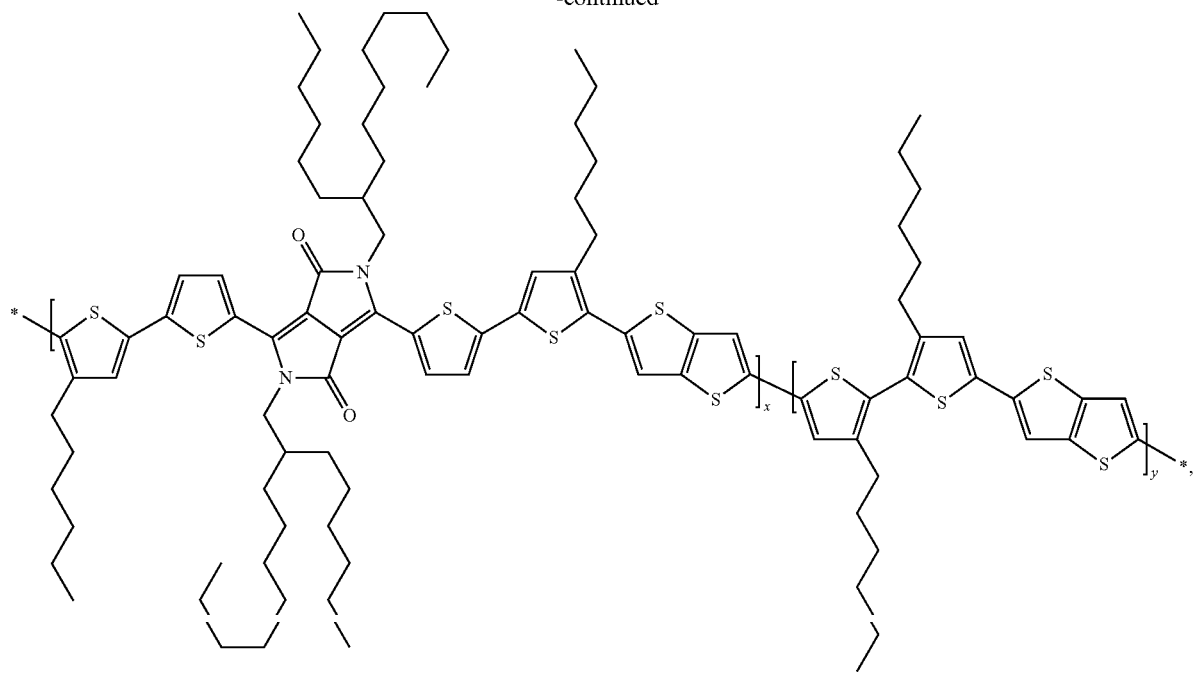
(x = 0.2 to 0.8 and y = 0.8 to 0.2)
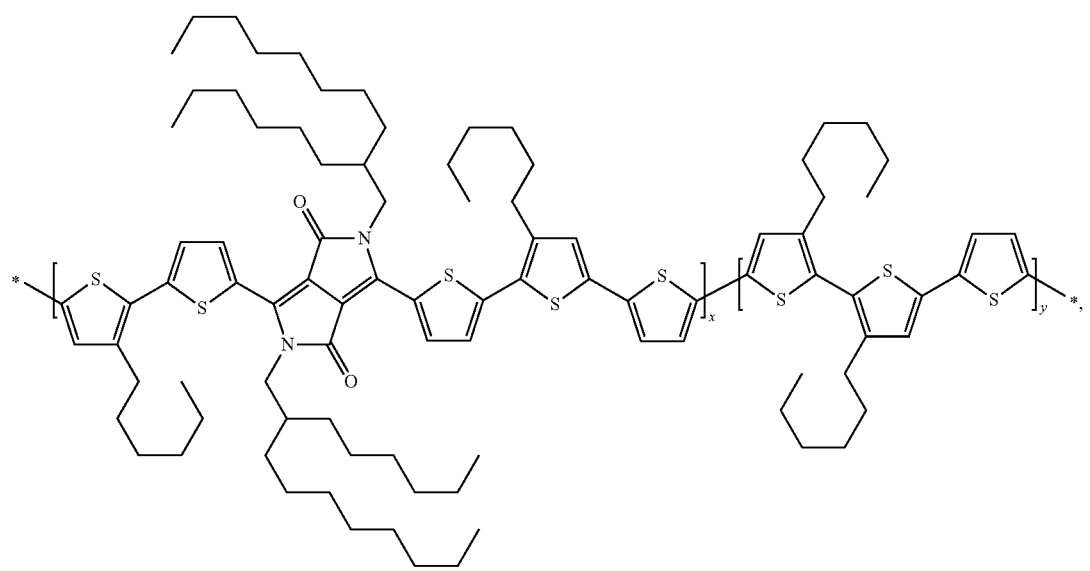
(x = 0.2 to 0.8 and y = 0.8 to 0.2)

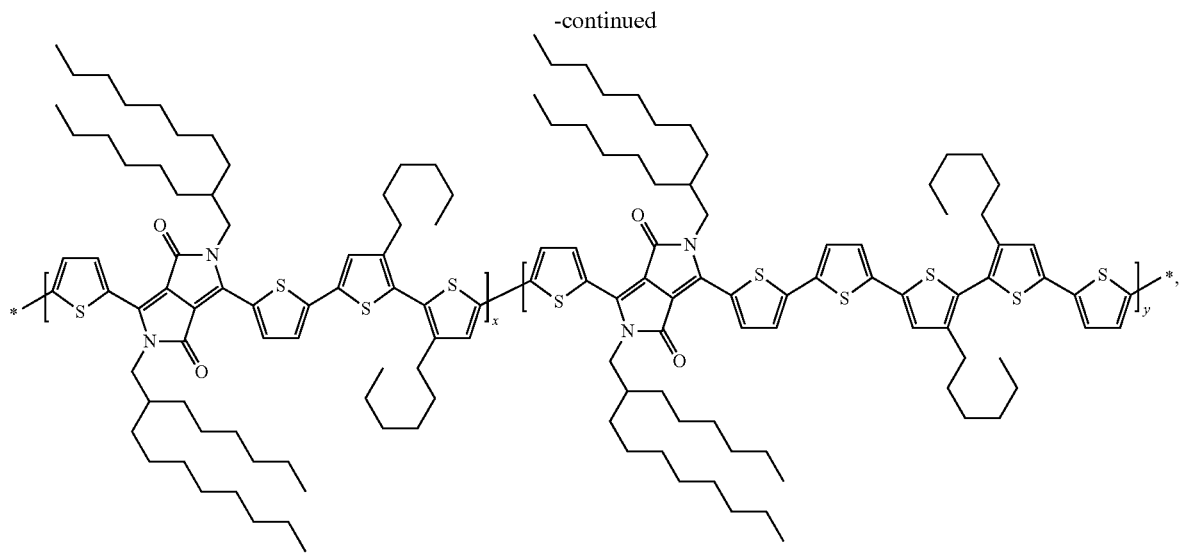

(x = 0.2 to 0.8 and y = 0.8 to 0.2)

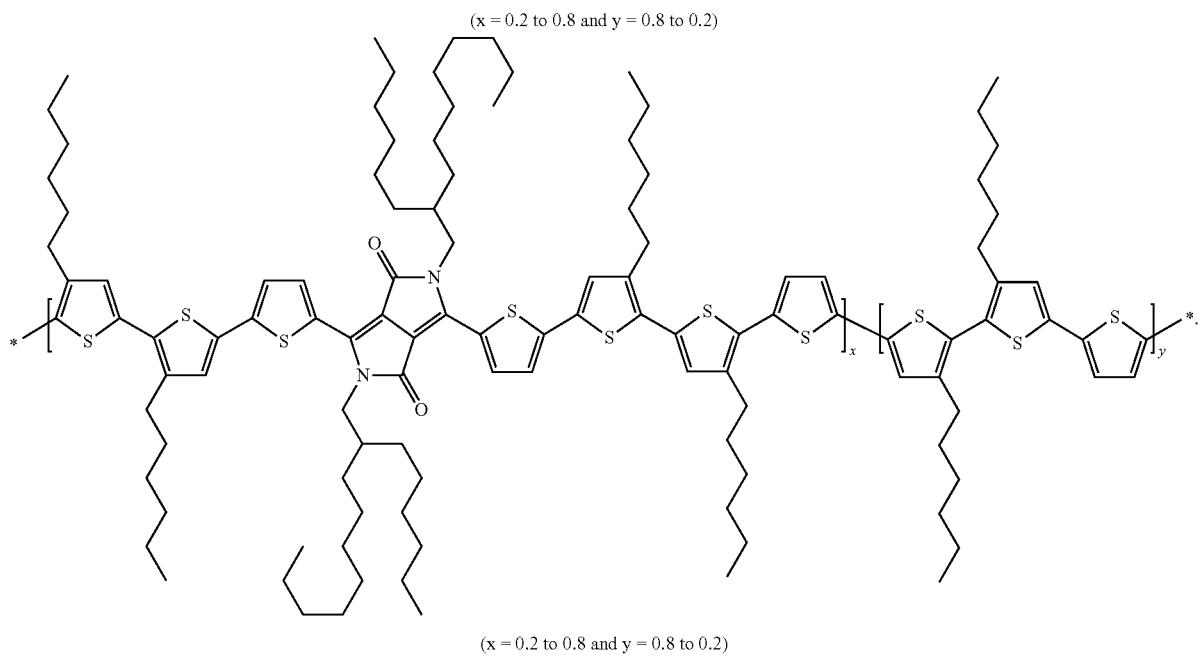

(x = 0.2 to 0.8 and y = 0.8 to 0.2)

In a preferred embodiment the present invention is directed to copolymers of formula *—[A-D]—**—[B-D]— (VII), wherein A, B and D are as defined above.

Copolymers of formula VII can be obtained, for example, by the Suzuki reaction. The condensation reaction of an aromatic boronate and a halogenide, especially a bromide, commonly referred to as the "Suzuki reaction", is tolerant of the presence of a variety of organic functional groups as reported by N. Miyaura and A. Suzuki in Chemical Reviews, Vol. 95, pp. 457-2483 (1995). Preferred catalysts are 2-dicyclohexylphosphino-2',6'-di-alkoxybiphenyl/palladium(II)acetates, tri-alykl-phosphonium salts/palladium (0) derivatives and tri-alkylphosphine/palladium (0) derivatives. Especially preferred catalysts are 2-dicyclohexylphosphino-2',6'-di-methoxybiphenyl (sPhos)/palladium(II)acetate and, tri-tert-butylphosphonium tetrafluoroborate ((t-Bu)$_3$P*HBF$_4$)/tris (dibenzylideneacetone) dipalladium (0) (Pd$_2$(dba)$_3$) and tri-tert-butylphosphine (t-Bu)$_3$P/tris(dibenzylideneacetone) dipalladium (0) (Pd$_2$(dba)$_3$). This reaction can be applied to preparing high molecular weight polymers and copolymers.

To prepare polymers corresponding to formula VII a dihalogenide, such as a dibromide or dichloride, especially a dibromide corresponding to formula Br-A-Br and Br—B—Br is reacted with an (equimolar) amount of a diboronic acid or diboronate corresponding to formula $X^{11}$—[D]—$X^{11}$, wherein $X^{11}$ is independently in each occurrence —B(OH)$_2$, —B(OY$^1$)$_2$,

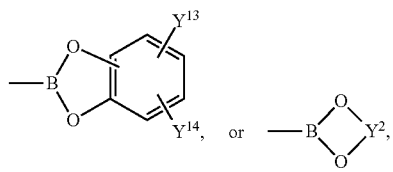

wherein $Y^1$ is independently in each occurrence a $C_1$-$C_{10}$alkyl group and $Y^2$ is independently in each occurrence a $C_2$-$C_{10}$alkylene group, such as —CY$^3$Y$^4$—CY$^5$Y$^6$—, or —CY⁷Y⁸—CY⁹Y¹⁰—CY¹¹Y¹²—, wherein Y³, Y⁴, Y⁵, Y⁶, Y⁷, Y⁸, Y⁹, Y¹⁰, Y¹¹ and Y¹² are independently of each other hydrogen, or a $C_1$-$C_{10}$alkyl group, especially —C(CH₃)₂C(CH₃)₂—, —CH₂C(CH₃)₂CH₂—, or —C(CH₃)₂CH₂C(CH₃)₂—, and Y¹³ and Y¹⁴ are independently of each other hydrogen, or a $C_1$-$C_{10}$alkyl group, under the catalytic action of Pd and triphenylphosphine. The reaction is typically conducted at about 0° C. to 180° C. in an aromatic hydrocarbon solvent such as toluene, xylene. Other solvents such as dimethylformamide, dioxane, dimethoxyethan and tetrahydrofuran can also be used alone, or in mixtures with an aromatic hydrocarbon. An aqueous base, preferably sodium carbonate or bicarbonate, potassium phosphate, potassium carbonate or bicarbonate is used as activation agent for the boronic acid, boronate and as the HBr scavenger. A polymerization reaction may take 0.2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein). Other variations of reaction conditions are given by T. I. Wallow and B. M. Novak in J. Org. Chem. 59 (1994) 5034-5037; and M. Remmers, M. Schulze, and G. Wegner in Macromol. Rapid Commun. 17 (1996) 239-252. Controll of molecular weight is possible by using either an excess of dibromide, diboronic acid, or diboronate, or a chain terminator.

If desired, a monofunctional aryl halide or aryl boronate may be used as a chain-terminator in such reactions, which will result in the formation of a terminal aryl group.

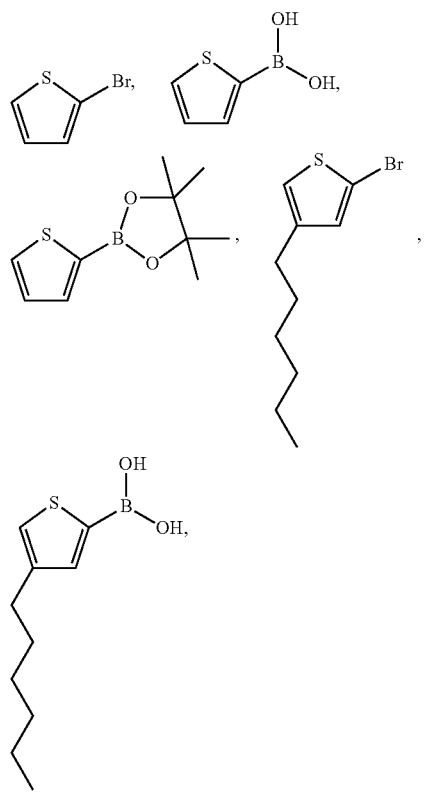

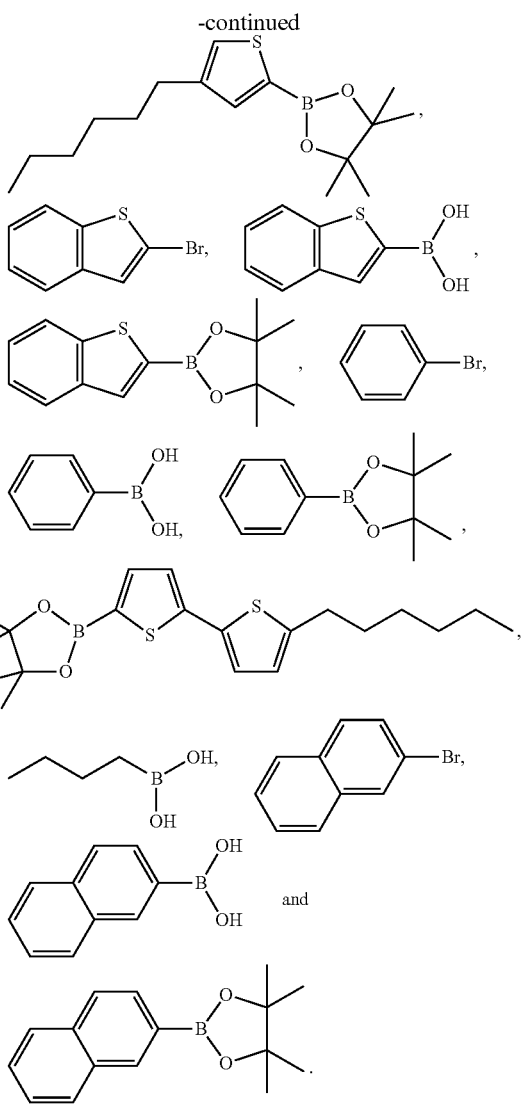

It is possible to control the sequencing of the monomeric units in the resulting copolymer by controlling the order and composition of monomer feeds in the Suzuki reaction.

The polymers of the present invention can also be sythesized by the Stille coupling (see, for example, Babudri et al, J. Mater. Chem., 2004, 14, 11-34; J. K. Stille, Angew. Chemie Int. Ed. Engl. 1986, 25, 508). To prepare polymers corresponding to formula VII a dihalogenide, such as a dibromide or dichloride, especially a dibromide corresponding to formula Br-A-Br and Br—B—Br is reacted with a compound of formula $X^{21}$-D-$X^{21}$, wherein $X^{21}$ is a group —SnR²⁰⁷R²⁰⁸R²⁰⁹, in an inert solvent at a temperature in range from 0° C. to 200° C. in the presence of a palladium-containing catalyst, wherein R²⁰⁷, R²⁰⁸ and R²⁰⁹ are identical or different and are H or $C_1$-$C_6$alkyl, wherein two radicals optionally form a common ring and these radicals are optionally branched or unbranched. It must be ensured here that the totality of all monomers used has a highly balanced ratio of organotin functions to halogen functions. In addition, it may prove advantageous to remove any excess reactive groups at the end of the reaction by end-capping with monofunctional reagents. In order to carry out the process, the tin compounds and the halogen compounds are preferably introduced into one or more inert organic solvents and stirred at a temperature of from 0 to 200° C., preferably from 30 to 170° C. for a period of from 1 hour to 200 hours, preferably from 5 hours to 150 hours. The crude product can be purified by methods known to the person skilled in the art and appropriate for the respective polymer, for example repeated re-precipitation or even by dialysis.

Suitable organic solvents for the process described are, for example, ethers, for example diethyl ether, dimethoxyethane, diethylene glycol dimethyl ether, tetrahydrofuran, dioxane, dioxolane, diisopropyl ether and tert-butyl methyl ether, hydrocarbons, for example hexane, isohexane, heptane, cyclohexane, benzene, toluene and xylene, alcohols, for example methanol, ethanol, 1-propanol, 2-propanol, ethylene glycol, 1-butanol, 2-butanol and tert-butanol, ketones, for example acetone, ethyl methyl ketone and isobutyl methyl ketone, amides, for example dimethylformamide (DMF), dimethylacetamide and N-methylpyrrolidone, nitriles, for example acetonitrile, propionitrile and butyronitrile, and mixtures thereof.

The palladium and phosphine components should be selected analogously to the description for the Suzuki variant.

Alternatively, the polymers of the present invention can also be synthesized by the Negishi reaction using zinc reagents A-$(ZnX^{22})_2$ and B—$(ZnX^{22})_2$, wherein $X^{22}$ is halogen and halides, and D-$(X^{23})_2$, wherein $X^{23}$ is halogen or triflate, or using A-$(X^{22})_2$, B—$(X^{22})_2$, and D-$(ZnX^{23})_2$. Reference is, for example, made to E. Negishi et al., Heterocycles 18 (1982) 117-22.

Alternatively, the polymers of the present invention can also be synthesized by the Hiyama reaction using organosilicon reagents A-$(SiR^{210}R^{211}R^{212})_2$ and B—$(SiR^{210}R^{211}R^{212})_2$, wherein $R^{210}$, $R^{211}$ and $R^{212}$ are identical or different and are halogen, $C_1$-$C_6$alkyl and D-$(X^{23})_2$, wherein $X^{23}$ is halogen or triflate, or using A-$(X^{22})^2$, B—$(X^{22})_2$, and D-$(SiR^{210}R^{211}R^{212})_2$. Reference is, for example, made to T. Hiyama et al., Pure Appl. Chem. 66 (1994) 1471-1478 and T. Hiyama et al., Synlett (1991) 845-853.

The polymers, wherein $R^1$ and/or $R^2$ are hydrogen can be obtained by using a protecting group which can be removed after polymerization (see, for example, EP-A-0 648 770, EP-A-0 648 817, EP-A-0 742 255, EP-A-0 761 772, WO98/32802, WO98/45757, WO98/58027, WO99/01511, WO00/17275, WO00/39221, WO00/63297 and EP-A-1 086 984). Conversion of the pigment precursor into its pigmentary form is carried out by means of fragmentation under known conditions, for example thermally, optionally in the presence of an additional catalyst, for example the catalysts described in WO00/36210.

An example of such a protecting group is group of formula

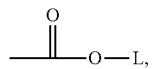

wherein L is any desired group suitable for imparting solubility.

L is preferably a group of formula

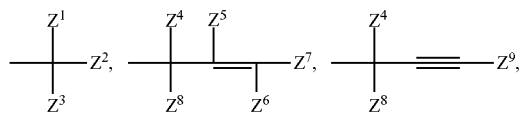

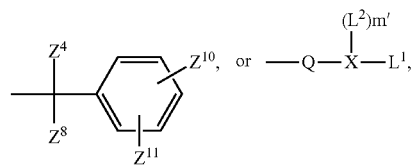

wherein $Z^1$, $Z^2$ and $Z^3$ are independently of each other $C_1$-$C_6$alkyl, $Z^4$ and $Z^8$ are independently of each other $C_1$-$C_6$alkyl, $C_1$-$C_6$alkyl interrupted by oxygen, sulfur or $N(Z^{12})_2$, or unsubstituted or $C_1$-$C_6$alkyl-, $C_1$-$C_6$alkoxy-, halo-, cyano- or nitro-substituted phenyl or biphenyl, $Z^5$, $Z^6$ and $Z^7$ are independently of each other hydrogen or $C_1$-$C_6$alkyl, $Z^9$ is hydrogen, $C_1$-$C_6$alkyl or a group of formula

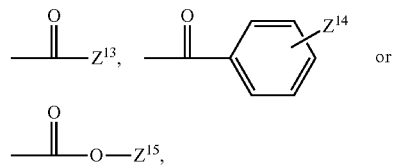

$Z^{10}$ and $Z^{11}$ are each independently of the other hydrogen, $C_1$-$C_6$alkyl, $C_1$-$C_6$alkoxy, halogen, cyano, nitro, $N(Z^{12})_2$, or unsubstituted or halo-, cyano-, nitro-, $C_1$-$C_6$alkyl- or $C_1$-$C_6$alkoxy-substituted phenyl, $Z^{12}$ and $Z^{13}$ are $C_1$-$C_6$alkyl, $Z^{14}$ is hydrogen or $C_1$-$C_6$alkyl, and $Z^{15}$ is hydrogen, $C_1$-$C_6$alkyl, or unsubstituted or $C_1$-$C_6$alkyl-substituted phenyl, Q is p,q-$C_2$-$C_6$alkylene unsubstituted or mono- or poly-substituted by $C_1$-$C_6$alkoxy, $C_1$-$C_6$alkylthio or $C_2$-$C_{12}$dialkylamino, wherein p and q are different position numbers, X is a hetero atom selected from the group consisting of nitrogen, oxygen and sulfur, m' being the number 0 when X is oxygen or sulfur and m being the number 1 when X is nitrogen, and $L^1$ and $L^2$ are independently of each other unsubstituted or mono- or poly-$C_1$-$C_{12}$alkoxy-, —$C_1$-$C_{12}$alkylthio-, —$C_2$-$C_{24}$dialkylamino-, —$C_6$-$C_{12}$aryloxy-, —$C_6$-$C_{12}$arylthio-, —$C_7$-$C_{24}$alkylarylamino- or —$C_{12}$-$C_{24}$diarylamino-substituted $C_1$-$C_6$alkyl or [-p',q'-$C_2$-$C_6$alkylene)-Z—]$_n$—$C_1$-$C_6$alkyl, n' being a number from 1 to 1000, p' and q' being different position numbers, each Z independently of any others being a hetero atom oxygen, sulfur or $C_1$-$C_{12}$alkyl-substituted nitrogen, and it being possible for $C_2$-$C_6$alkylene in the repeating [—$C_2$-$C_6$alkylene-Z—] units to be the same or different, and $L_1$ and $L_2$ may be saturated or unsaturated from one to ten times, may be uninterrupted or interrupted at any location by from 1 to 10 groups selected from the group consisting of —(C=O)— and —$C_6H_4$—, and may carry no further substituents or from 1 to 10 further substituents selected from the group consisting of halogen, cyano and nitro. Most preferred L is a group of formula

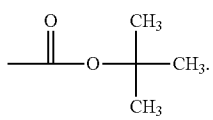

The synthesis of the compounds of formula Br-A-Br is described in WO08/000664, and WO09/047104, or can be done in analogy to the methods described therein. The synthesis of N-aryl substituted compounds of formula Br-A-Br can be done in analogy to the methods described in U.S. Pat. No. 5,354,869 and WO03/022848.

Halogen is fluorine, chlorine, bromine and iodine.

$C_1$-$C_{25}$alkyl ($C_1$-$C_{18}$alkyl) is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, octadecyl, eicosyl, heneicosyl, docosyl, tetracosyl or pentacosyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethyl-propyl, n-hexyl, n-heptyl, n-octyl, 1,1,3,3-tetramethylbutyl and 2-ethylhexyl. $C_1$-$C_4$alkyl is typically methyl, ethyl, n-propyl, isopropyl, n-butyl, sec.-butyl, isobutyl, tert.-butyl.

$C_1$-$C_{25}$alkoxy groups ($C_1$-$C_{18}$alkoxy groups) are straight-chain or branched alkoxy groups, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy. Examples of $C_1$-$C_8$alkoxy are methoxy, ethoxy, n-propoxy, isopropoxy, n-butoxy, sec.-butoxy, isobutoxy, tert.-butoxy, n-pentoxy, 2-pentoxy, 3-pentoxy, 2,2-dimethylpropoxy, n-hexoxy, n-heptoxy, n-octoxy, 1,1,3,3-tetramethylbutoxy and 2-ethylhexoxy, preferably $C_1$-$C_4$alkoxy such as typically methoxy, ethoxy, n-propoxy, isopropoxy, n-butoxy, sec.-butoxy, isobutoxy, tert.-butoxy. The term "alkylthio group" means the same groups as the alkoxy groups, except that the oxygen atom of the ether linkage is replaced by a sulfur atom.

$C_6$-$C_{24}$aryl is typically phenyl, indenyl, azulenyl, naphthyl, biphenyl, as-indacenyl, s-indacenyl, acenaphthylenyl, fluorenyl, phenanthryl, fluoranthenyl, triphenlenyl, chrysenyl, naphthacen, picenyl, perylenyl, pentaphenyl, hexacenyl, pyrenyl, or anthracenyl, preferably phenyl, 1-naphthyl, 2-naphthyl, 4-biphenyl, 9-phenanthryl, 2- or 9-fluorenyl, 3- or 4-biphenyl, which may be unsubstituted or substituted. Examples of $C_6$-$C_{12}$aryl are phenyl, 1-naphthyl, 2-naphthyl, 3- or 4-biphenyl, 2- or 9-fluorenyl or 9-phenanthryl, which may be unsubstituted or substituted.

Possible substituents of the above-mentioned groups are $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, a carbamoyl group, a nitro group or a silyl group, especially $C_1$-$C_8$alkyl, $C_1$-$C_8$alkoxy, $C_1$-$C_8$alkylthio, halogen, halo-$C_1$-$C_8$alkyl, or a cyano group.

$C_1$-$C_{18}$alkyl interrupted by one or more O is, for example, $(CH_2CH_2O)_{1-9}$—$R^x$, where $R^x$ is H or $C_1$-$C_{10}$alkyl, $CH_2$—$CH(OR^{y\prime\prime})$—$CH_2$—O—$R^y$, where $R^y$ is $C_1$-$C_{18}$alkyl, and $R^{y\prime\prime}$ embraces the same definitions as $R^y$ or is H.

If a substituent, such as, for example $Ar^{24}$, occurs more than one time in a group, it can be different in each occurrence.

A mixture containing a polymer of the present invention results in a semi-conducting layer comprising a polymer of the present invention (typically 5% to 99.9999% by weight, especially 20 to 85% by weight) and at least another material. The other material can be, but is not restricted to a fraction of the same polymer of the present invention with different molecular weight, another polymer of the present invention, a semi-conducting polymer, organic small molecules, carbon nanotubes, a fullerene derivative, inorganic particles (quantum dots, quantum rods, quantum tripods, $TiO_2$, ZnO etc.), conductive particles (Au, Ag etc.), insulator materials like the ones described for the gate dielectric (PET, PS etc.).

The polymers of the present invention can be blended with small molecules described, for example, in European patent application no. 09155919.5, WO09/047104, U.S. Pat. No. 6,690,029, WO2007082584, and WO2008107089:

WO2007082584:

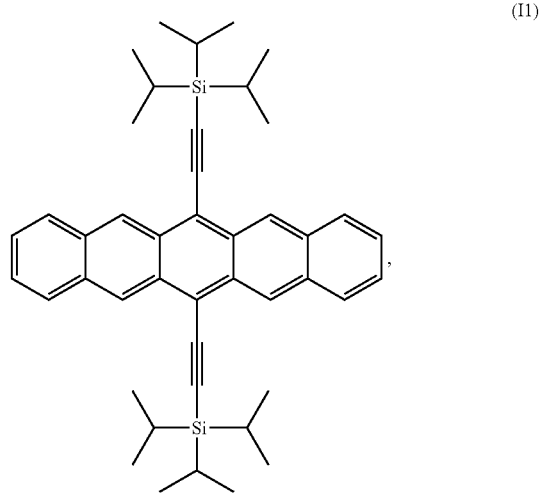

(I1)

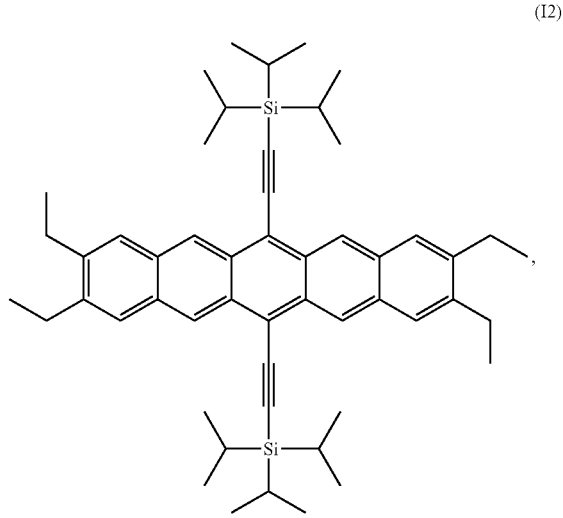

(I2)

(I3)
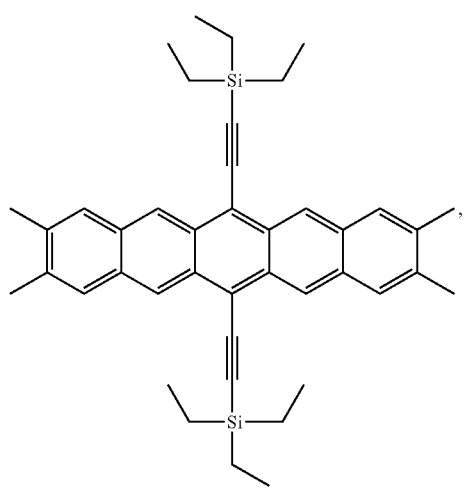
(I4)
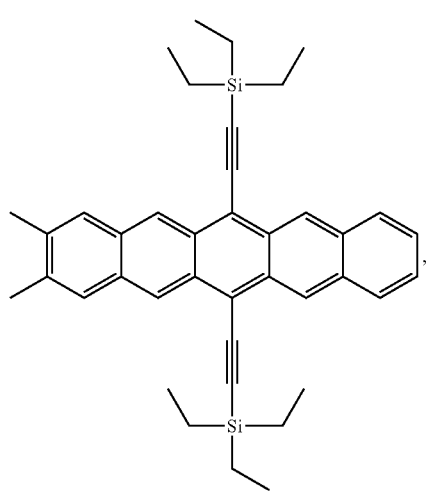
(I5)
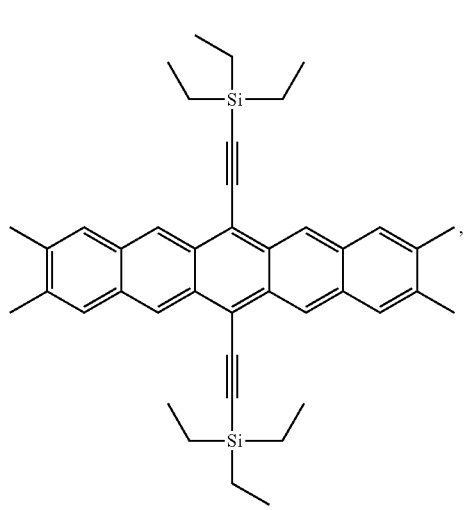
(I6)
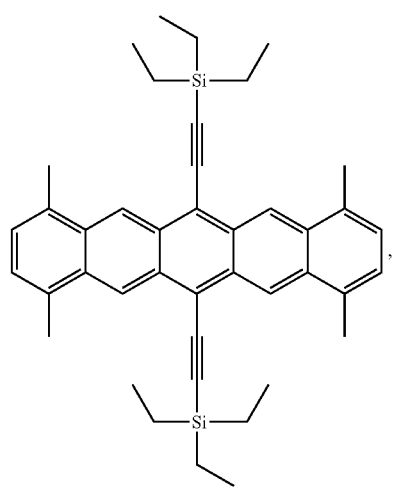
(I7)
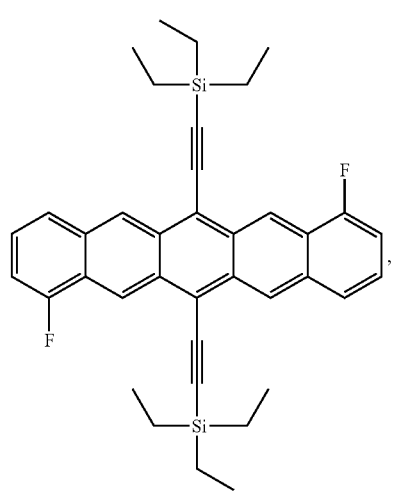
(I8)
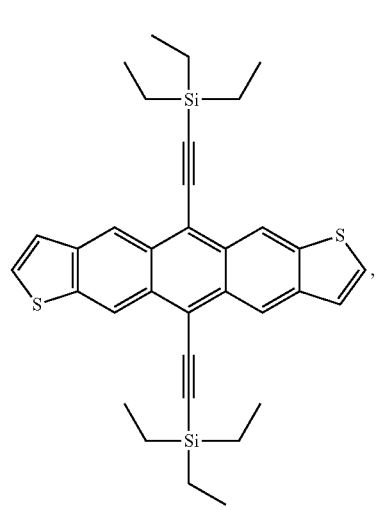

(I9)

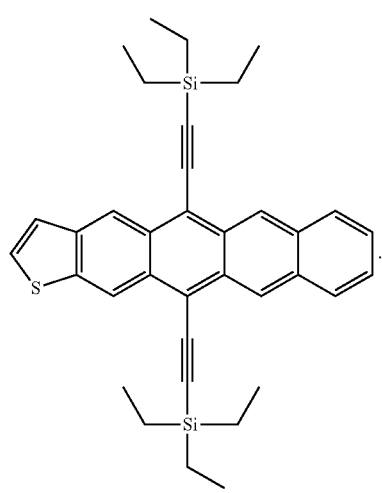

WO2008107089:

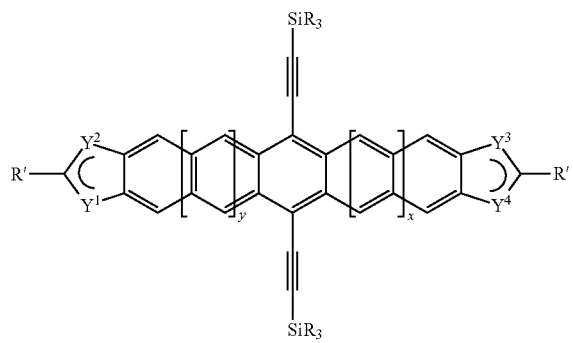

wherein one of $Y^1$ and $Y^2$ denotes —CH= or =CH— and the other denotes —X—,
one of $Y^3$ and $Y^4$ denotes —CH= or =CH— and the other denotes —X—,
X is —O—, —S—, —Se— or —NR'''—,
R is cyclic, straight-chain or branched alkyl or alkoxy having 1 to 20 C-atoms, or aryl having 2-30 C-atoms, all of which are optionally fluorinated or perfluorinated,
R' is H, F, Cl, Br, I, CN, straight-chain or branched alkyl or alkoxy having 1 to 20 C-atoms and optionally being fluorinated or perfluorinated, optionally fluorinated or perfluorinated aryl having 6 to 30 C-atoms, or $CO_2R''$, with R'' being H, optionally fluorinated alkyl having 1 to 20 C-atoms, or optionally fluorinated aryl having 2 to 30 C-atoms,
R''' is H or cyclic, straight-chain or branched alkyl with 1 to 10 C-atoms, y is 0, or 1, x is 0, or 1.

A1

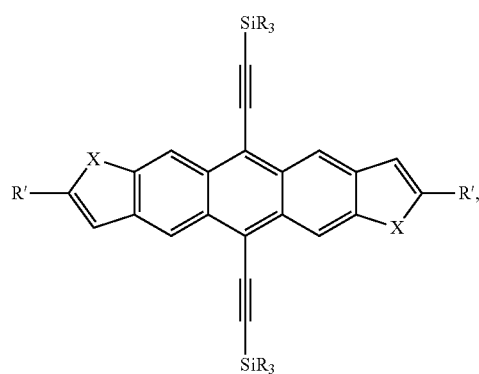

A2

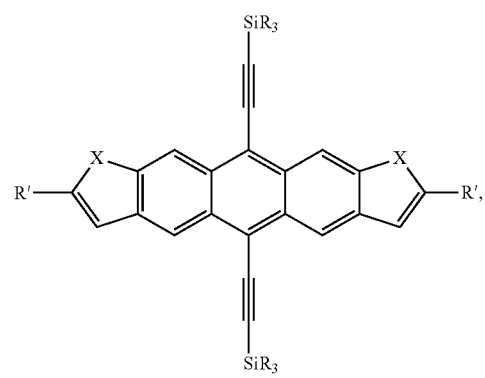

B1

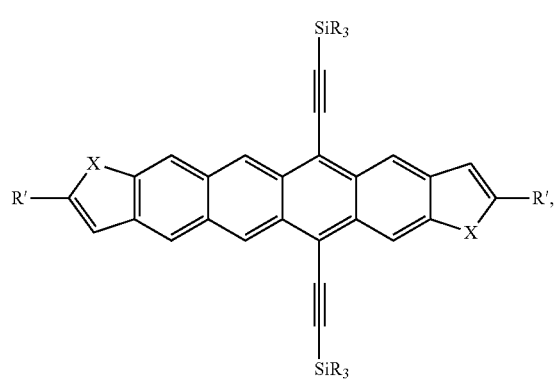

B2

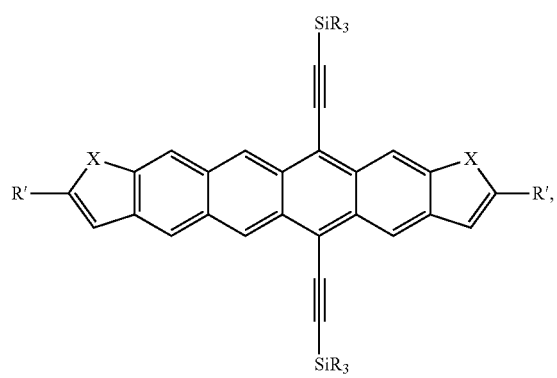

C1

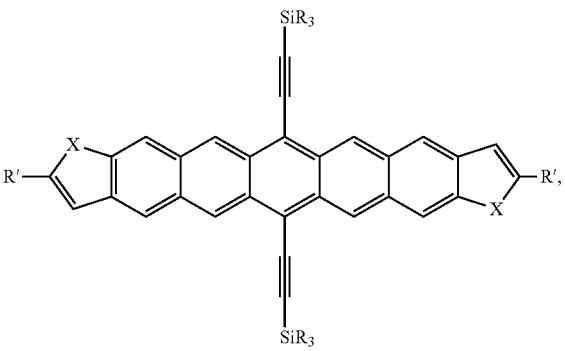

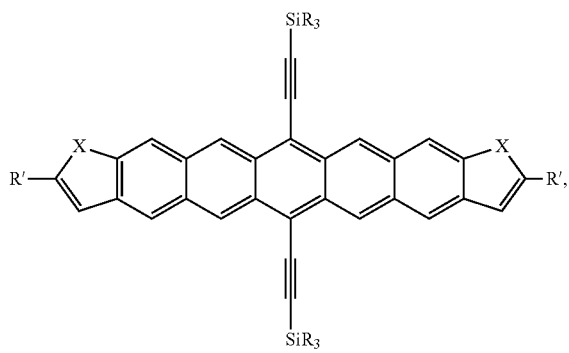

C2

The polymer can contain a small molecule, or a mixture of two, or more small molecule compounds.

Accordingly, the present invention also relates to an organic semiconductor material, layer or component, comprising a polymer according to the present invention.

The polymers of the invention can be used as the semiconductor layer in semiconductor devices. Accordingly, the present invention also relates to semiconductor devices, comprising a polymer of the present invention, or an organic semiconductor material, layer or component. The semiconductor device is especially an organic photovoltaic (PV) device (solar cell), a photodiode, or an organic field effect transistor.

There are numerous types of semiconductor devices. Common to all is the presence of one or more semiconductor materials. Semiconductor devices have been described, for example, by S. M. Sze in Physics of Semiconductor Devices, $2^{nd}$ edition, John Wiley and Sons, New York (1981). Such devices include rectifiers, transistors (of which there are many types, including p-n-p, n-p-n, and thin-film transistors), light emitting semiconductor devices (for example, organic light emitting diodes in display applications or backlight in e.g. liquid crystal displays), photoconductors, current limiters, solar cells, thermistors, p-n junctions, field-effect diodes, Schottky diodes, and so forth. In each semiconductor device, the semiconductor material is combined with one or more metals, metal oxides, such as, for example, indium tin oxide (ITO), and/or insulators to form the device. Semiconductor devices can be prepared or manufactured by known methods such as, for example, those described by Peter Van Zant in Microchip Fabrication, Fourth Edition, McGraw-Hill, New York (2000). In particular, organic electronic components can be manufactured as described by D. R. Gamota et al. in Printed Organic and Molecular Electronics, Kluver Academic Publ., Boston, 2004.

A particularly useful type of transistor device, the thin-film transistor (TFT), generally includes a gate electrode, a gate dielectric on the gate electrode, a source electrode and a drain electrode adjacent to the gate dielectric, and a semiconductor layer adjacent to the gate dielectric and adjacent to the source and drain electrodes (see, for example, S. M. Sze, Physics of Semiconductor Devices, $2^{nd}$ edition, John Wiley and Sons, page 492, New York (1981)). These components can be assembled in a variety of configurations. More specifically, an OFET has an organic semiconductor layer.

Typically, a substrate supports the OFET during manufacturing, testing, and/or use. Optionally, the substrate can provide an electrical function for the OFET. Useful substrate materials include organic and inorganic materials. For example, the substrate can comprise silicon materials inclusive of various appropriate forms of silicon, inorganic glasses, ceramic foils, polymeric materials (for example, acrylics, polyester, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly (ethylene terephthalate) (PET), poly(phenylene sulfide) (PPS)), filled polymeric materials (for example, fiber-reinforced plastics (FRP)), and coated metallic foils.

The gate electrode can be any useful conductive material. For example, the gate electrode can comprise doped silicon, or a metal, such as aluminum, chromium, gold, silver, nickel, palladium, platinum, tantalum, and titanium. Conductive oxides, such as indium tin oxide, or conducting inks/pastes comprised of carbon black/graphite or colloidal silver dispersions, optionally containing polymer binders can also be used. Conductive polymers also can be used, for example polyaniline or poly(3,4-ethylenedioxythiophene)/poly(styrene sulfonate) (PEDOT:PSS). In addition, alloys, combinations, and multilayers of these materials can be useful. In some OFETs, the same material can provide the gate electrode function and also provide the support function of the substrate. For example, doped silicon can function as the gate electrode and support the OFET.

The gate dielectric is generally provided on the gate electrode. This gate dielectric electrically insulates the gate electrode from the balance of the OFET device. Useful materials for the gate dielectric can comprise, for example, an inorganic electrically insulating material.

The gate dielectric (insulator) can be a material, such as, an oxide, nitride, or it can be a material selected from the family of ferroelectric insulators (e.g. organic materials such as poly (vinylidene fluoride/trifluoroethylene or poly(m-xylylene adipamide)), or it can be an organic polymeric insulator (e.g. poly(methacrylate)s, poly(acrylate)s, polyimides, benzocyclobutenes (BCBs), parylenes, polyvinylalcohol, polyvinylphenol (PVP), polystyrenes, polyester, polycarbonates) as for example described in J. Veres et al. Chem. Mat. 2004, 16, 4543 or A. Facchetti et al. Adv. Mat. 2005, 17, 1705. Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulphide, including but not limited to $PbZr_xTi_{1-x}O_3$ (PZT), $Bi_4Ti_3O_{12}$, $BaMgF_4$, $Ba(Zr_{1-x}Ti_x)O_3$ (BZT). In addition, alloys, hybride materials (e.g. polysiloxanes or nanoparticle-filled polymers) combinations, and multilayers of these materials can be used for the gate dielectric. The thickness of the dielectric layer is, for example, from about 10 to 1000 nm, with a more specific thickness being about 100 to 500 nm, providing a capacitance in the range of 0.1-100 nanofarads (nF).

The source electrode and drain electrode are separated from the gate electrode by the gate dielectric, while the organic semiconductor layer can be over or under the source electrode and drain electrode. The source and drain electrodes can be any useful conductive material favourably providing a low resistance ohmic contact to the semiconductor layer. Useful materials include most of those materials described above for the gate electrode, for example, aluminum, barium, calcium, chromium, gold, silver, nickel, palladium, platinum, titanium, polyaniline, PEDOT:PSS, other conducting polymers, alloys thereof, combinations thereof, and multilayers thereof. Some of these materials are appropriate for use with n-type semiconductor materials and others are appropriate for use with p-type semiconductor materials, as is known in the art.

The thin film electrodes (that is, the gate electrode, the source electrode, and the drain electrode) can be provided by any useful means such as physical vapor deposition (for example, thermal evaporation or sputtering) or (ink jet) printing methods. The patterning of these electrodes can be accomplished by known methods such as shadow masking, additive photolithography, subtractive photolithography, printing, microcontact printing, and pattern coating.

The present invention further provides an organic field effect transistor device comprising a plurality of electrically conducting gate electrodes disposed on a substrate;

a gate insulator layer disposed on said electrically conducting gate electrodes;

a plurality of sets of electrically conductive source and drain electrodes disposed on said insulator layer such that each of said sets is in alignment with each of said gate electrodes;

an organic semiconductor layer disposed in the channel between source and drain electrodes on said insulator layer substantially overlapping said gate electrodes; wherein said organic semiconductor layer comprises a polymer of the present invention, or a mixture containing a polymer of the present invention.

The present invention further provides a process for preparing a thin film transistor device comprising the steps of:

depositing a plurality of electrically conducting gate electrodes on a substrate;

depositing a gate insulator layer on said electrically conducting gate electrodes;

depositing a plurality of sets of electrically conductive source and drain electrodes on said layer such that each of said sets is in alignment with each of said gate electrodes;

depositing a layer of a polymer of the present invention on said insulator layer such that said layer of the compound of the present invention, or a mixture containing a polymer of the present invention, substantially overlaps said gate electrodes; thereby producing the thin film transistor device.

Alternatively, an OFET is fabricated by, for example, by solution deposition of a polymer on a highly doped silicon substrate covered with a thermally grown oxide layer followed by vacuum deposition and patterning of source and drain electrodes.

In yet another approach, an OFET is fabricated by deposition of source and drain electrodes on a highly doped silicon substrate covered with a thermally grown oxide and then solution deposition of the polymer to form a thin film.

The gate electrode could also be a patterned metal gate electrode on a substrate or a conducting material such as, a conducting polymer, which is then coated with an insulator applied either by solution coating or by vacuum deposition on the patterned gate electrodes.

Any suitable solvent can be used to dissolve, and/or disperse the polymers of the present application, provided it is inert and can be removed partly, or completely from the substrate by conventional drying means (e.g. application of heat, reduced pressure, airflow etc.). Suitable organic solvents for processing the semiconductors of the invention include, but are not limited to, aromatic or aliphatic hydrocarbons, halogenated such as chlorinated or fluorinated hydrocarbons, esters, ethers amides, such as chloroform, tetrachloroethane, tetrahydrofuran, toluene, tetraline, decaline, anisole, xylene, ethyl acetate, methyl ethyl ketone, dimethyl formamide, chloroform, chlorobenzene, dichlorobenzene, trichlorobenzene, propylene glycol monomethyl ether acetate (PGMEA) and mixtures thereof. Preferred solvents are xylene, toluene, tetraline, decaline, chlorinated ones such as chloroform, chlorobenzene, ortho-dichlorobenzene, trichlorobenzene and mixtures thereof. The solution, and/or dispersion is then applied by a method, such as, spin-coating, dip-coating, screen printing, microcontact printing, doctor blading or other solution application techniques known in the art on the substrate to obtain thin films of the semiconducting material.

The term "dispersion" covers any composition comprising the semiconductor material of the present invention, which is not fully dissolved in a solvent. The dispersion can be done selecting a composition including at least a polymer of the present invention, or a mixture containing a polymer of the present invention, and a solvent, wherein the polymer exhibits lower solubility in the solvent at room temperature but exhibits greater solubility in the solvent at an elevated temperature, wherein the composition gels when the elevated temperature is lowered to a first lower temperature without agitation;

dissolving at the elevated temperature at least a portion of the polymer in the solvent; lowering the temperature of the composition from the elevated temperature to the first lower temperature; agitating the composition to disrupt any gelling, wherein the agitating commences at any time prior to, simultaneous with, or subsequent to the lowering the elevated temperature of the composition to the first lower temperature; depositing a layer of the composition wherein the composition is at a second lower temperature lower than the elevated temperature; and drying at least partially the layer.

The dispersion can also be constituted of (a) a continuous phase comprising a solvent, a binder resin, and optionally a dispersing agent, and (b) a disperse phase comprising a polymer of the present invention, or a mixture containing a polymer of the present invention. The degree of solubility of the polymer of the present invention in the solvent may vary for example from 0% to about 20% solubility, particularly from 0% to about 5% solubility.

Preferably, the thickness of the organic semiconductor layer is in the range of from about 5 to about 1000 nm, especially the thickness is in the range of from about 10 to about 100 nm.

The polymers of the invention can be used alone or in combination as the organic semiconductor layer of the semiconductor device. The layer can be provided by any useful means, such as, for example, vapor deposition (for materials with relatively low molecular weight) and printing techniques. The compounds of the invention may be sufficiently soluble in organic solvents and can be solution deposited and patterned (for example, by spin coating, dip coating, ink jet printing, gravure printing, flexo printing, offset printing, screen printing, microcontact (wave)-printing, drop or zone casting, or other known techniques).

The polymers of the invention can be used in integrated circuits comprising a plurality of OTFTs, as well as in various electronic articles. Such articles include, for example, radio-frequency identification (RFID) tags, backplanes for flexible displays (for use in, for example, personal computers, cell phones, or handheld devices), smart cards, memory devices, sensors (e.g. light-, image-, bio-, chemo-, mechanical- or temperature sensors), especially photodiodes, or security devices and the like. Due to its ambi-polarity the material can also be used in Organic Light Emitting Transistors (OLET).

A further aspect of the present invention is an organic semiconductor material, layer or component comprising one or more polymers of the present invention. A further aspect is the use of the polymers or materials of the present invention in an organic photovoltaic (PV) device (solar cell), a photodiode, or an organic field effect transistor (OFET). A further aspect is an organic photovoltaic (PV) device (solar cell), a photodiode, or an organic field effect transistor (OFET) comprising a polymer or material of the present invention.

The polymers of the present invention are typically used as organic semiconductors in form of thin organic layers or films, preferably less than 30 microns thick. Typically the semiconducting layer of the present invention is at most 1 micron (=1 μm) thick, although it may be thicker if required. For various electronic device applications, the thickness may also be less than about 1 micron thick. For example, for use in an OFET the layer thickness may typically be 100 nm or less. The exact thickness of the layer will depend, for example, upon the requirements of the electronic device in which the layer is used.

For example, the active semiconductor channel between the drain and source in an OFET may comprise a layer of the present invention.

An OFET device according to the present invention preferably comprises:
a source electrode,
a drain electrode,
a gate electrode,
a semiconducting layer,
one or more gate insulator layers, and
optionally a substrate, wherein the semiconductor layer comprises one or more polymers of the present invention.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

Preferably the OFET comprises an insulator having a first side and a second side, a gate electrode located on the first side of the insulator, a layer comprising a polymer of the present invention located on the second side of the insulator, and a drain electrode and a source electrode located on the polymer layer.

The OFET device can be a top gate device or a bottom gate device.

Suitable structures and manufacturing methods of an OFET device are known to the skilled in the art and are described in the literature, for example in WO03/052841.

The gate insulator layer may comprise for example a fluoropolymer, like e.g. the commercially available Cytop 809M®, or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF®, 1600 or 2400 (from DuPont), or Fluoropel® (from Cytonix) or the perfluorosolvent FC 43® (Acros, No. 12377).

The semiconducting layer comprising a polymer of the present invention may additionally comprise at least another material. The other material can be, but is not restricted to another polymer of the present invention, a semi-conducting polymer, a polymeric binder, organic small molecules different from a polymer of the present invention, carbon nanotubes, a fullerene derivative, inorganic particles (quantum dots, quantum rods, quantum tripods, $TiO_2$, ZnO etc.), conductive particles (Au, Ag etc.), and insulator materials like the ones described for the gate dielectric (PET, PS etc.). As stated above, the semiconductive layer can also be composed of a mixture of one or more polymers of the present invention and a polymeric binder. The ratio of the polymers of the present invention to the polymeric binder can vary from 5 to 95 percent. Preferably, the polymeric binder is a semicristalline polymer such as polystyrene (PS), high-density polyethylene (HDPE), polypropylene (PP) and polymethylmethacrylate (PMMA). With this technique, a degradation of the electrical performance can be avoided (cf. WO2008/001123A1).

The polymers of the present invention are advantageously used in organic photovoltaic (PV) devices (solar cells). Accordingly, the invention provides PV devices comprising a polymer according to the present invention. A device of this construction will also have rectifying properties so may also be termed a photodiode. Photoresponsive devices have application as solar cells which generate electricity from light and as photodetectors which measure or detect light.

The PV device comprise in this order:
(a) a cathode (electrode),
(b) optionally a transition layer, such as an alkali halogenide, especially lithium fluoride,
(c) a photoactive layer,
(d) optionally a smoothing layer,
(e) an anode (electrode),
(f) a substrate.

The photoactive layer comprises the polymers of the present invention. Preferably, the photoactive layer is made of a conjugated polymer of the present invention, as an electron donor and an acceptor material, like a fullerene, particularly a functionalized fullerene PCBM, as an electron acceptor. As stated above, the photoactive layer may also contain a polymeric binder. The ratio of the small molecules of formula III to the polymeric binder can vary from 5 to 95 percent. Preferably, the polymeric binder is a semicristalline polymer such as polystyrene (PS), high-density polyethylene (HDPE), polypropylene (PP) and polymethylmethacrylate (PMMA).

For heterojunction solar cells the active layer comprises preferably a mixture of a polymer of the present invention and a fullerene, such as [60]PCBM (=6,6-phenyl-$C_{61}$-butyric acid methyl ester), or [70]PCBM, in a weight ratio of 1:1 to 1:3. The fullerenes useful in this invention may have a broad range of sizes (number of carbon atoms per molecule). The term fullerene as used herein includes various cage-like molecules of pure carbon, including Buckminsterfullerene ($C_{60}$) and the related "spherical" fullerenes as well as carbon nanotubes. Fullerenes may be selected from those known in the art ranging from, for example, $C_{20}$-$C_{1000}$. Preferably, the fullerene is selected from the range of $C_{60}$ to $C_{96}$. Most preferably the fullerene is $C_{60}$ or $C_{70}$, such as [60]PCBM, or [70]PCBM. It is also permissible to utilize chemically modified fullerenes, provided that the modified fullerene retains acceptor-type and electron mobility characteristics. The acceptor material can also be a material selected from the group consisting of any semi-conducting polymer, such as, for example, a polymer of the present invention, provided that the polymers retain acceptor-type and electron mobility characteristics, organic small molecules, carbon nanotubes, inorganic particles (quantum dots, quantum rods, quantum tripods, $TiO_2$, ZnO etc.).

The photoactive layer is made of a polymer of the present invention as an electron donor and a fullerene, particularly functionalized fullerene PCBM, as an electron acceptor. These two components are mixed with a solvent and applied as a solution onto the smoothing layer by, for example, the spin-coating method, the drop casting method, the Langmuir-Blodgett ("LB") method, the ink jet printing method and the dripping method. A squeegee or printing method could also be used to coat larger surfaces with such a photoactive layer. Instead of toluene, which is typical, a dispersion agent such as chlorobenzene is preferably used as a solvent. Among these methods, the vacuum deposition method, the spin-coating method, the ink jet printing method and the casting method are particularly preferred in view of ease of operation and cost.

In the case of forming the layer by using the spin-coating method, the casting method and ink jet printing method, the coating can be carried out using a solution and/or dispersion prepared by dissolving, or dispersing the composition in a concentration of from 0.01 to 90% by weight in an appropriate organic solvent such as benzene, toluene, xylene, tetrahydrofurane, methyltetrahydrofurane, N,N-dimethylformamide, acetone, acetonitrile, anisole, dichloromethane, dimethylsulfoxide, chlorobenzene, 1,2-dichlorobenzene and mixtures thereof.

The photovoltaic (PV) device can also consist of multiple junction solar cells that are processed on top of each other in order to absorb more of the solar spectrum. Such structures are, for example, described in App. Phys. Let. 90, 143512 (2007), Adv. Funct. Mater. 16, 1897-1903 (2006) and WO2004/112161.

A so called 'tandem solar cell' comprise in this order:
(a) a cathode (electrode),
(b) optionally a transition layer, such as an alkali halogenide, especially lithium fluoride,
(c) a photoactive layer,
(d) optionally a smoothing layer,
(e) a middle electrode (such as Au, Al, ZnO, $TiO_2$ etc.)
(f) optionally an extra electrode to match the energy level,
(g) optionally a transition layer, such as an alkali halogenide, especially lithium fluoride,
(h) a photoactive layer,
(i) optionally a smoothing layer,
(j) an anode (electrode),
(k) a substrate.

The PV device can also be processed on a fiber as described, for example, in US20070079867 and US 20060013549.

Due to their excellent self-organising properties the materials or films comprising the polymers of the present invention can also be used alone or together with other materials in or as alignment layers in LCD or OLED devices, as described for example in US2003/0021913.

The following examples are included for illustrative purposes only and do not limit the scope of the claims. Unless otherwise stated, all parts and percentages are by weight.

Weight-average molecular weight (Mw) and polydispersity (Mw/Mn=PD) are determined by Heat Temperature Gel Permeation Chromatography (HT-GPC) [Apparatus: GPC PL 220 from Polymer laboratories (Church Stretton, UK; now Varian) yielding the responses from refractive index (RI), Chromatographic conditions: Column: 3 "PLgel Olexis" column from Polymer Laboratories (Church Stretton, UK); with an average particle size of 13 μm (dimensions 300×8 mm I.D.) Mobile phase: 1,2,4-trichlorobenzene purified by vacuum distillation and stabilised by butylhydroxytoluene (BHT, 200 mg/l), Chromatographic temperature: 150° C.; Mobile phase flow: 1 ml/min; Solute concentration: about 1 mg/ml; Injection volume: 200 μl; Detection: RI, Procedure of molecular weight calibration: Relative calibration is done by use of a set of 10 polystyrene calibration standards obtained from Polymer Laboratories (Church Stretton, UK) spanning the molecular weight range from 1,930,000 Da-5,050 Da, i. e., PS 1,930,000, PS 1,460,000, PS 1,075,000, PS 560,000, PS 330,000, PS 96,000, PS 52,000, PS 30,300, PS 10,100, PS 5,050 Da. A polynomic calibration is used to calculate the molecular weight.

All polymer structures given in the examples below are idealized representations of the polymer products obtained via the polymerization procedures described. If more than two components are copolymerized with each other sequences in the polymers can be either alternating or random depending on the polymerisation conditions.

EXAMPLES

Example 1

Preparation of Random Copolymer 7

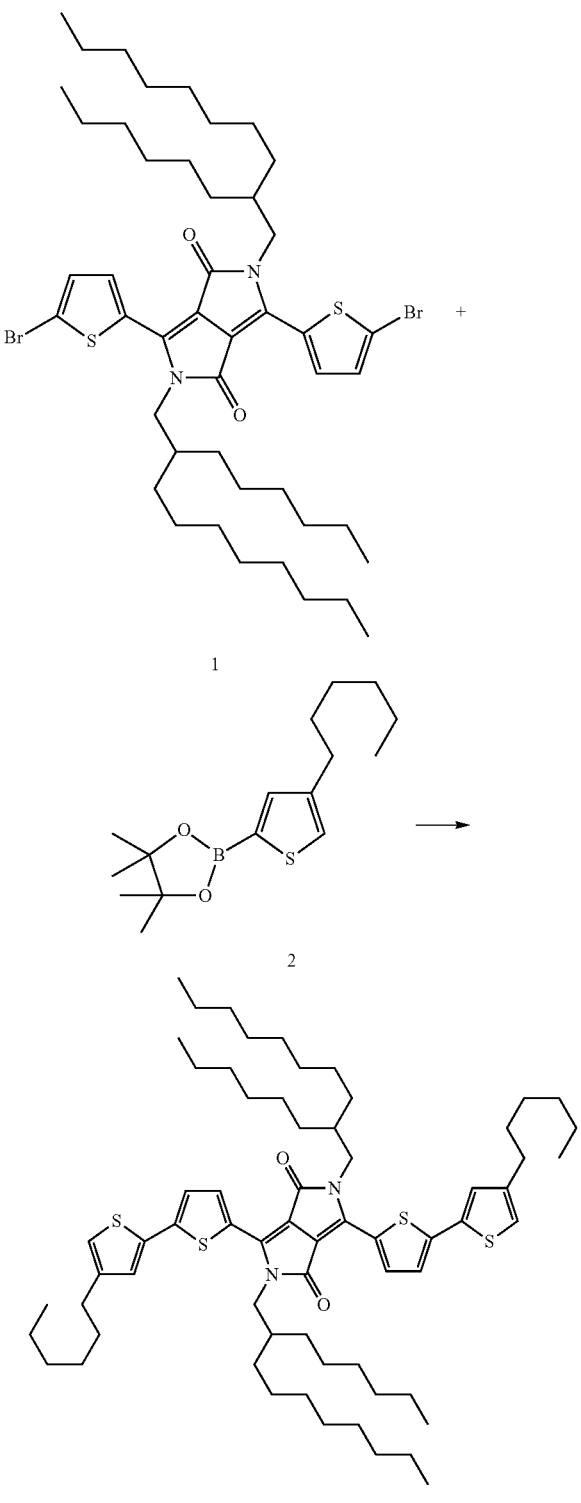

In a three neck-flask, 11.7 g of potassium phosphate (K$_3$PO$_4$) dissolved in 10 ml of water (previously degassed) are added to a degassed solution of 10.0 g of 1, 7.1 g 4-hexyl-2-thienylboronic acid pinacol ester 2, 0.2 g of tri-tert-butylphosphonium tetrafluoroborate ((t-Bu)$_3$P*HBF$_4$) and 0.1 g of tris(dibenzylideneacetone)dipalladium(0) (Pd$_2$(dba)$_3$) in 100 ml of tetrahydrofuran. The reaction mixture is heated to reflux temperature for three hours, diluted with water and then extracted with chloroform. The organic phase is dried and evaporated. The residue is purified over silica gel and 7.5 g of the desired product 3 is obtained as violet/blue solid.

$^1$H-NMR data (ppm, CDCl$_3$): 8.88 2H d, 7.27 2H d, 7.15 2H s, 6.92 2H s, 4.04 4H d, 2.60 4H t, 1.97 2H m, 1.7-1.20 64H m, 1.0-0.8 18H m.

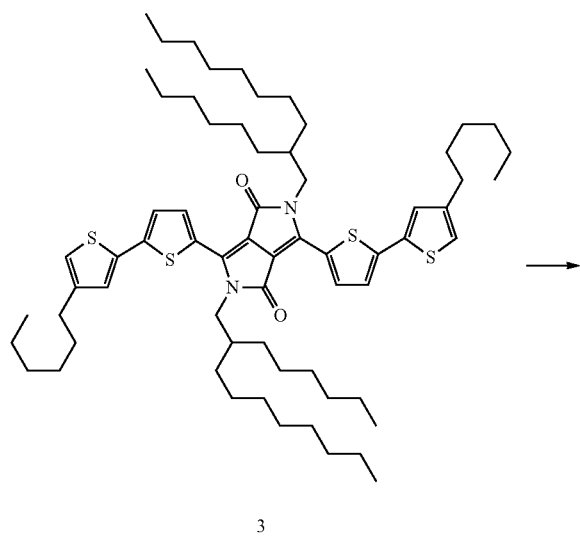

3

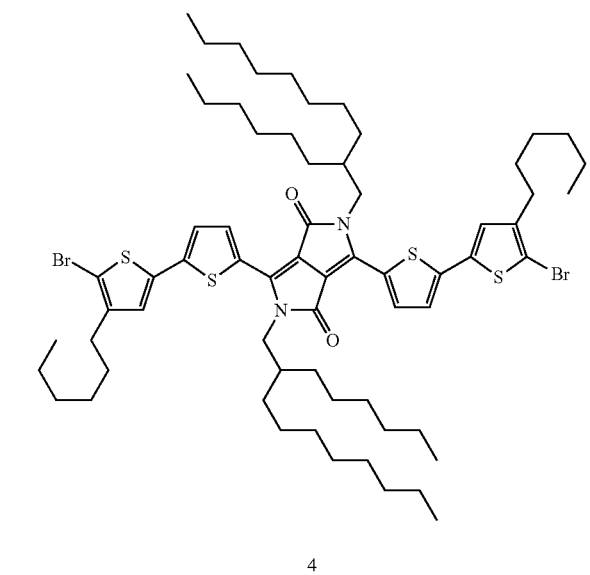

4 b) The bromination of 3, which results in 4, is done in analogy to example 2c of WO2008000664. $^1$H-NMR data (ppm, CDCl$_3$): 8.83 2H d, 7.20 2H d, 7.00 2H s, 4.00 4H d, 2.56 4H t, 1.93 2H m, 1.7-1.20 64H m, 1.0-0.8 18H m.

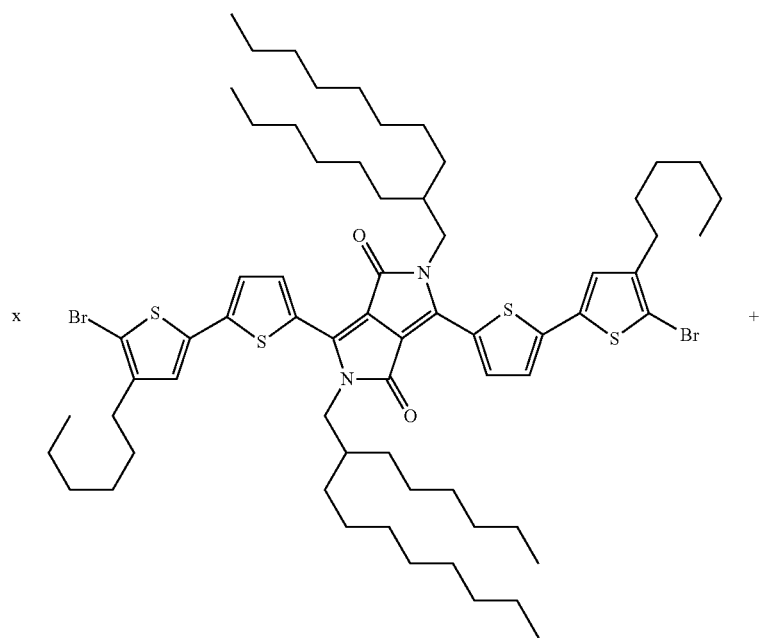

4

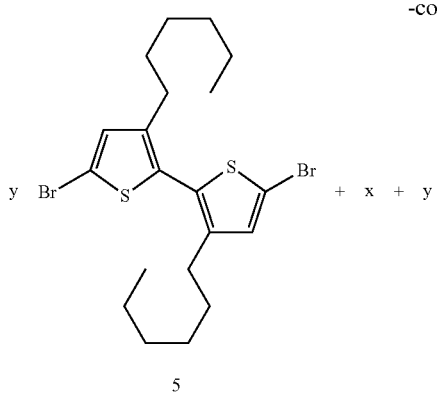 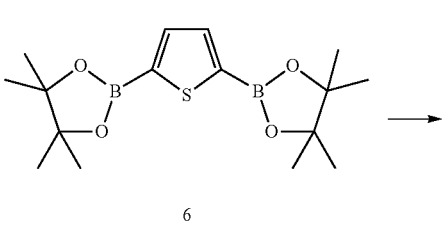

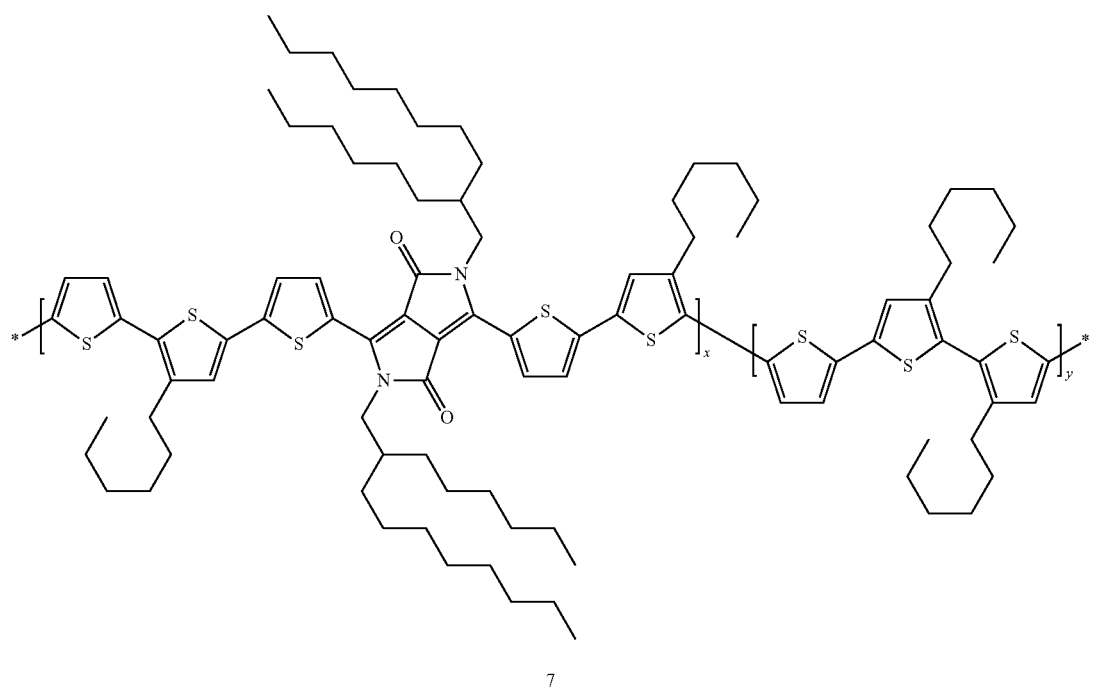

c) In a three neck-flask, 1.28 g of potassium phosphate ($K_3PO_4$) dissolved in 5 ml of water (previously degassed) are added to a degassed solution of 2.0 g of 4 (0.8 Eq), 0.17 g of 5,5'-dibromo-3,3'-dihexyl-[2,2']bithiophenyl (5, 0.2 Eq), 0.68 g of 2,5-thiopheneboronic acid bis(pinacol) ester (6, 1.0 Eq), 30 mg of tri-tert-butylphosphonium tetrafluoroborate (($t$-Bu)$_3$P*HBF$_4$) and 46 mg of tris(dibenzylideneacetone) dipalladium (0) (Pd$_2$(dba)$_3$) in 20 ml of tetrahydrofuran. The reaction mixture is heated to reflux temperature for two hours. Subsequently, 16 mg bromo-thiophene and 20 minutes later 21 mg thiophene-boronic acid pinacol ester is added to stop the polymerisation reaction. The reaction mixture is cooled to room temperature and precipitated in methanol. The residue is purified by soxhlet extraction using pentane, cyclohexan and tetrahydrofuran, the polymer is then extracted with chloroform to give 1.1 g of a dark powder of polymer 7. Mw= 40,000 Polydispersity (PD)=1.7 (measured by HT-GPC).

Example 2-14

Preparation of Random Copolymers 8-20

Polymers 8-20 (Example 2-14) shown in table 1 below are prepared in analogy to Example 1, varying the R-groups and/or the ratio of the two dibromides used in the synthesis. All starting materials are prepared according to, or in analogy to example 1 and WO2008000664.

TABLE 1

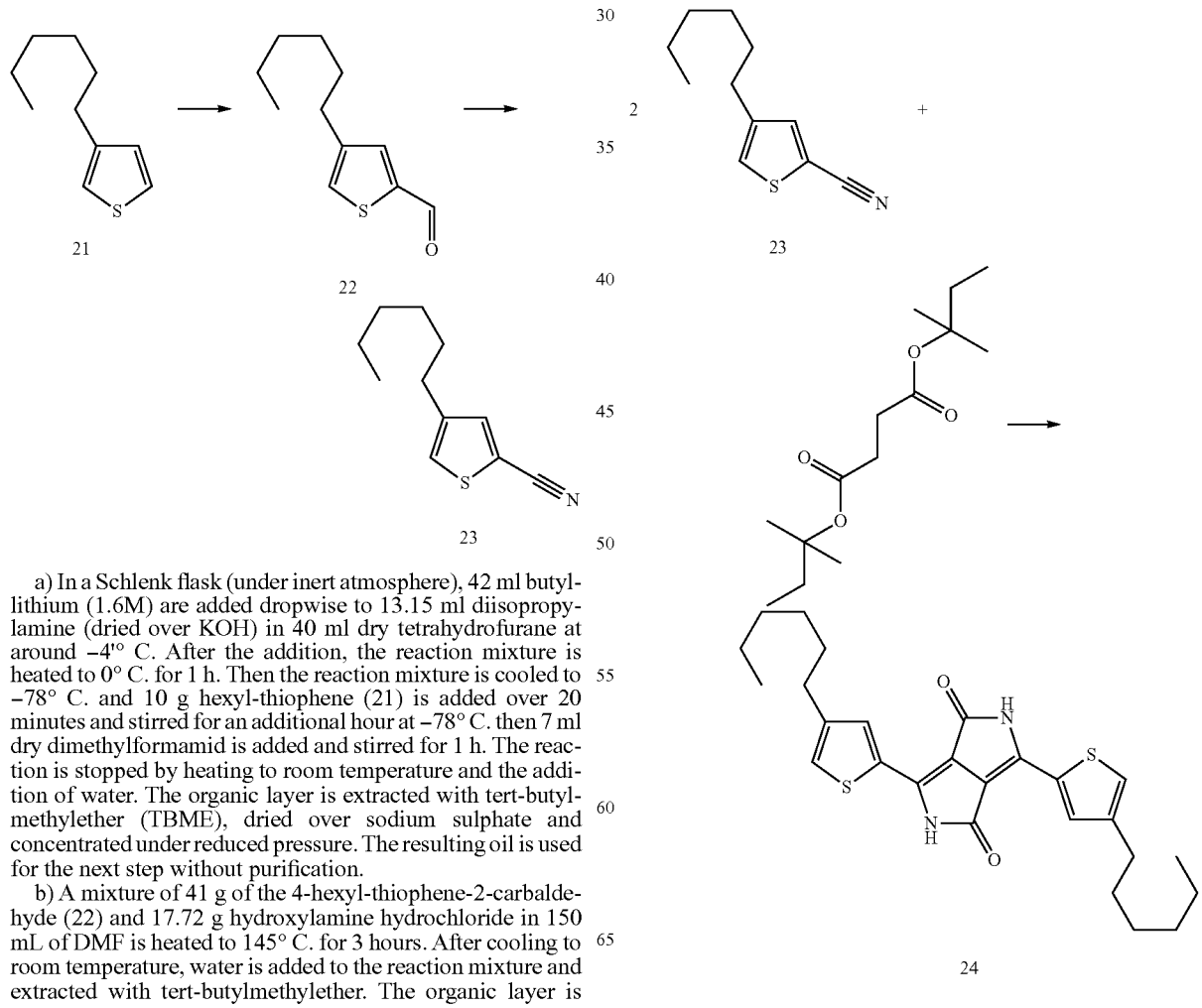

| Example | Polymer | R¹ | R³ | R¹⁵ | Ratio x:y | Mw | PD |
|---|---|---|---|---|---|---|---|
| 1 | 7 | 2-hexyl-decyl | hexyl | hexyl | 0.80:0.20 | 40'000 | 1.7 |
| 2 | 8 | 2-hexyl-decyl | hexyl | hexyl | 0.95:0.05 | 57'000 | 1.8 |
| 3 | 9 | 2-hexyl-decyl | hexyl | hexyl | 0.90:0.10 | 47'400 | 1.7 |
| 4 | 10 | 2-hexyl-decyl | hexyl | hexyl | 0.70:0.30 | 43'600 | 1.6 |
| 5 | 11 | 2-hexyl-decyl | hexyl | hexyl | 0.60:0.40 | 32'900 | 1.9 |
| 6 | 12 | 2-hexyl-decyl | hexyl | hexyl | 0.50:0.50 | 33'800 | 1.8 |
| 7 | 13 | 2-hexyl-decyl | hexyl | hexyl | 0.40:0.60 | 66'600 | 2.2 |
| 8 | 14 | 2-hexyl-decyl | hexyl | hexyl | 0.20:0.80 | 240'000 | 4.4 |
| 9 | 15 | 2-hexyl-decyl | dodecyl | dodecyl | 0.80:0.20 | 25'000 | 1.8 |
| 10 | 16 | 2-decyl-tetradecyl | hexyl | hexyl | 0.80:0.20 | 39'700 | 2.3 |
| 11 | 17 | 2-decyl-tetradecyl | butyl | hexyl | 0.80:0.20 | 55'200 | 2.1 |
| 12 | 18 | 2-decyl-tetradecyl | methyl | hexyl | 0.80:0.20 | 19'800 | 1.9 |
| 13 | 19 | 2-hexyl-decyl | hexyl | dodecyl | 0.80:0.20 | 35'000 | 1.8 |
| 14 | 20 | 2-hexyl-decyl | hexyl | dodecyl | 0.60:0.40 | 30'000 | 1.9 |

Example 15

Preparation of Random Copolymer 28 a) In a Schlenk flask (under inert atmosphere), 42 ml butyl-lithium (1.6M) are added dropwise to 13.15 ml diisopropylamine (dried over KOH) in 40 ml dry tetrahydrofurane at around −4'° C. After the addition, the reaction mixture is heated to 0° C. for 1 h. Then the reaction mixture is cooled to −78° C. and 10 g hexyl-thiophene (21) is added over 20 minutes and stirred for an additional hour at −78° C. then 7 ml dry dimethylformamid is added and stirred for 1 h. The reaction is stopped by heating to room temperature and the addition of water. The organic layer is extracted with tert-butyl-methylether (TBME), dried over sodium sulphate and concentrated under reduced pressure. The resulting oil is used for the next step without purification.

b) A mixture of 41 g of the 4-hexyl-thiophene-2-carbaldehyde (22) and 17.72 g hydroxylamine hydrochloride in 150 mL of DMF is heated to 145° C. for 3 hours. After cooling to room temperature, water is added to the reaction mixture and extracted with tert-butylmethylether. The organic layer is washed with water, dried and concentrated. The crude product is purified by vacuum distillation affording 19.12 g of the desired nitrile 23.

c) 21 g of the nitrile 23 are reacted with freshly prepared sodium t-amylate (200 ml t-amylalcohol, 6.3 g sodium and 10 mg $FeCl_3$) and 19.6 g di-tert-amylsuccinate at reflux. Precipitation of the crude DPP from NMP/MeOH affords 15.5 g of the desired compound 24.

and precipitated into DMSO yielding in the desired product (25).

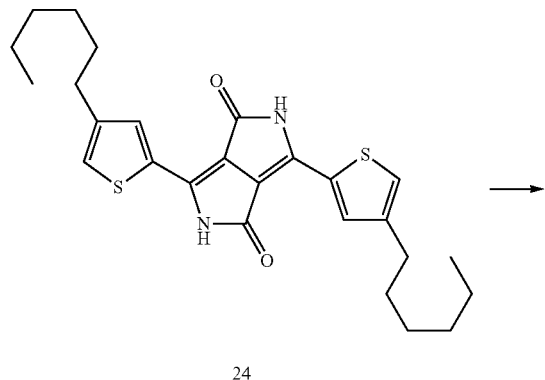

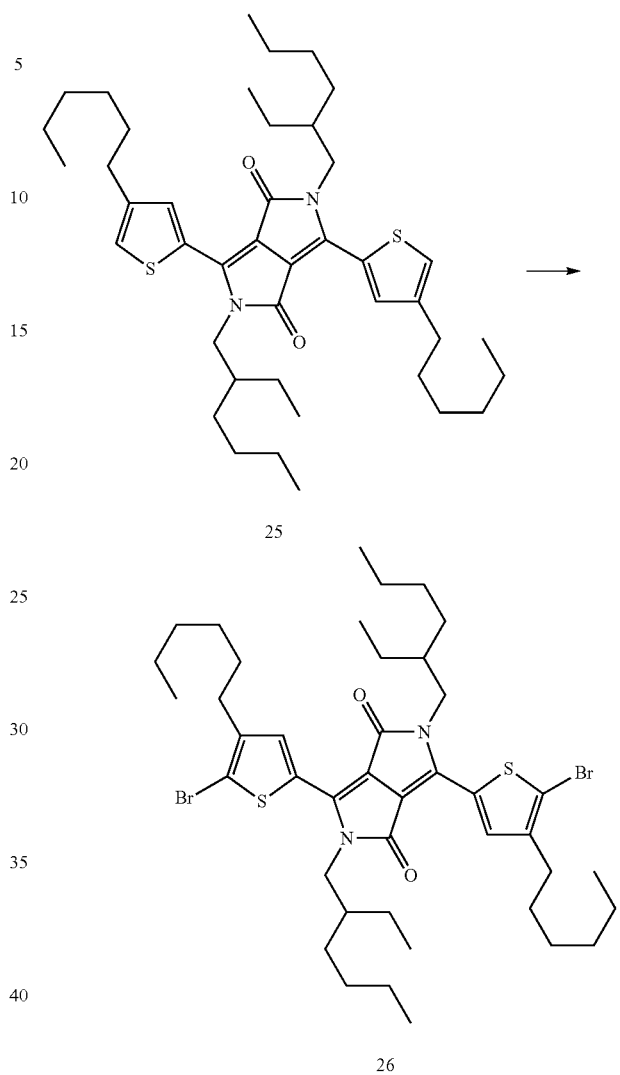

d) A solution of 4.69 g of DPP 24, 5.53 g g of potassium carbonate and 9.6 g 1-iodo-2-ethyl-hexyl in 100 ml of diemthylformamide is heated to 120° C. overnight. The mixture is cooled to room temperature and filtered. The presscake is washed with methanol, then dissolved in dichloromethane e) The bromination of 25, which results in 26, is done in analogy to example 2c of WO2008000664.

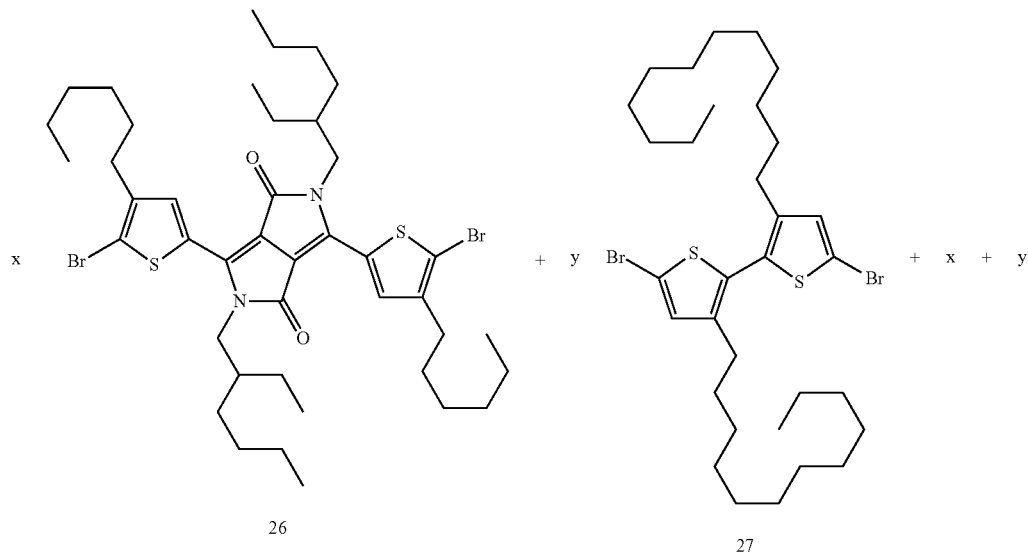

-continued

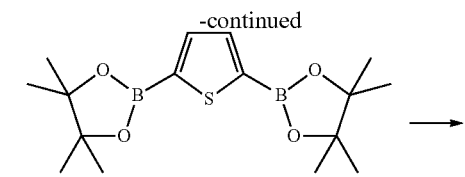
6

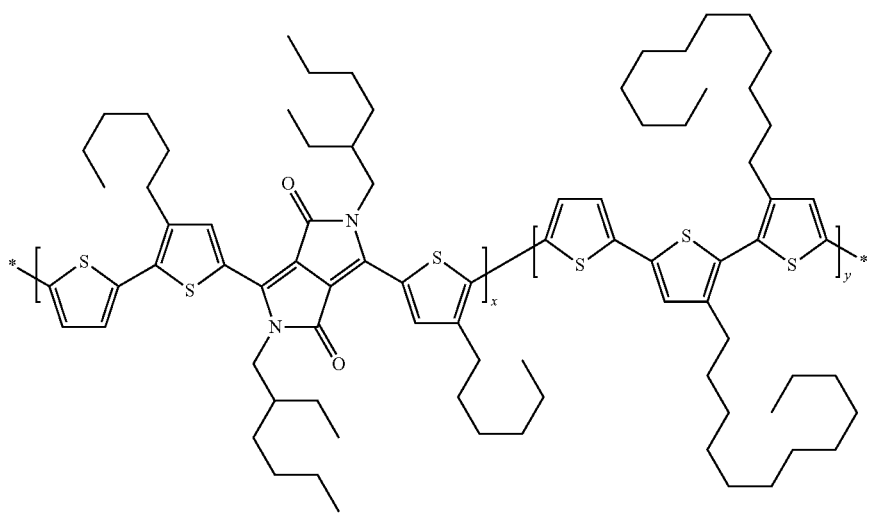
28 f) In a three neck-flask, 0.35 g of potassium phosphate (K$_3$PO$_4$) dissolved in 5 ml of water (previously degassed) are added to a degassed solution of 0.5 g of 26 (0.5 Eq), 0.37 g of 5,5'-dibromo-3,3'-didodecyll-[2,2']bithiophenyl (27, 0.5 Eq), 0.39 g of 2,5-thiopheneboronic acid bis(pinacol)ester (6, 1.0 Eq), 8 mg of tri-tert-butylphosphonium tetrafluoroborate ((t-Bu)$_3$P*HBF$_4$;) and 12 mg of tris(dibenzylideneacetone)dipalladium(0) (Pd$_2$(dba)$_3$) in 25 ml of tetrahydrofuran. The reaction mixture is heated to reflux temperature over night. Subsequently, 9 mg bromo-thiophene and 20 minutes later 12 mg thiophene-boronic acid pinacol ester is added to stop the polymerisation reaction. The reaction mixture is cooled to room temperature and precipitated in methanol. The residue is purified by soxhlet extraction using pentane and cyclohexane and the polymer 28 is then extracted with chloroform to give 0.46 g of a dark powder. Mw=54,000 Polydispersity=3.2 (measured by HT-GPC).

Example 16

Preparation of Random Copolymer 29

Polymer 29 (Example 16) shown in table 2 below is prepared in analogy to Example 15, varying the R-groups and/or the ratio of the two dibromides used in the synthesis.

Table 2

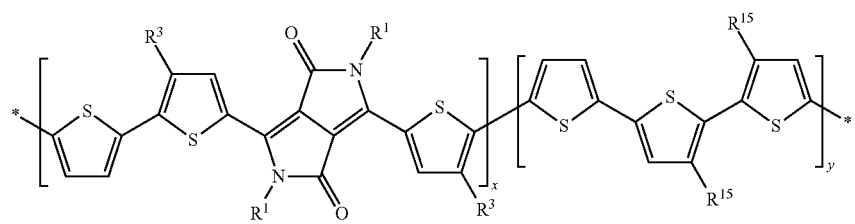

| Example | Polymer | R$^1$ | R$^3$ | R$^{15}$ | Ratio x:y | Mw | PD |
|---|---|---|---|---|---|---|---|
| 15 | 28 | 2-ethyl-hexyl | hexyl | dodecyl | 0.5:0.5 | 54'000 | 3.2 |
| 16 | 29 | 2-hexyl-decyl | H | hexyl | 0.5:0.5 | 128'000 | 3.1 |

Example 17
Preparation of Random Copolymer 30
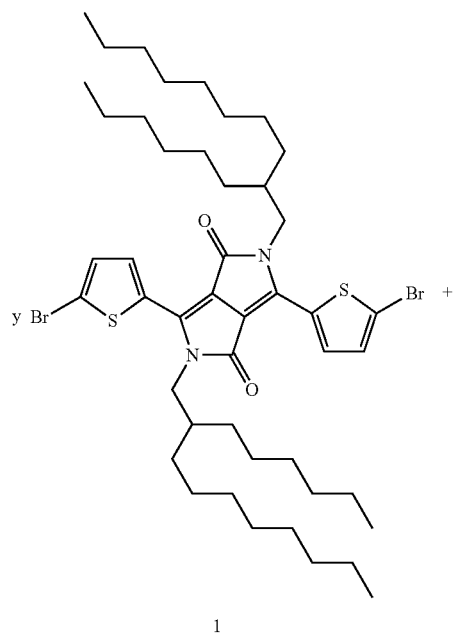
1
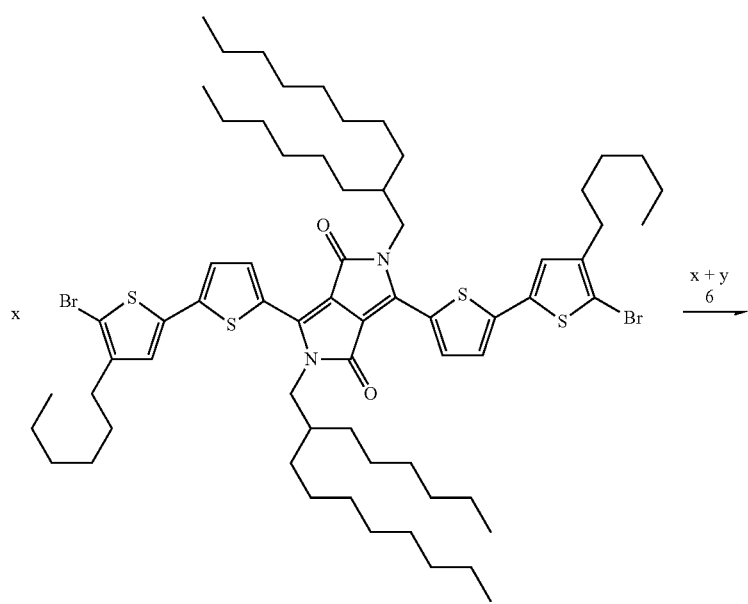
4

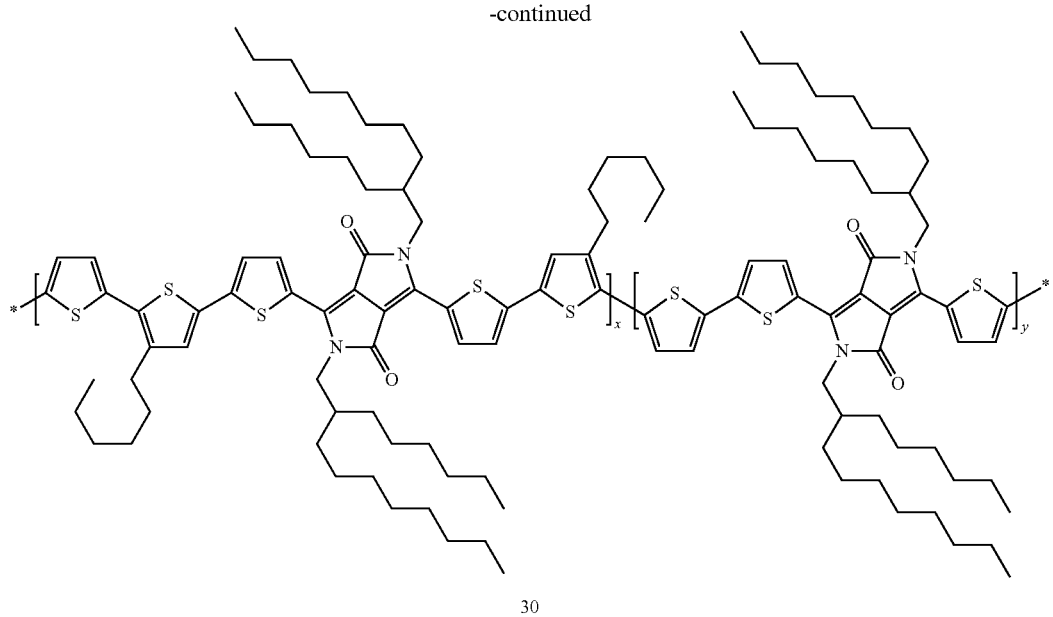

30 x = y = 0.5

In a three neck-flask, 0.72 g of potassium phosphate ($K_3PO_4$) dissolved in 4 ml of water (previously degassed) are added to a degassed solution of 0.7 g of 4 (0.5 Eq), 0.51 g of 1 (0.5 Eq), 0.38 g of 2,5-thiopheneboronic acid bis(pinacol) ester (6, 1.0 Eq), 16 mg of tri-tert-butylphosphonium tetrafluoroborate (($t$-Bu)$_3$P*HBF$_4$) and 25 mg of tris(dibenzylideneacetone)dipalladium(0) (Pd$_2$(dba)$_3$) in 35 ml of tetrahydrofuran. The reaction mixture is heated to reflux temperature overnight. Subsequently, 9 mg bromo-thiophene and 20 minutes later 12 mg thiophene-boronic acid pinacol ester is added to stop the polymerisation reaction. The reaction mixture is cooled to room temperature and precipitated in methanol. The residue is purified by soxhlet extraction using pentane and cyclohexane, the polymer 30 is then extracted with chloroform to give 0.92 g of a dark powder. Mw=36,000 Polydispersity=2.2 (measured by HT-GPC).

Example 18-19

Preparation of Random Copolymers 31 and 32

Polymers 31 and 32 (Example 16 and 17) shown in table 3 below are prepared in analogy to Example 15, varying the R-groups and/or the ratio of the two dibromides used in the synthesis.

TABLE 3

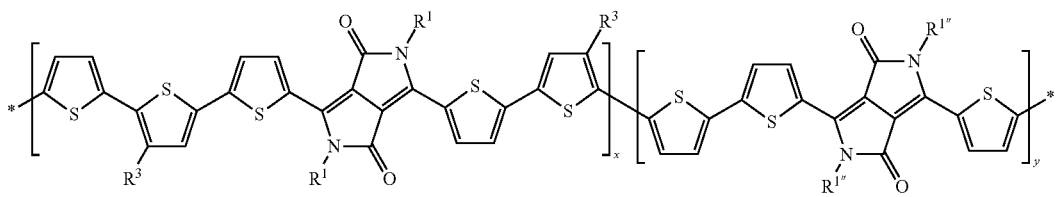

| Example | Polymer | $R^1 = R^{1''}$ | $R^3$ | Ratio x:y | Mw | PD |
|---|---|---|---|---|---|---|
| 17 | 30 | 2-hexyl-decyl | hexyl | 0.5:0.5 | 36'000 | 2.2 |
| 18 | 31 | 2-hexyl-decyl | dodecyl | 0.5:0.5 | 38'500 | 2.3 |
| 19 | 32 | 2-decyl-tetradecyl | hexyl | 0.5:0.5 | 103'500 | 2.6 |

Example 20

Preparation of Random Copolymer 35

Starting materials 33 and 34 are prepared in analogy to example 1 and example 24.

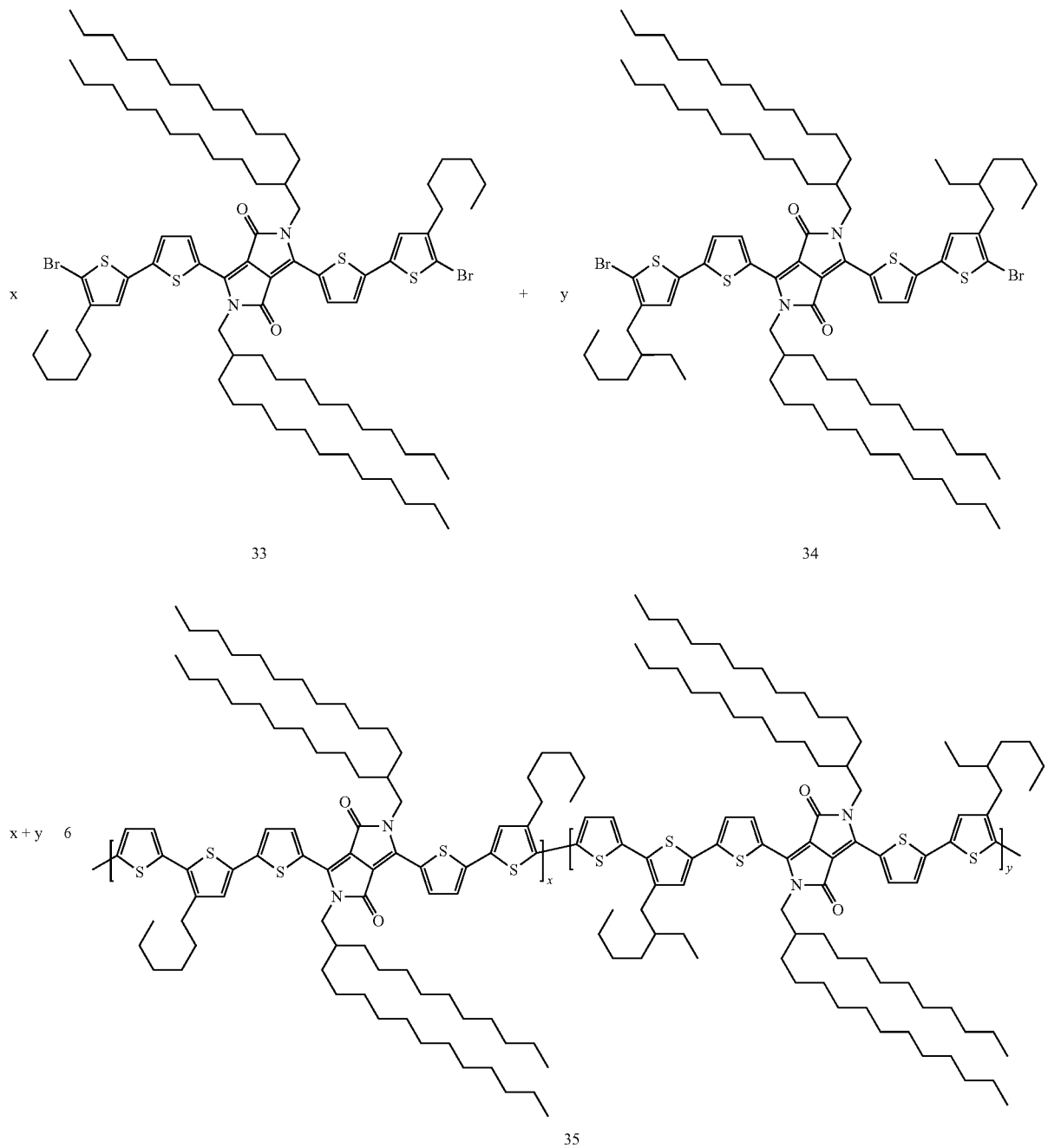

In a three neck-flask, 0.26 g of potassium phosphate ($K_3PO_4$) dissolved in 5 ml of water (previously degassed) are added to a degassed solution of 0.75 g of 33 (0.95 Eq), 39.0 mg of 34 (0.05 Eq.), 0.19 g 2,5-thiopheneboronic acid bis (pinacol) ester (6, 1.05 Eq), 7 mg of tri-tert-butylphosphonium tetrafluoroborate (($t$-Bu)$_3$P*HBF$_4$) and 14 mg of tris (dibenzylideneacetone)dipalladium(0) (Pd$_2$(dba)$_3$) in 25 ml of tetrahydrofuran. The reaction mixture is heated to reflux temperature for two hours. Subsequently, 10 mg bromothiophene and 20 minutes later 16 mg thiophene-boronic acid pinacol ester are added to stop the polymerisation reaction. The reaction mixture is cooled to room temperature and precipitated in methanol. The residue is purified by soxhlet extraction using pentane and the polymer 35 is then extracted with cyclohexane to give 0.66 g of a dark powder. Mw= 38,600 Polydispersity=2.1 (measured by HT-GPC).

Example 21

Preparation of Random Copolymer 36

Polymer 36 (Example 21) shown in table 4 below is prepared in analogy to Example 20, varying the R-groups and/or the ratio of the two dibromides used in the synthesis.

are added to a degassed solution of 8.14 g of 5 13 g of 2-thiopheneboronic acid pinacol ester 37, 245 mg of tri-tert-butylphosphonium tetrafluoroborate ((t-Bu)$_3$P*HBF$_4$) and 383 mg of tris(dibenzylideneacetone)dipalladium(0) (Pd$_2$(dba)$_3$) in 230 ml of tetrahydrofuran. The reaction mixture is then stirred at room temperature for one hour. The reaction mixture is diluted with water and extracted with chloroforme.

TABLE 4

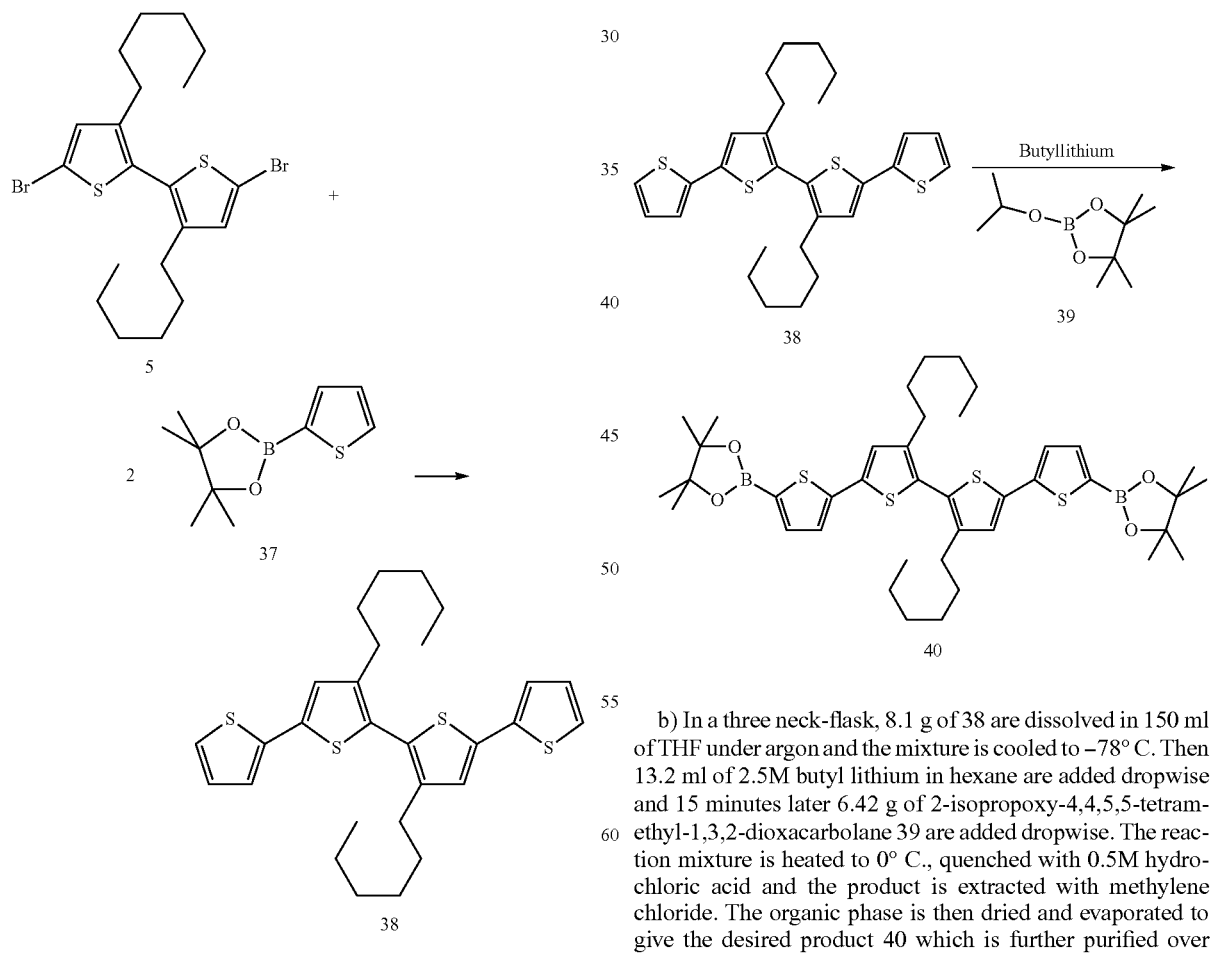

| Example | Polymer | R$^1$ | R$^3$ | R$^{1'}$ | R$^{3'}$ | Ratio x:y | Mw | PD |
|---|---|---|---|---|---|---|---|---|
| 20 | 35 | 2-decyl-tetradecyl | hexyl | 2-decyl-tetradecyl | 2-ethyl-hexyl | 0.95:0.05 | 38'600 | 2.1 |
| 21 | 36 | 2-hexyl-decyl | hexyl | 2-decyl-tetradecyl | hexyl | 0.50:0.50 | 17'100 | 1.9 |

Example 22

Preparation of Copolymer 41

The organic phase is then dried and evaporated to give the desired product 38 which is further purified over silica gel. Yield is 8.1 g. $^1$H-NMR data (ppm, CDCl$_3$): 7.23 2H d, 7.18 2H d, 7.07 2H s, 7.02 2H d×d, 2.55 4H t, 1.59 4H t×t, 1.31-1.28 12H m, 0.88 6H t.

a) In a three neck-flask, 10.53 g of potassium phosphate (K$_3$PO$_4$) dissolved in 30 ml of water (previously degassed)

b) In a three neck-flask, 8.1 g of 38 are dissolved in 150 ml of THF under argon and the mixture is cooled to −78° C. Then 13.2 ml of 2.5M butyl lithium in hexane are added dropwise and 15 minutes later 6.42 g of 2-isopropoxy-4,4,5,5-tetramethyl-1,3,2-dioxacarbolane 39 are added dropwise. The reaction mixture is heated to 0° C., quenched with 0.5M hydrochloric acid and the product is extracted with methylene chloride. The organic phase is then dried and evaporated to give the desired product 40 which is further purified over silica gel. Yield is 9.4 g. $^1$H-NMR data (ppm, CDCl$_3$): 7.53 2H d, 7.24 2H d, 7.12 2H s, 2.54 4H t, 1.59 4H t×t, 1.37 24H s, 1.30-1.27 12H m, 0.87 6H t.

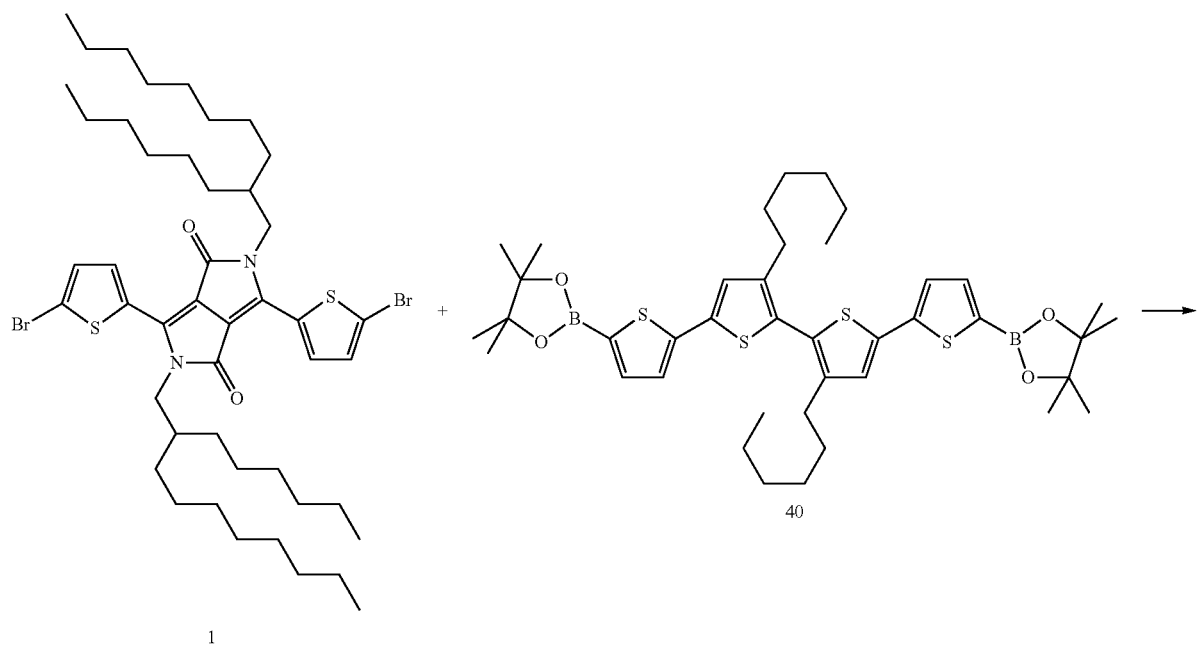

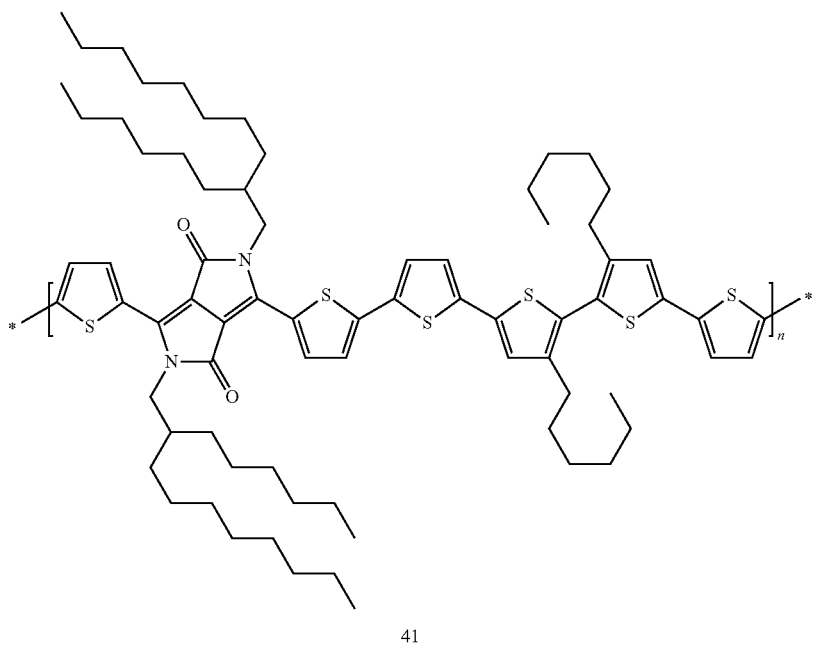

c) In a three necked-flask, 1.41 g of potassium phosphate (K$_3$PO$_4$) dissolved in 2 ml of water (previously degassed) are added to a degassed solution of 2.0 g of 1, 1.66 g of 40, 25 mg of tri-tert-butylphosphonium tetrafluoroborate ((t-Bu)$_3$P* HBF$_4$) and 51 mg of tris(dibenzylideneacetone) dipalladium (0)(Pd$_2$(dba)$_3$) in 25 ml of tetrahydrofuran. The reaction mixture is heated to reflux temperature for two hours. Subsequently, 17 mg bromo-thiophene and 20 minutes later 22 mg thiophene-boronic acid pinacol ester is added to stop the polymerisation reaction. The reaction mixture is cooled to room temperature and precipitated in methanol. After treatment with NaCN in a water-chloroforme mixture at reflux and reprecipitation, the product 41 is extracted by soxhlet extraction using THF and chloroforme. Yield of the chloroforme extract: 86 mg. Mw=28,000 Polydispersity=1.4 (measured by HT-GPC).

Example 23
Preparation of Random Copolymer 42
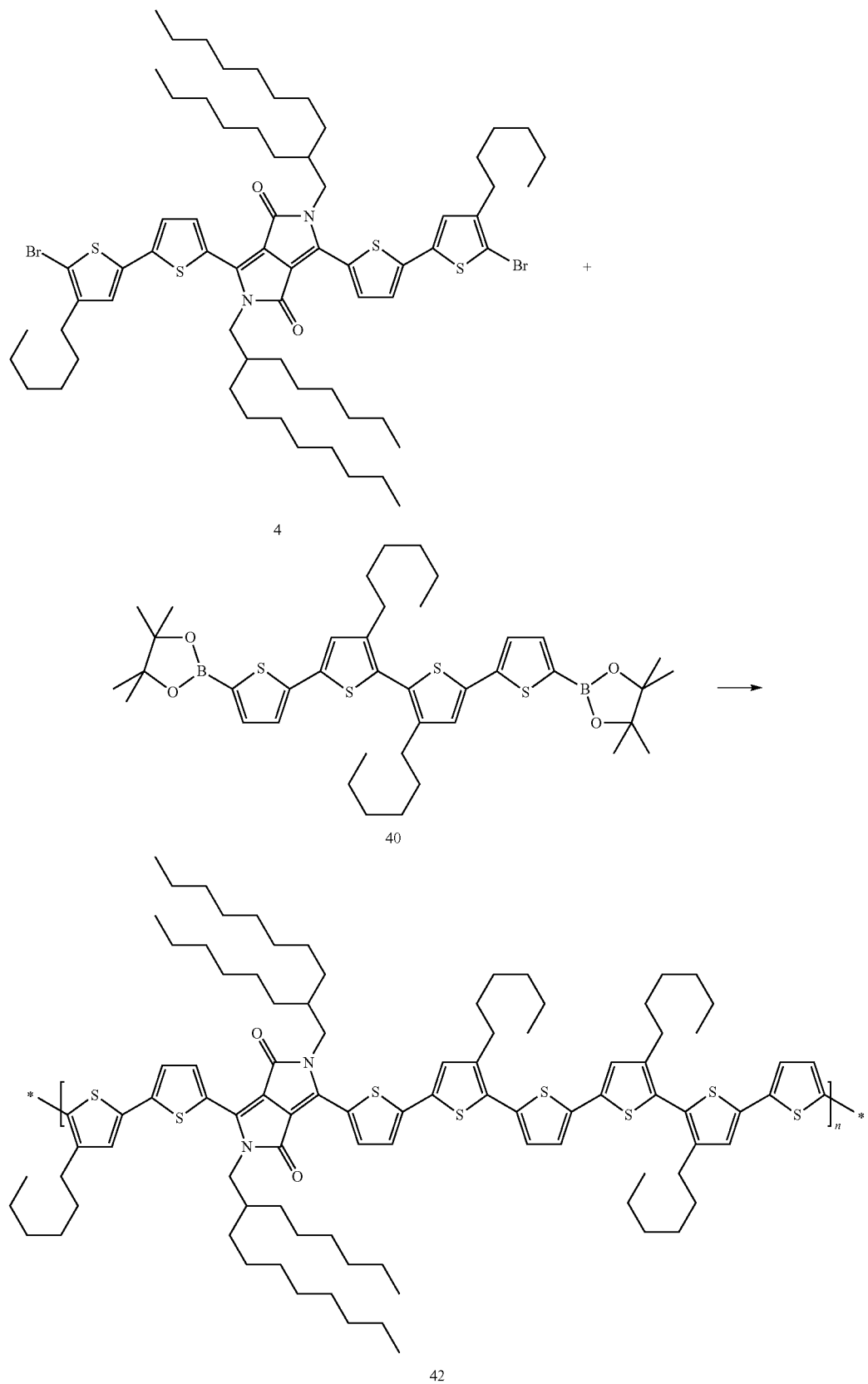

In a three neck-flask, 0.51 g of potassium phosphate ($K_3PO_4$) dissolved in 4 ml of water (previously degassed) are added to a degassed solution of 1.0 g of 4, 0.59 g of 40, 11 mg of tri-tert-butylphosphonium tetrafluoroborate (($t$-Bu)$_3$P* HBF$_4$) and 22 mg of tris(dibenzylideneacetone)dipalladium (0) (Pd$_2$(dba)$_3$) in 20 ml of tetrahydrofuran. The reaction mixture is heated to reflux temperature for two hours. Subsequently, 15 mg bromo-thiophene and 20 minutes later 19 mg thiophene-boronic acid pinacol ester are added to stop the polymerisation reaction. The reaction mixture is cooled to room temperature and precipitated in methanol. The residue is purified by soxhlet extraction using pentane, cyclohexane and tetrahydrofurane and the polymer 42 is then extracted with chloroform give 0.38 g of a dark powder. Mw=39,800 Polydispersity=1.5 (measured by HT-GPC).

Example 24

Preparation of Random-Copolymer 49

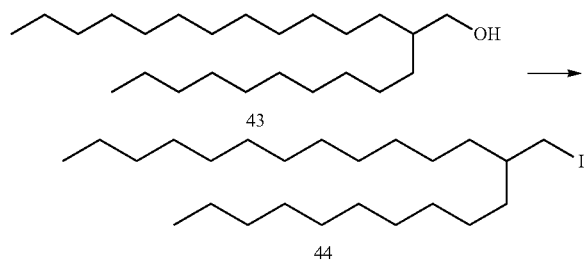

a) 228.06 g of 2-decyl-1-tetradecanol 43 are mixed with 484.51 g 47% hydroiodic acid and the mixture is refluxed overnight. The product is extracted with t-butyl-methylether. Then the organic phase is dried and concentrated. The product is purified over a silica gel column to give 211.54 g of the desired compound 44 (73%). $^1$H-NMR data (ppm, CDCl$_3$): 3.26 2H d, 1.26-1.12 41H m, 0.88 6H t.

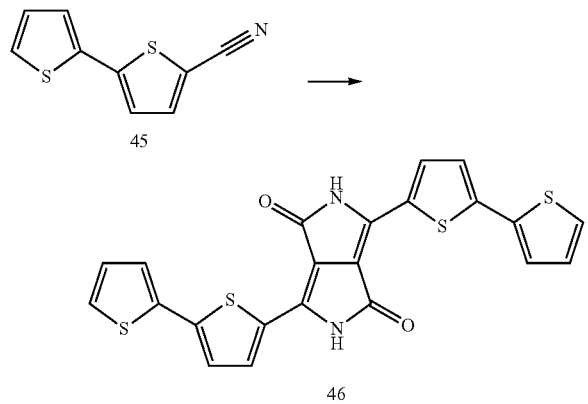

b) 30.52 g of the nitril 45 are reacted with freshly prepared sodium t-amylate (600 ml t-amylalcohol, 10.27 g sodium and 30 mg FeCl$_3$) and 24.83 g di-tert-amylsuccinate at reflux. Precipitation of the crude DPP from NMP/MeOH affords 33.6 g of the desired compound 46 (90%). MS m/z: 464.

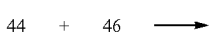

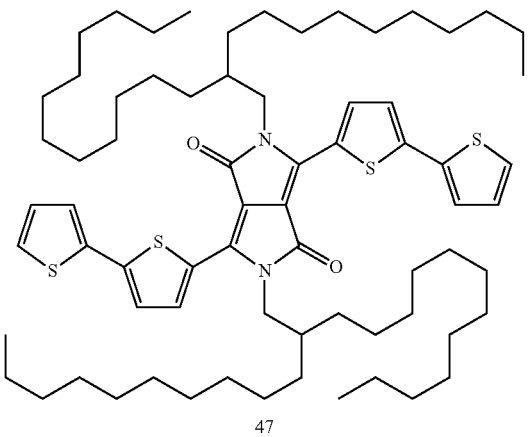

c) 33.55 g of the DPP 46 are reacted first with 1.27 g LiH in 1300 ml DMF and then 74.4 g 2-decyl-1-tetradecyl iodide 44 are added dropwise at 100° C. After 5 hours at 100° C. the reaction mixture is quenched with water and the product is extracted with methylene chloride. Then the organic phase is dried and concentrated. Purification is achieved by column chromatography over silica gel and affords 35.1 g of the desired DPP 47 (42.7%). $^1$H-NMR data (ppm, CDCl$_3$): 8.91 2H d, 7.35-7.32 6H m, 7.09 2H dxd, 4.05 4H d, 1.98 2H m, 1.35-1.20 80H m, 0.89 6H t, 0.87 6H t.

47 ⟶

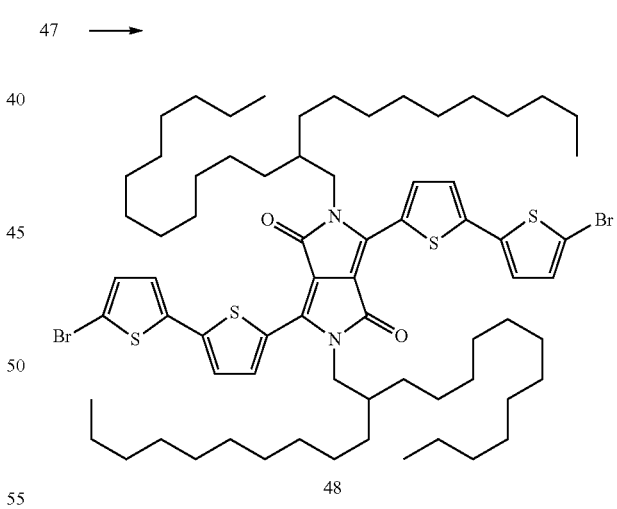

d) 10.00 g 47 are dissolved in 200 ml of chloroform, cooled down to 0° C. and 2 equivalents of N-bromosuccinimide are then added portion wise over a period of 1 h. After the reaction is completed, the mixture is washed with water. The organic phase is extracted, dried and concentrated. The compound is then purified over a silica gel column to give 5.31 g of a dark violet powder of the DPP derivative of the formula 48 (47%). $^1$H-NMR data (ppm, CDCl$_3$): 8.85 2H d, 7.22 2H d, 7.03 4H dxd, 4.00 4H d, 1.93 2H m, 1.29-1.21 80H m, 0.87 6H t, 0.85 6H t.

48 + 40 ⟶

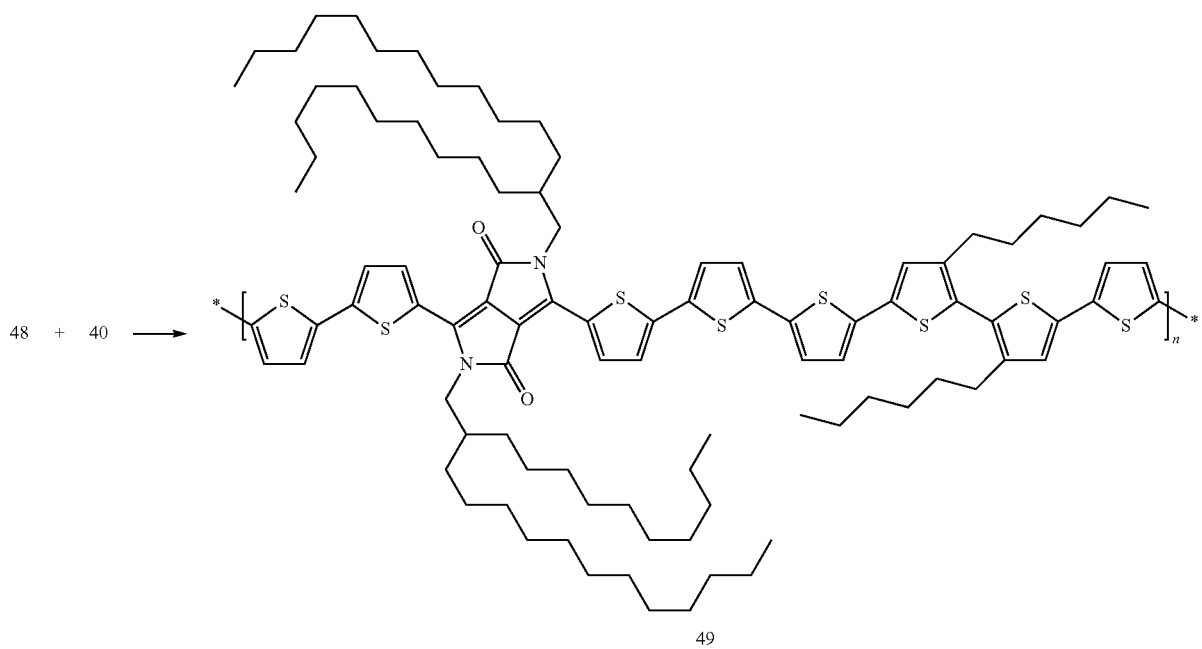

49 e) In a three neck-flask, 0.99 g of potassium phosphate (K$_3$PO$_4$) dissolved in 3 ml of water (previously degassed) are added to a degassed solution of 2.0 g of 48, 1.16 g of 40, 23 mg of tri-tert-butylphosphonium tetrafluoroborate ((t-Bu)$_3$P*HBF$_4$) and 35 mg of tris(dibenzylideneacetone)dipalladium (0) (Pd$_2$(dba)$_3$) in 35 ml of tetrahydrofuran. The reaction mixture is heated to reflux temperature for one hour. Subsequently, 4 mg bromo-thiophene and 20 minutes later 5 mg thiophene-boronic acid pinacol ester are added to stop the polymerisation reaction. The reaction mixture is cooled to room temperature and precipitated in methanol. After treatment with NaCN in a water-chloroforme mixture at reflux and reprecipitation, the polymer 49 is then soxhlet extracted with THF, then chloroforme. Evaporation of the chloroforme fraction gives 0.25 g of a dark powder. Mw=214,000 Polydispersity=2.5 (measured by HT-GPC).

Example 25

Preparation of Random-Copolymer 51

4 + 5 + 50 ⟶

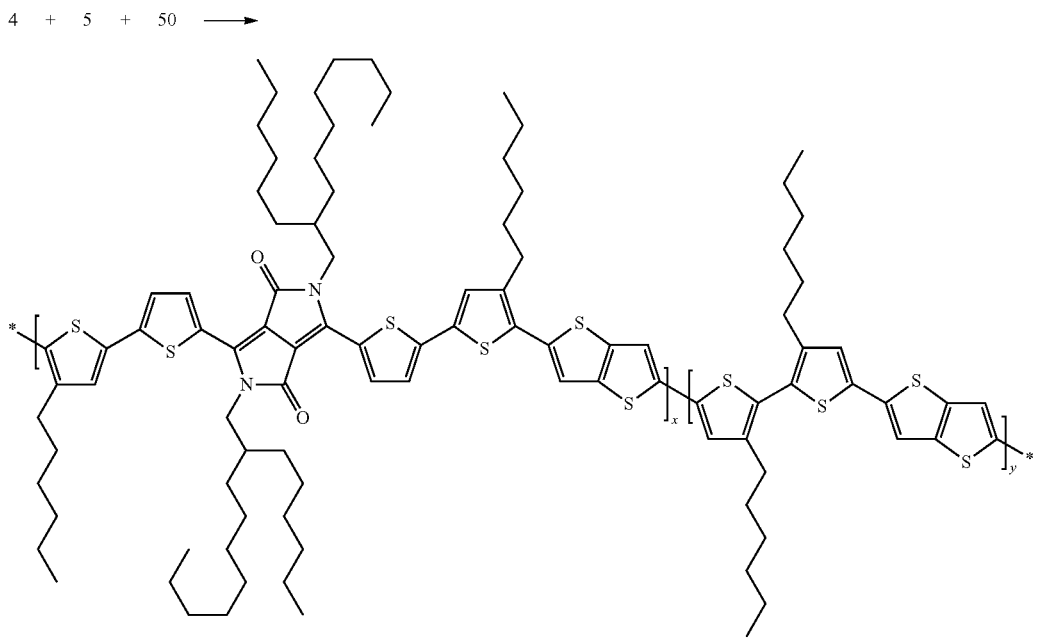

51

0.50 g of 4, 0.20 g of 5, 0.34 g of 50, 7.4 mg of tri-tert-butylphosphonium tetrafluoroborate ((t-Bu)$_3$P*HBF$_4$, 14.8 mg of tris(dibenzylideneacetone) dipalladium (0) (Pd$_2$(dba)$_3$) in 25 ml of tetrahydrofuran and 0.51 g of potassium phosphate (K$_3$PO$_4$) dissolved in 4 ml of water (previously degassed) is used. After 1 hour of reflux 15 mg bromo-thiophene and 30 minutes later 21 mg thiophene-boronic acid pinacol ester is added to stop the polymerisation reaction. The reaction mixture is cooled to room temperature and precipitated in methanol. The residue is purified by soxhlet extraction using cyclohexane and THF and the polymer 51 is then extracted with chloroform to give 0.29 g of a dark powder. Mw=54,800, Polydispersity=3.1 (measured by HT-GPC).

Example 26

Preparation of Random Copolymers 52

Polymer 52 (Example 26) shown in table 5 below is prepared in analogy to Example 25, varying the ratio of the two dibromides used in the synthesis purified with column chromatography using a gradient of hexane/ehtylacetate on silicagel. 8.0 g of 2-thiophen-2-yl-thiazole 53 is obtained, spectral data correspond to the ones described in literature using Negishi-cross coupling reaction. (J. Jensen et al., Synthesis, 2001, 1, 128).

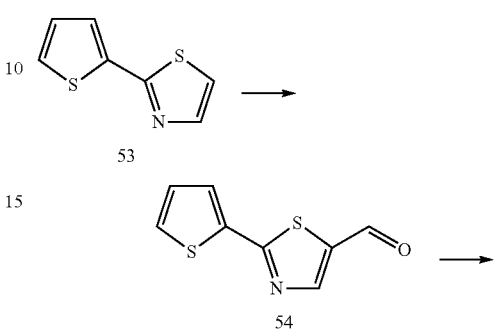

TABLE 5

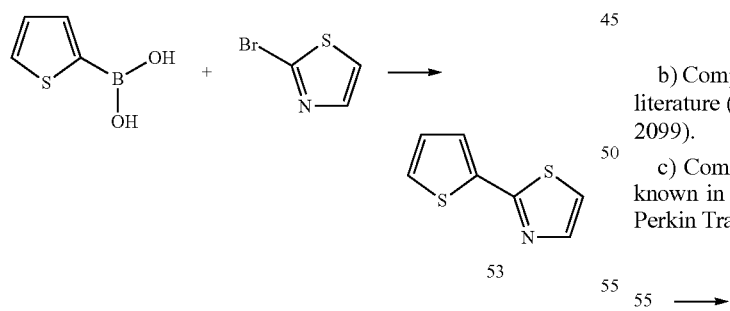

| Example | Polymer | R$^1$ | R$^3$ | R$^{15}$ | Ratio x:y | Mw | Pd |
|---|---|---|---|---|---|---|---|
| 25 | 51 | 2-hexyl-decyl | Hexyl | Hexyl | 0.50:0.50 | 54'800 | 3.1 |
| 26 | 52 | 2-hexyl-decyl | Hexyl | Hexyl | 0.80:0.20 | 34'400 | 1.7 |

Example 27

Preparation of Random Copolymer 58 a) In a three neck-flask, 83.6 g of potassium phosphate (K$_3$PO$_4$) dissolved in 110 ml of water (previously degassed) is added to a degassed solution of 20 g of thienylboronic acid, 22.0 g of 2-bromothiazole, 2.3 g of tri-tert-butylphosphonium tetrafluoroborate ((t-Bu)$_3$P*HBF$_4$) and 3.6 g of tris(dibenzylideneacetone) dipalladium (0) (Pd$_2$(dba)$_3$) in 350 ml of tetrahydrofuran. The reaction mixture is heated at reflux temperature overnight. The reaction mixture is cooled to room temperature and 100 ml water are added. The reaction mixture is extracted with ethylacetate and the organic layer is dried and evaporated under reduced pressure. It is further b) Compound 54 is obtained using the procedure known in literature (P. Chauvin et al., Bull. Soc. Chim. Fr. 1974, 9-10, 2099).

c) Compound 55 is obtained in analogy to the procedure known in literature (A. D. Borthwick et al.; J. Chem. Soc., Perkin Trans 1, 1973; 2769).

55 ⟶

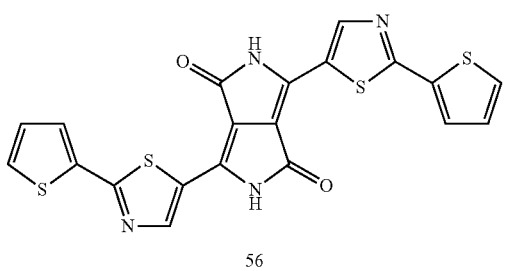

d) Compound 56 is obtained in analogy to example 24b.

e) Compound 57 is obtained in analogy to example 24c.

56 ⟶

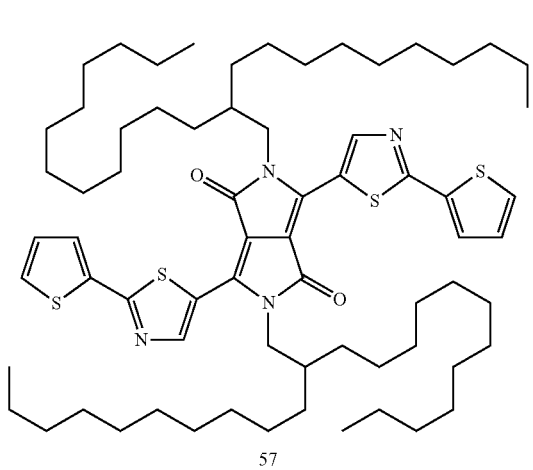

57

57 ⟶

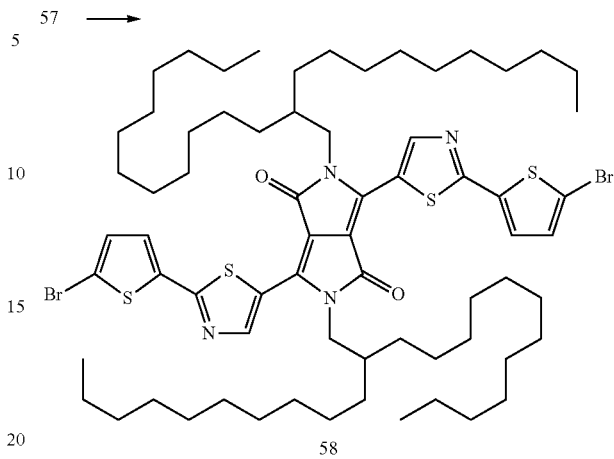

58 f) Compound 58 is obtained in analogy to example 24d.

57 + 5 + 6 ⟶

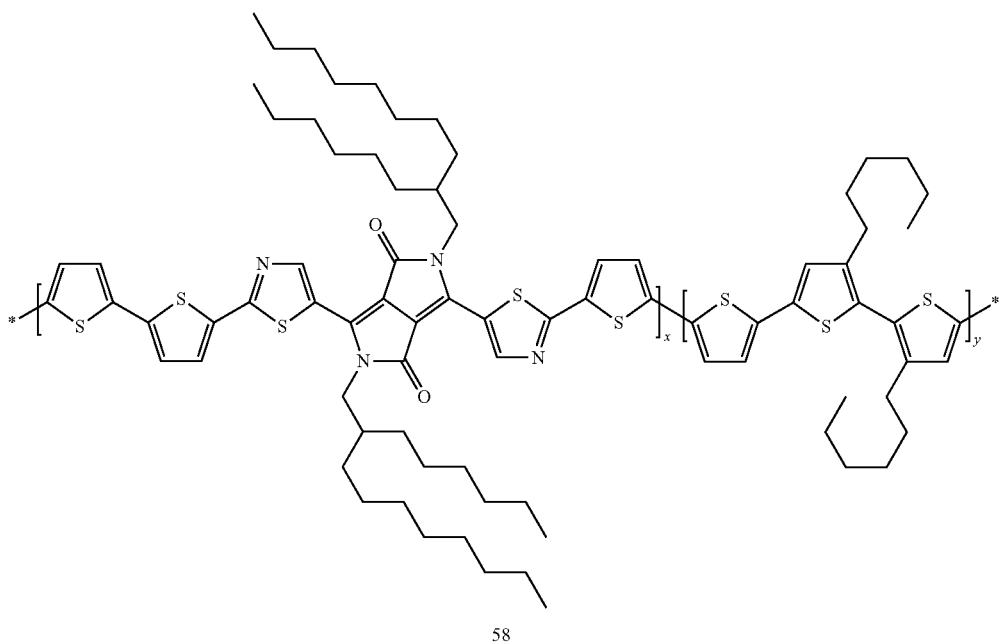

58 f) Polymer 58 is obtained in analogy to Example 1 using 0.2 equivalent of 5, 1.0 equivalent of 6 and 0.8 equivalent 57.

Example 28-32

Preparation of Random Copolymers 59-63

Polymers 59-63 (Example 28-32) shown in table 6 below are prepared in analogy to Example 1, varying the R-groups and/or the ratio of the two dibromides. All starting materials are prepared according to, or in analogy to example 27 and WO2008000664.

TABLE 6

| Example | Polymer | R¹ | R³ | R¹⁵ | Ratio x:y |
|---|---|---|---|---|---|
| 27 | 58 | 2-hexyl-decyl | H | hexyl | 0.80:0.20 |
| 28 | 59 | 2-hexyl-decyl | H | hexyl | 0.50:0.50 |
| 29 | 60 | 2-hexyl-decyl | hexyl | hexyl | 0.80:0.20 |
| 30 | 61 | 2-hexyl-decyl | hexyl | hexyl | 0.50:0.50 |
| 31 | 62 | 2-hexyl-decyl | dodecyl | dodecyl | 0.80:0.20 |
| 32 | 63 | 2-hexyl-decyl | dodecyl | dodecyl | 0.50:0.50 |

Example 33

Preparation of Random Copolymer 67

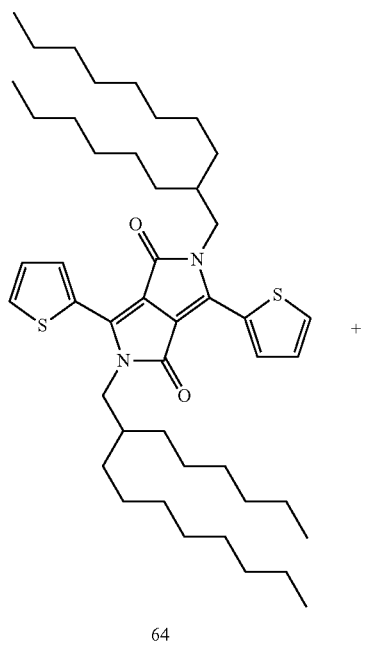

64

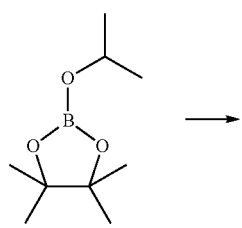

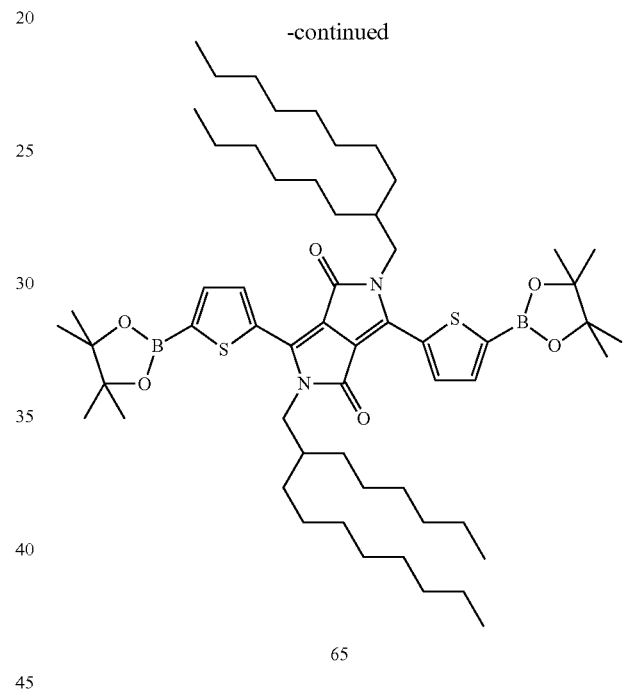

65 a) Starting material 64 for boronic ester 65 is prepared according to Example 2a of WO2008000664. To a solution of 5.0 g Dithienyl-DPP (64) and 3.73 g 2-Isopropoxy-4,4,5,5-tetramethyl-1,3,2-dioxoborolane in 30 ml THF under nitrogen at −25° C. is added drop-wise a freshly prepared LDA solution (from 5.4 ml butyllithium 2.7 M and 2.2 ml diisopropylamin in 20 ml THF,) over 15 minutes. The resulting reaction mixture is stirred for 1 hour at 0° C. and then quenched with 100 ml 1 M HCl. The product is extracted with 2×50 ml TBME and the combined organic layers are washed twice with brine and dried with sodium sulfate. After evaporation of the solvent the residue is dissolved in 20 ml methylenchloride and then slowly added to 200 ml of heavily stirred acetone. The precipitate is collected by filtration, washed several times with acetone and dried at 40° C. in a vacuum-oven, affording 6.3 g of pinkish-violet powder. ¹H-NMR (ppm, CDCl₃): 8.90 2H, d, ³J=3.9 Hz; 7.71 2H, d, ³J=3.9 Hz; 4.05 4H d, ³J=7.7 Hz; 1.84 2H m; 1.37 24H m; 1.35-1.2 48, m; 0.9-0.8 12H m.

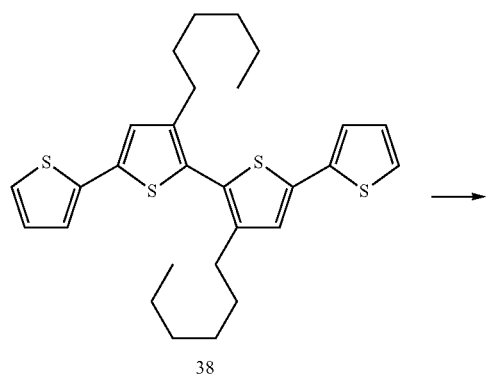
38
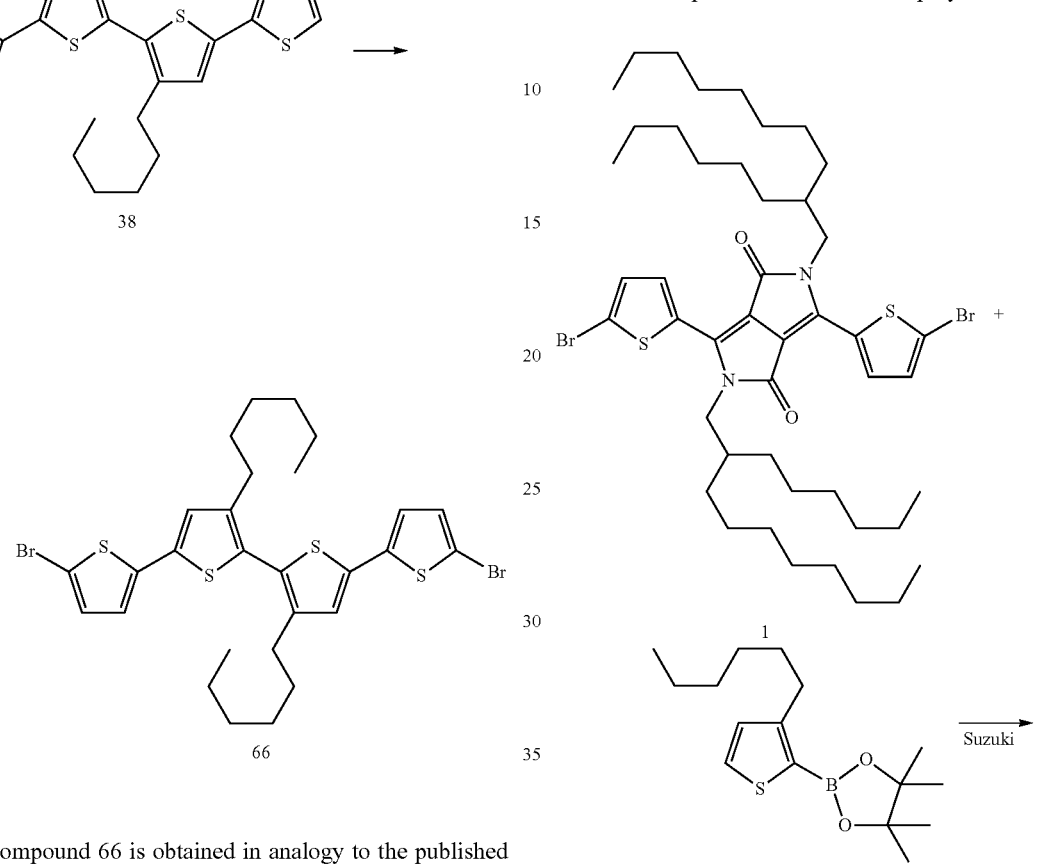
Polymer 67 is obtained in analogy to Example 1 using 0.5 equivalent of 5, 1.0 equivalent of 65 and 0.5 equivalent 67.
Example 34
Preparation of Random Copolymer 71
b) Compound 66 is obtained in analogy to the published bromination (Higuchi H. et al; Bull. Chem. Soc. Jap., 1995, 68; 8, 2363-2378.
c)
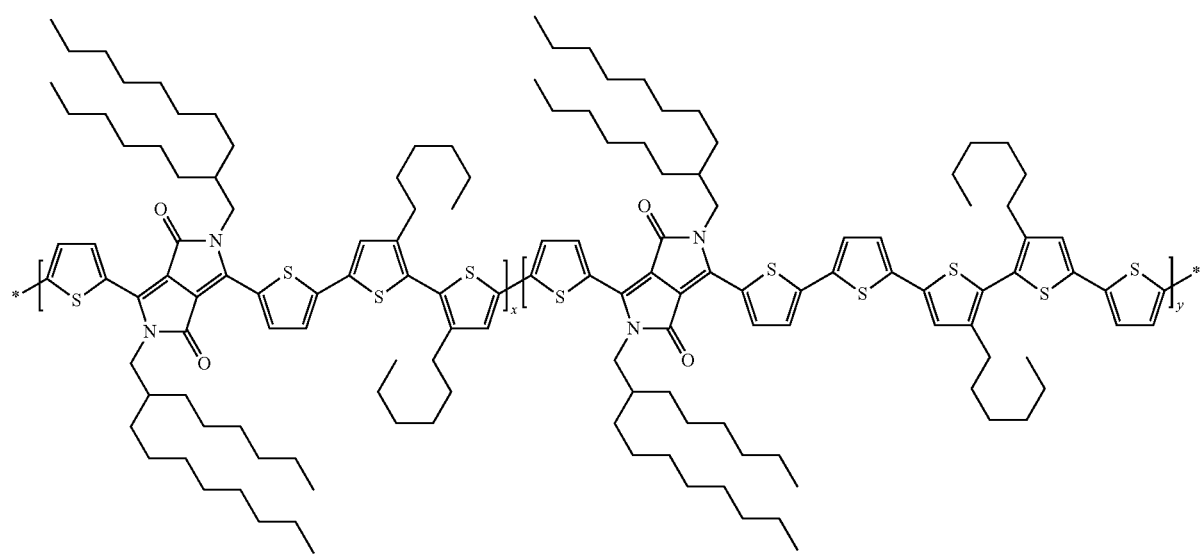

-continued

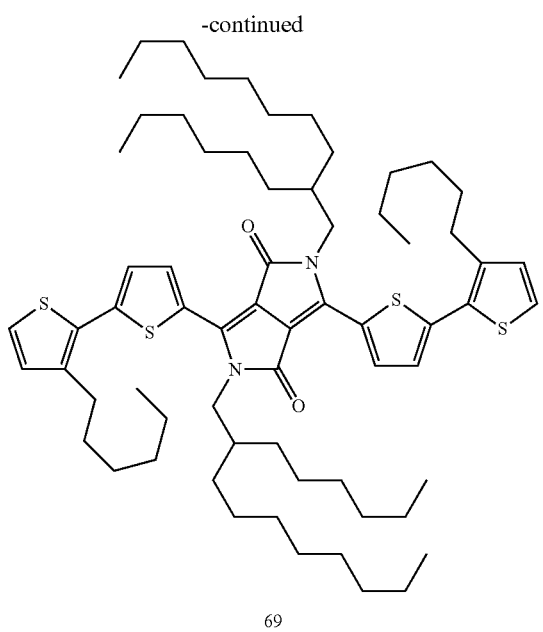

69 a) 20.1 g of 1, 16.75 g of 68, 0.33 g of tri-tert-butylphosphonium tetrafluoroborate ((t-Bu)$_3$P*HBF$_4$ and 0.52 g of tris (dibenzylideneacetone) dipalladium (0) (Pd$_2$(dba)$_3$) are degassed in the reaction vessel with argon. 400 ml of tetrahydrofuran and 14.2 g of potassium phosphate (K$_3$PO$_4$) dissolved in 40 ml of water (previously degassed) are added. After 12 hour of reflux, the reaction mixture is cooled to room temperature and precipitated in methanol. Flash chromatography afforded the title compound as blue powder (16.8 g).

$^1$H-NMR data (ppm, CDCl$_3$): 9.03 2H br. s, 7.30 2H d, 7.28 2H br. s, 7.01 2H s, 4.07 4H d, 2.85 4H t, 2.01 2H m, 1.76 4H pent, 1.55-1.25 60H m, 0.90-0.85 18H m;

69 →

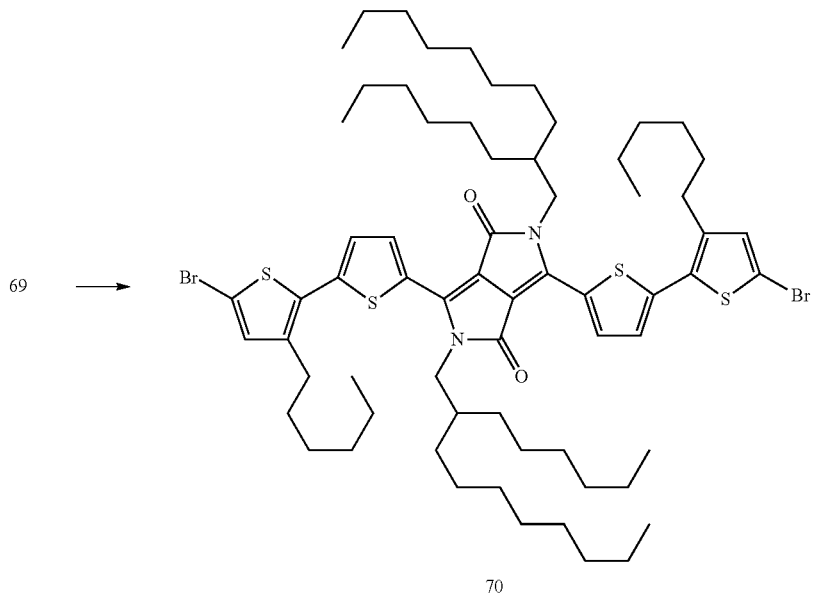 [SMILES: CCCCCCCCC(CCCCCC)CN1C(=O)C2=C(c3ccc(-c4sc(Br)cc4CCCCCC)s3)N(CC(CCCCCC)CCCCCCCC)C(=O)C2=C1c1ccc(-c2sc(Br)cc2CCCCCC)s1]

70 b) 10 g of compound 69 are dissolved in 100 mL of chloroform. 0.02 mL perchloric acid are added as activator. 3.0 g of N-Bromosuccinimide are added portion wise at −20° C. The reaction mixture is stirred at this temperature for 3 hours before it is allowed to reach room temperature. The reaction mixture is then extracted with 300 mL of water and 100 mL of brine. The organic phase is concentrated and purified with a flash chromatography to yield 9.1 g of the title compound as blue powder.

$^1$H-NMR data (ppm, CDCl$_3$): 8.99 2H br. s, 7.22 2H d, 6.96 2H s, 4.05 4H d, 2.79 4H t, 1.98 2H m, 1.66 4H pent, 1.63-1.23 60H m, 0.91-0.85 18H m;

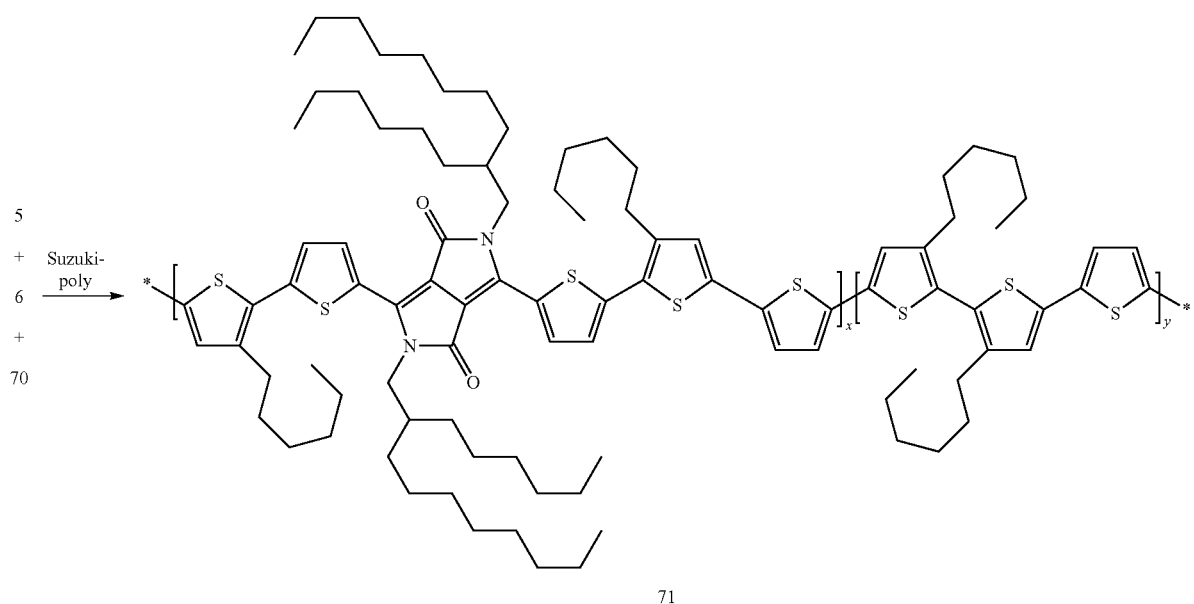

c) 1.0 g of 70, 0.1 g of 5, 0.34 g of 6, 15.0 mg of tri-tert-butylphosphonium tetrafluoroborate ((t-Bu)$_3$P*HBF$_4$, 24.0 mg of tris(dibenzylideneacetone) dipalladium (0) (Pd$_2$(dba)$_3$) in 17.5 ml of tetrahydrofuran and 0.64 g of potassium phosphate (K$_3$PO$_4$) dissolved in 4 ml of water (previously degassed) are used. After 2 hours of reflux 16 mg bromo-thiophene and 20 minutes later 21 mg thiophene-boronic acid pinacol ester are added to stop the polymerisation reaction. The reaction mixture is cooled to room temperature and precipitated in methanol. The residue is purified by soxhlet extraction using cyclohexane and THF and the polymer is then extracted with chloroform to give 0.18 g of a dark powder. Mw=28,100, Polydispersity=2.2 (measured by HT-GPC).

Example 35

Preparation of Random Copolymer 72

Polymer 72 (Example 35) shown below is prepared in analogy to example 34, varying the ratio of the two dibromides used in the synthesis

TABLE 7

| Example | Polymer | R$^1$ | R$^3$ | R$^{15}$ | Ratio x:y | Mw | Pd |
|---|---|---|---|---|---|---|---|
| 34 | 71 | 2-hexyl-decyl | Hexyl | Hexyl | 0.80:0.20 | 28'100 | 2.2 |
| 35 | 72 | 2-hexyl-decyl | Hexyl | Hexyl | 0.50:0.50 | 28'500 | 1.9 |

Example 36-38
Synthesis of Random Copolymers 75-77
2 + 4 ⟶ 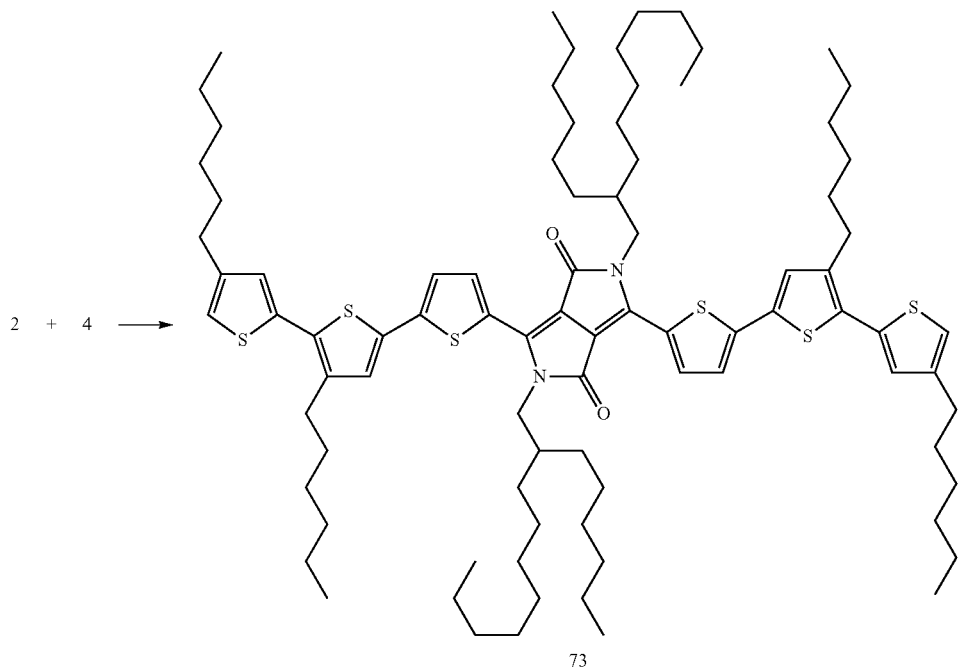 [SMILES: CCCCCCCCC(CCCCCC)CN1C(=O)C2=C(c3ccc(-c4cc(CCCCCC)c(-c5cc(CCCCCC)cs5)s4)s3)N(CC(CCCCCC)CCCCCCCC)C(=O)C2=C1c1ccc(-c2cc(CCCCCC)c(-c3cc(CCCCCC)cs3)s2)s1]
a) Compound 73 is obtained in analogy to compound 3 in example 1 using 15 g of 4, 9.26 g of 2, 0.22 g tris(dibenzylideneacetone) dipalladium (0) (Pd$_2$(dba)$_3$) 0.17 g of tri-tert-butylphosphonium tetrafluoroborate ((t-Bu)$_3$P*HBF$_4$ ligand in 150 ml THF and 12.8 g potassium phosphate (K$_3$PO$_4$) in 15 ml water, yielding 14.8 g of a blue powder.
73 ⟶ 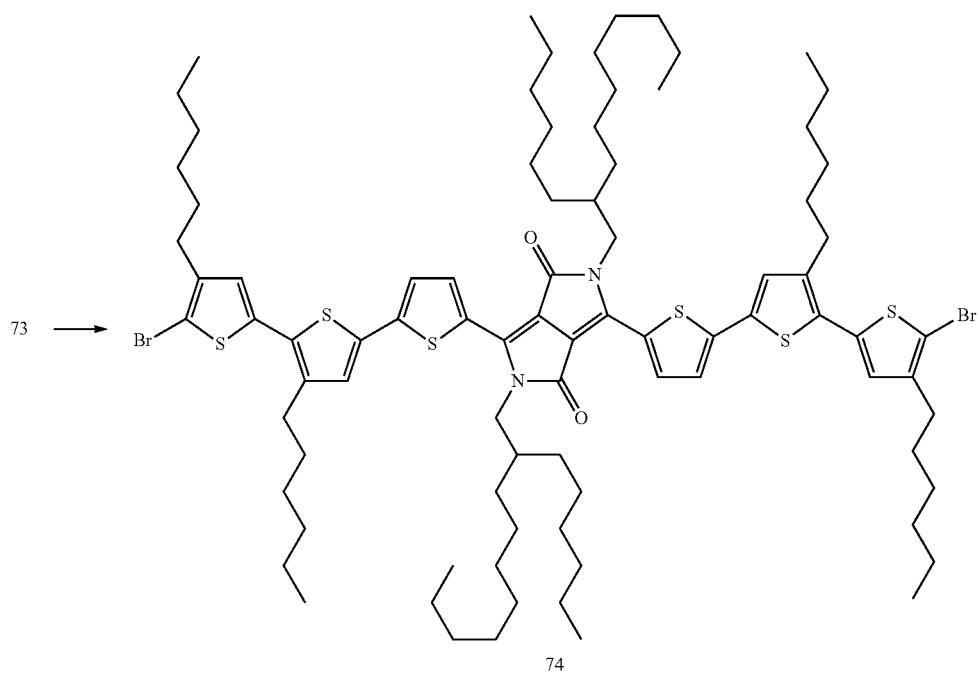 [SMILES: CCCCCCCCC(CCCCCC)CN1C(=O)C2=C(c3ccc(-c4cc(CCCCCC)c(-c5cc(CCCCCC)c(Br)s5)s4)s3)N(CC(CCCCCC)CCCCCCCC)C(=O)C2=C1c1ccc(-c2cc(CCCCCC)c(-c3cc(CCCCCC)c(Br)s3)s2)s1]

b) The bromination of 73, which results in 74, is done in analogy to example 2c of WO2008000664 using 14.7 g of 73 and 3.6 g of N-bromosuccinimid (NBS), yielding 12.8 g of a blue powder.

5 + 6 + 74 →

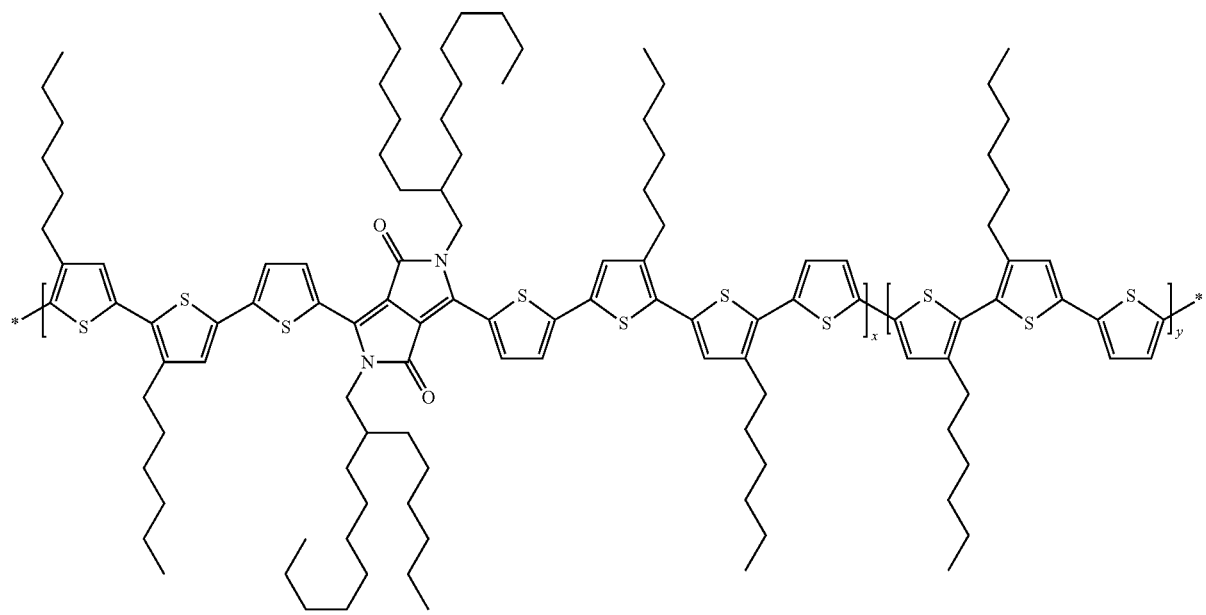

75-77 c) Polymers 75-77 (Example 36-38) shown in table 7 below are prepared in analogy to example 1, varying the ratio of the two dibromides 5 and 74 used in the synthesis

TABLE 8

| Example | Polymer | Ratio x:y | Mw | Pd |
|---------|---------|-----------|--------|-----|
| 36 | 75 | 0.80:0.20 | 72'900 | 1.7 |
| 37 | 76 | 0.50:0.50 | 90'400 | 1.8 |
| 38 | 77 | 0.50:0.50 | 52'000 | 2.3 |

Application Example 1

DPP Random-Copolymer 7 based Organic Field Effect Transistor

Bottom-gate thin film transistor (TFT) structures with p-Si gate (10 cm) are used for all experiments. A high-quality thermal $SiO_2$ layer of 300 nm thickness served as gate-insulator of $C_i$=32.6 nF/cm$^2$ capacitance per unit area. Source and drain electrodes are patterned by photolithography directly on the gate-oxide. Gold source drain electrodes defining channels of width W=10 mm and varying lengths L=4, 8, 15, 30 m are used. Prior to deposition of the organic semiconductor the $SiO_2$ surface is derivatized either with hexadimethylsilazane (HMDS) by exposing to a saturated silane vapour at 160° C. for 2 hours, by spin coating the HMDS at a spinning speed of 800 rpm (rounds per minute) for about a minute or by treating the substrate at 60° C. with a 0.1 m solution of octadecyltrichlorosilane (OTS) in toluene for 20 minutes. After rinsing with iso-propanol the substrates are dried. The semiconductor thin film is prepared either by spin-coating or drop casting the DPP derivative of the formula 7 obtained in example 1 in a 0.5% (w/w) solution in ortho-dichlorobenzene. The spin coating is accomplished at a spinning speed of 1000 rpm (rounds per minute) for about 60 seconds in ambient conditions. The devices are evaluated as-deposited and after drying at 100° C. for 15 minutes.

Transistor Performance in Ortho-Dichlorobenzene

The transistor behaviour is measured on an automated transistor prober (TP-10). From a linear fit to the square root of the saturated transfer characteristics a field effect mobility of $1.0 \times 10^{-2}$ cm$^2$/Vs with an on/off current ratio of $1.8 \times 10^5$ can be determined after drying. The threshold voltage is at 8.2 V. Additional organic field effect transistors are prepared by replacing polymer 7 by polymers 10, 12, 15, 16, 18, 19, 20, 28, 29, 30, 31, 32, 35, 41, 42, 49, 51, 52, 71, 72, 75, 76 and 77. Reference is made to table 9.

TABLE 9

Application Examples 2-22: organic field effect transistors

| Appl. Example | Polymer | Mobility [cm$^2$/Vs] | On/off ratio | Threshold Voltage (V) |
|---|---|---|---|---|
| 1 | 7 | $1.0 \times 10^{-2}$ | $1.8 \times 10^5$ | 8.2 |
| 2 | 10 | $3.6 \times 10^{-3}$ | $5.3 \times 10^4$ | 0.4 |
| 3 | 12 | $1.4 \times 10^{-2}$ | $2.6 \times 10^5$ | 6.8 |
| 4 | 13 | $2.1 \times 10^{-3}$ | $5.0 \times 10^4$ | −3.9 |
| 5 | 15 | $3.2 \times 10^{-3}$ | $8.1 \times 10^4$ | 7.0 |
| 6 | 16 | $1.3 \times 10^{-2}$ | $1.3 \times 10^5$ | 4.0 |
| 7 | 18 | $2.8 \times 10^{-2}$ | $1.1 \times 10^6$ | 4.8 |
| 8 | 19 | $2.2 \times 10^{-3}$ | $1.5 \times 10^5$ | −0.4 |
| 9 | 20 | $4.0 \times 10^4$ | $9.7 \times 10^3$ | −7.1 |
| 10 | 28 | $2.5 \times 10^{-3}$ (CHCl$_3$) | $3.8 \times 10^4$ | −1.6 |
| 11 | 29 | $1.1 \times 10^{-2}$ | $1.0 \times 10^5$ | 2.0 |
| 12 | 30 | $5.3 \times 10^{-2}$ | $5.1 \times 10^6$ | 4.8 |
| 13 | 31 | $2.9 \times 10^{-2}$ | $8.7 \times 10^5$ | −1.6 |
| 14 | 32 | $1.3 \times 10^{-2}$ | $7.0 \times 10^5$ | 7.1 |
| 15 | 35 | $1.2 \times 10^{-2}$ | $1.8 \times 10^5$ | 6.9 |
| 16 | 36 | $3.2 \times 10^{-3}$ | $4.8 \times 10^4$ | 10.0 |

TABLE 9-continued

Application Examples 2-22: organic field effect transistors

| Appl. Example | Polymer | Mobility [cm²/Vs] | On/off ratio | Threshold Voltage (V) |
|---|---|---|---|---|
| 17 | 41 | $1.1 \times 10^{-2}$ | $4.0 \times 10^{5}$ | 3.0 |
| 18 | 42 | $3.1 \times 10^{-2}$ | $3.8 \times 10^{5}$ | 2.3 |
| 19 | 49 | $1.7 \times 10^{-2}$ | $1.6 \times 10^{6}$ | 2.9 |
| 20 | 51 | $1.4 \times 10^{-3}$ | $6.9 \times 10^{4}$ | 0.6 |
| 21 | 52 | $1.9 \times 10^{-3}$ | $4.4 \times 10^{4}$ | 3.5 |
| 22 | 71 | $3.1 \times 10^{-3}$ | $4.9 \times 10^{4}$ | -1.3 |
| 23 | 72 | $2.3 \times 10^{-3}$ | $5.1 \times 10^{4}$ | 7.9 |
| 24 | 75 | $1.3 \times 10^{-2}$ | $2.1 \times 10^{5}$ | 3.3 |
| 25 | 76 | $3.9 \times 10^{-3}$ | $5.3 \times 10^{4}$ | 3.9 |
| 26 | 77 | $2.2 \times 10^{-3}$ | $8.9 \times 10^{4}$ | -2.5 |

Application Example 27

DPP Random-Copolymer 7 Based Organic Bulk Heterojunction Solar Cell

The solar cell has the following structure: Al electrode/LiF layer/organic layer, including compound of the invention/[poly(3,4-ethylenedioxy-thiophene) (PEDOT): poly(styrenesulfonic acid) (PSS)]/ITO electrode/glass substrate. The solar cells are made by spin coating a layer of the PEDOT:PSS on a pre-patterned ITO on glass substrate. Then a 1:1 mixture of the compound of formula 7 (1% by weight): [60]PCBM or [70]PCBM (a substituted $C_{60}$ or $C_{70}$ fullerene) is spin coated (organic layer). LiF and Al are sublimed under high vacuum through a shadow-mask.

Solar Cell Performance

The solar cell is measured under a solar light simulator. Then with the External Quantum Efficiency (EQE) graph the current is estimated under AM1.5 conditions. This leads to a value of $J_{sc}=13.2$ mA/cm², FF=0.53 and $V_{oc}=0.60$ V for an estimated overall efficiency of 4.2%. Additional solar cells are prepared by replacing polymer 7 by polymers 10, 11, 12, 13, 14, 19, 41, 42, 51, 71, 75 and 76. Reference is made to table 10.

TABLE 10

Application example 28-40: Bulk heterojunction solar cells.

| Appl. Example | Polymer | Overall eff. [%] | Jsc [mA/cm²] | Fill Factor [%] | Voc [V] |
|---|---|---|---|---|---|
| 28 | 7 | 4.2 | 13.2 | 0.53 | 0.60 |
| 29 | 10 | 3.9 | 11.1 | 0.58 | 0.61 |
| 30 | 11 | 4.4 | 11.9 | 0.58 | 0.63 |
| 31 | 12 | 5.0 | 13.0 | 0.60 | 0.64 |
| 32 | 13 | 4.2 | 12.4 | 0.48 | 0.71 |
| 33 | 14 | 1.7 | 6.3 | 0.34 | 0.77 |
| 34 | 19 | 3.3 | 10.2 | 0.53 | 0.61 |
| 35 | 41 | 1.6 | 5.4 | 0.36 | 0.79 |
| 36 | 42 | 2.9 | 10.3 | 0.50 | 0.57 |
| 37 | 51 | 1.7 | 8.0 | 0.36 | 0.58 |
| 38 | 71 | 1.8 | 7.9 | 0.41 | 0.56 |
| 39 | 75 | 2.4 | 10.6 | 0.45 | 0.51 |
| 40 | 76 | 2.6 | 11.0 | 0.56 | 0.42 |

The invention claimed is:

1. A polymer comprising:
(i) one or more repeating unit(s) of the formula ─[─A-D─]─ and at least one repeating unit(s) which is selected from repeating units of the formula ─[─B-D─]─, ─[─A-E─]─, and ─[─B-E─]─, wherein when the polymer comprises repeating units of the formula ─[─A-D─]─ and ─[─B-D─]─, the polymer is a random copolymer, (ii) a polymer comprising one or more repeating unit(s) of the formula

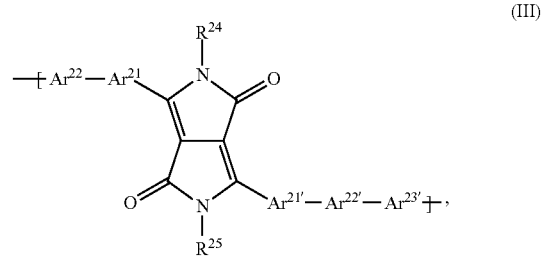

(III)

or (iii) a polymer comprising repeating unit(s) of the formula

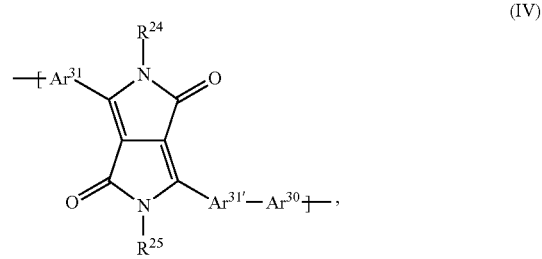

(IV)

wherein $Ar^{23}$ is a group of formula

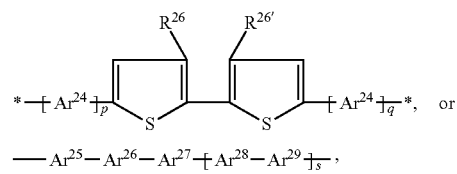

$Ar^{30}$ is a group of formula

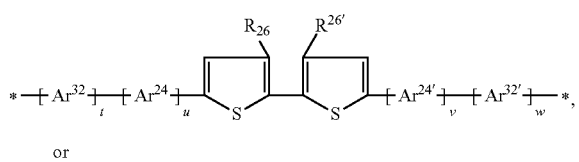

wherein $R^{26}$ and $R^{26'}$ are independently of each other a $C_4$-$C_{18}$alkyl group, A is a group of formula

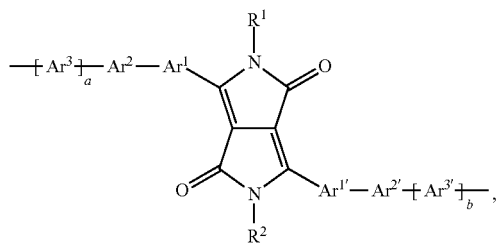

(I)

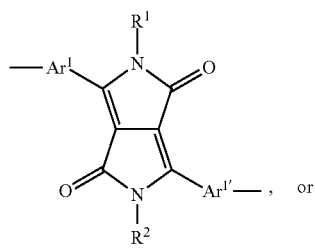

(V)

or

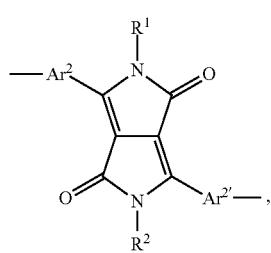

(VI)

a is 0, or an integer of 1, or 2,
b is 0, or an integer of 1, or 2,
p is 0, or an integer of 1, or 2,
y is 0, or 1,
q is 0, or an integer of 1, or 2,
s is 0, or 1,
u is an integer of 1, or 2,
t is 0, or 1,
v is an integer of 1, or 2,
w is 0, or 1,
$Ar^{21}, Ar^{21'}, Ar^{24}, Ar^{24'}, Ar^{25}, Ar^{27}, Ar^{29}, Ar^{31}, Ar^{31'}, Ar^{38}, Ar^{34}, Ar^{36}, Ar^{39}, Ar^1$ and $Ar^{1'}$ are independently of each other a group of formula

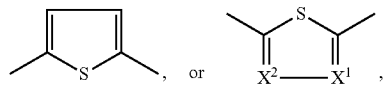

$Ar^3$ and $Ar^{3'}$ independently of each other have the meaning of $Ar^1$, or are a group of formula

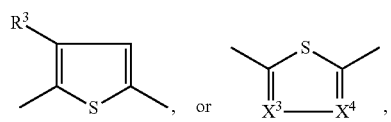

$Ar^2, Ar^{2'}, Ar^{26}, Ar^{28}, Ar^{33}, Ar^{35}, Ar^{37}, Ar^{32}, Ar^{32'}, Ar^{22}$ and $Ar^{22'}$ are independently of each other a group of formula

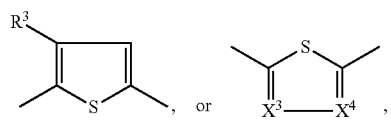

one of $X^1$ and $X^2$ is N and the other is CH,
one of $X^3$ and $X^4$ is N and the other is $CR^{3'}$, $R^1, R^2, R^{24}$ and $R^{25}$ may be the same or different and are selected from hydrogen, a $C_1$-$C_{100}$alkyl group, a $C_6$-$C_{24}$aryl, which can be substituted one to three times with $C_1$-$C_8$alkyl, $C_1$-$C_8$thioalkoxy, and/or $C_1$-$C_8$alkoxy, or pentafluorophenyl, $R^3$ and $R^{3'}$ are independently of each other a $C_1$-$C_{25}$alkyl group, which may optionally be interrupted by one or more oxygen atoms, B is a group of formula

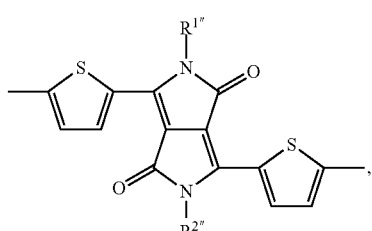

(Va)

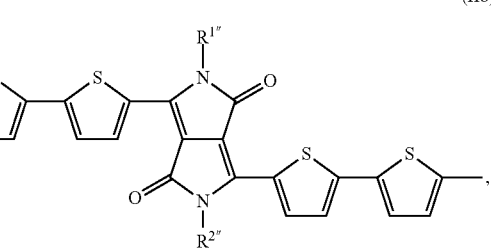

(IIb)

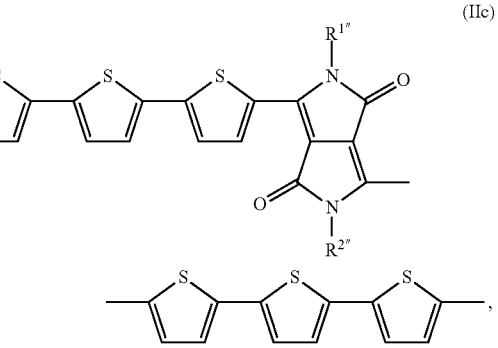

(IIc)

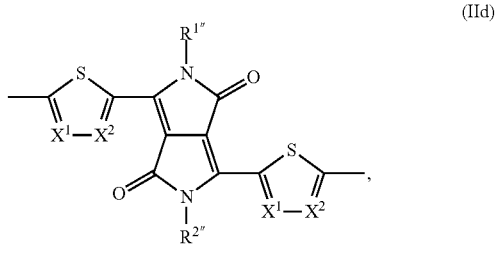

(IId)

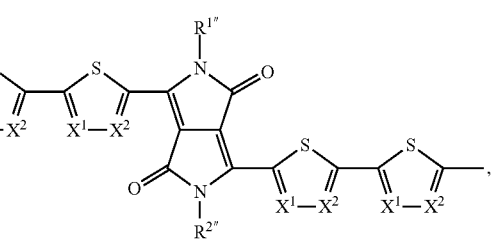

(IIe)

-continued (IIf)
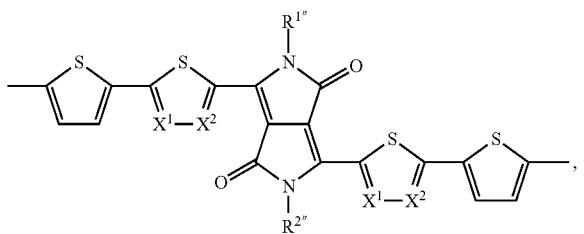

(IIg)
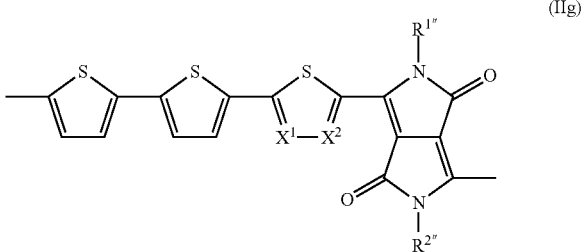

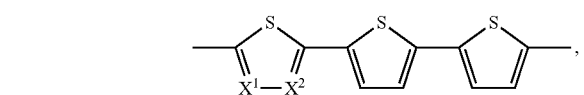

(IIh)
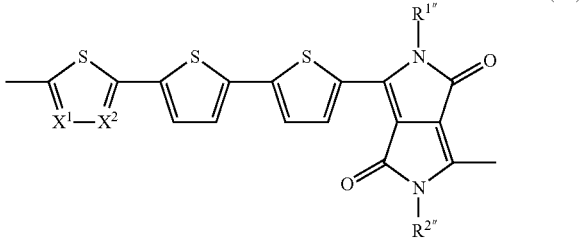

or (IIi)
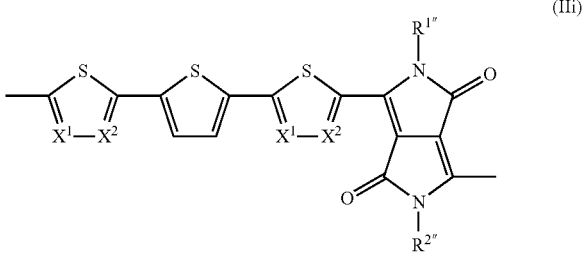

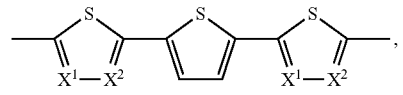

wherein
X¹ and X² are as defined above,
R¹" and R²" may be the same or different and are selected from hydrogen, a $C_1$-$C_{36}$alkyl group, a $C_6$-$C_{24}$aryl, which can be substituted one to three times with $C_1$-$C_8$alkyl, $C_1$-$C_8$thioalkoxy, and/or $C_1$-$C_8$alkoxy, or pentafluorophenyl,
and
D and E are independently of each other a group of formula $$*\!-\!(\mathrm{Ar}^4)_k\!-\!(\mathrm{Ar}^5)_l\!-\!(\mathrm{Ar}^6)_r\!-\!(\mathrm{Ar}^7)_z\!-\!*,$$

(II)
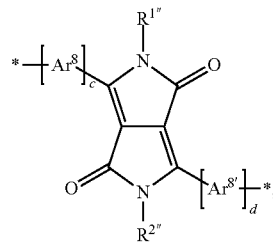

or
formula I, with the proviso that in case D and E are a group of formula I, they are different from A, wherein
k is 1,
l is 0, or 1,
r is 0, or 1,
z is 0, or 1, and
Ar⁴, Ar⁵, Ar⁶ and Ar⁷ are independently of each other a group of formula

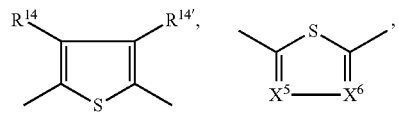

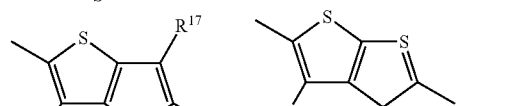

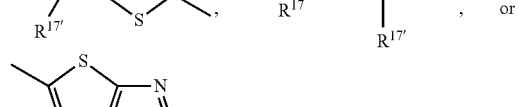

wherein
one of X⁵ and X⁶ is N and the other is $CR^{14}$,
c is an integer of 1, 2, or 3,
d is an integer of 1, 2, or 3,
Ar⁸ and Ar⁸' are independently of each other a group of formula

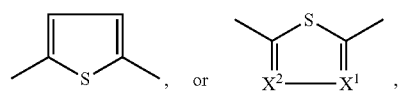

X¹, X², R¹", and R²" are as defined above,
R¹⁴, R¹⁴', R¹⁷ and R¹⁷' are independently of each other H, or a $C_1$-$C_{25}$alkyl group, which may optionally be interrupted by one or more oxygen atoms,
wherein A, B, and D and E are different from each other.

2. The polymer according to claim 1, wherein A is a group of formula
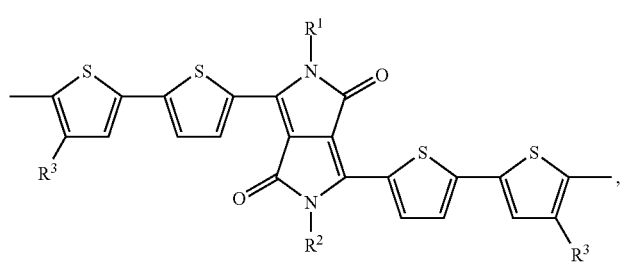
(Ia)
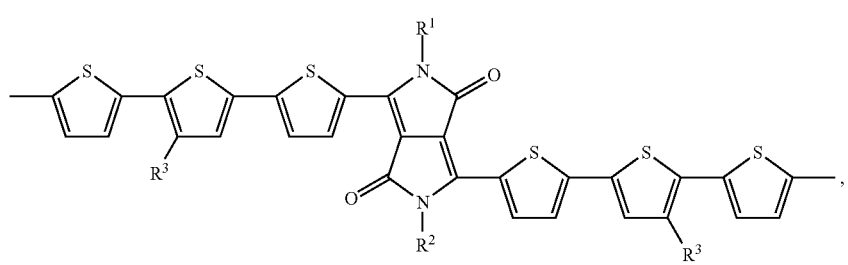
(Ib)
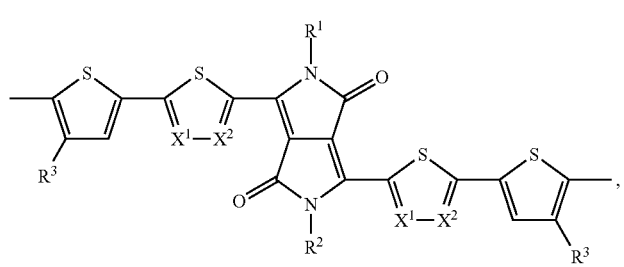
(Ic)
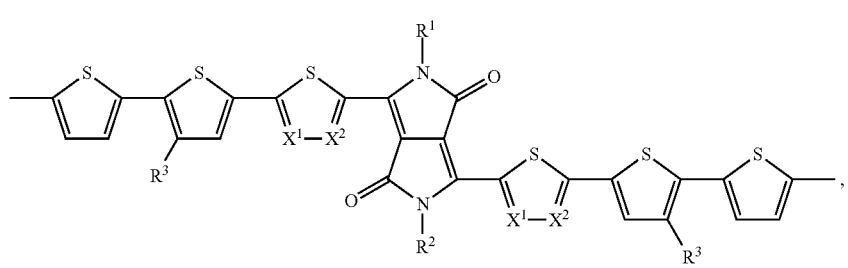
(Id)
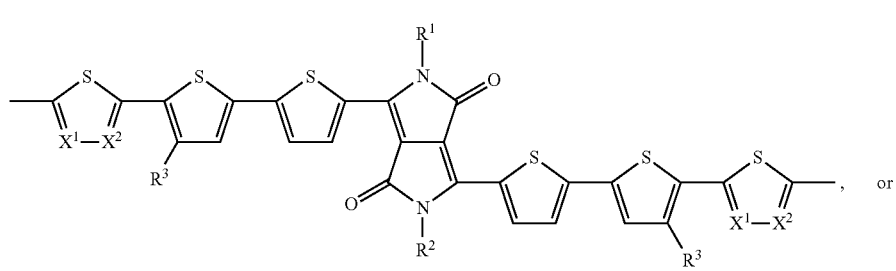
(Ie)
, or
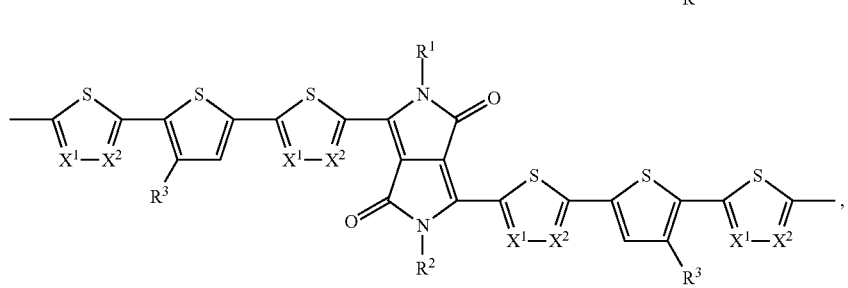
(If)

-continued

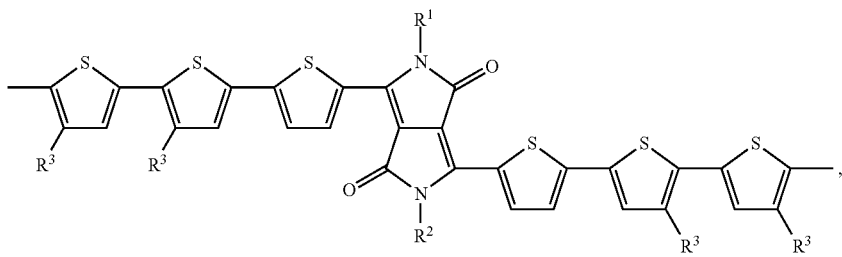

(Ig)

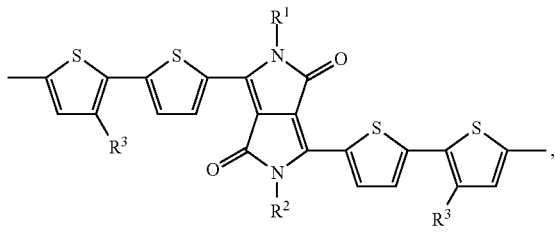

(Ih)

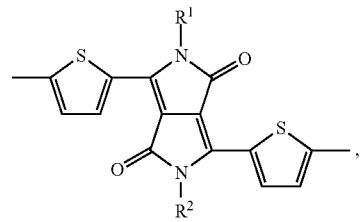

(Va)

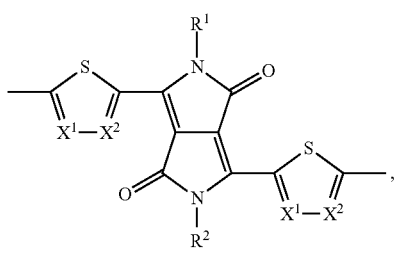

(Vb)

(VIa)

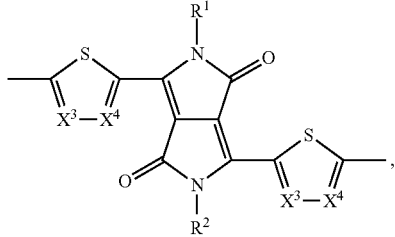

(VIb)

wherein $X^1$, $X^2$, $X^3$, $X^4$, $R^1$, $R^2$ and $R^3$ are as defined in claim 1.

3. The polymer according to claim 1, wherein D and E are independently of each other a group of formula

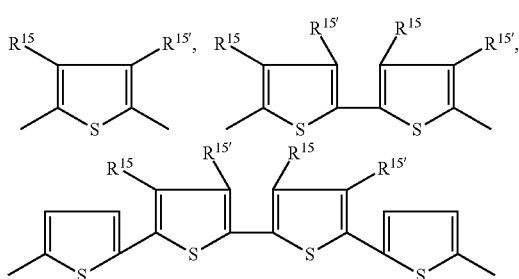

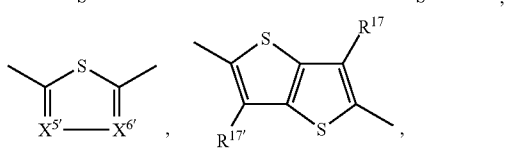

-continued

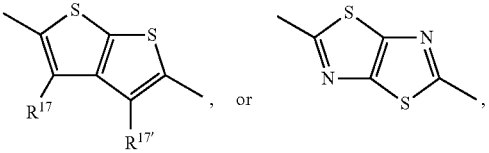

wherein one of $X^{5'}$ and $X^{6'}$ is N and the other is $CR^{14}$, or CH, $R^{15}$, $R^{15'}$, $R^{17}$ and $R^{17'}$ are independently of each other H, or a $C_1$-$C_{25}$alkyl group, which may optionally be interrupted by one or more oxygen atoms, and $R^{14}$ is a $C_1$-$C_{25}$alkyl group, which may optionally be interrupted by one or more oxygen atoms.

4. A polymer comprising repeating units of the formula $$*\!-\!\!\left[\!A\!-\!D\!\right]_{\!x}\!\!-\!*, \quad \text{and} \quad *\!-\!\!\left[\!B\!-\!D\!\right]_{\!y}\!\!-\!*,$$

wherein A is a group of formula
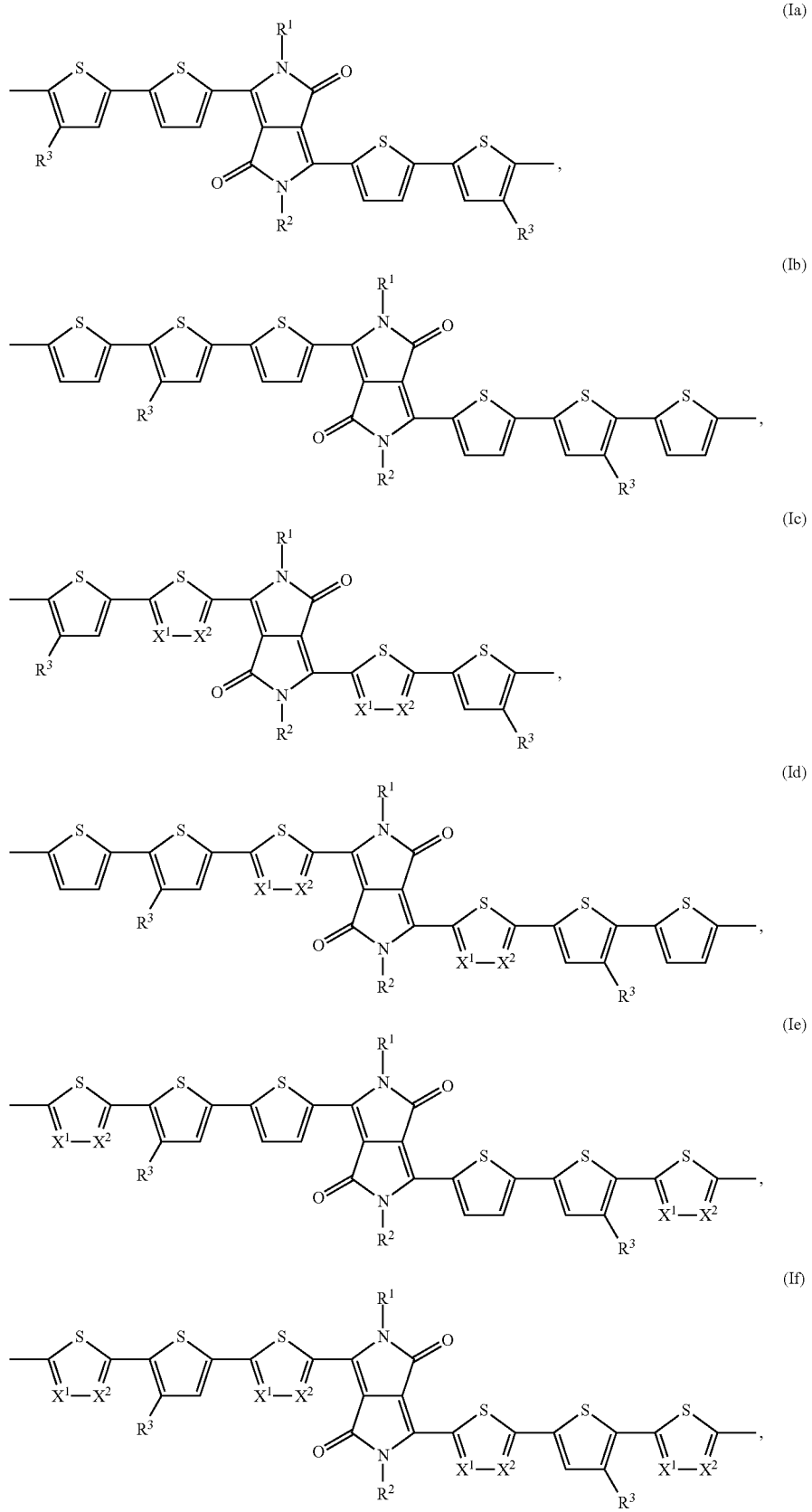

-continued
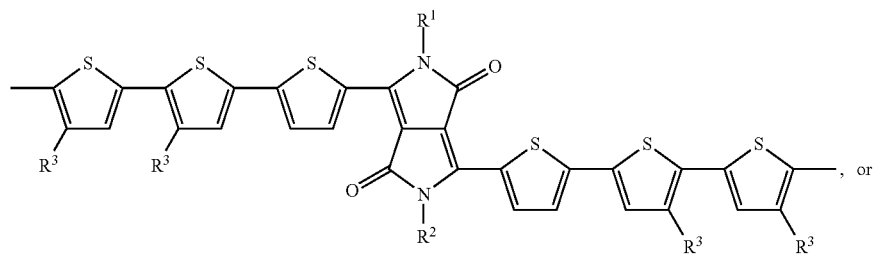
(Ig)
, or
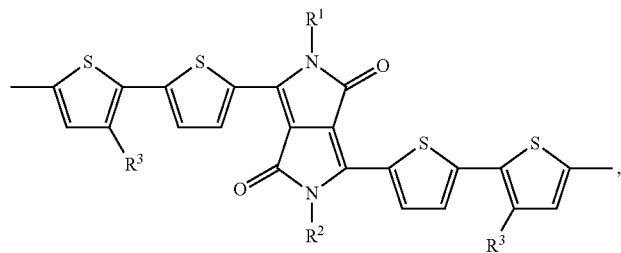
(Ih)
,
$R^1$ and $R^2$ are a $C_8$-$C_{35}$alkyl group,
$R^3$ is a $C_4$-$C_{18}$alkyl group, and
B is a group of formula
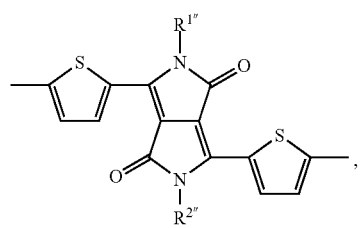
(Va)
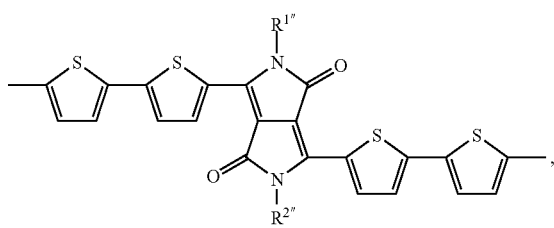
(IIb)
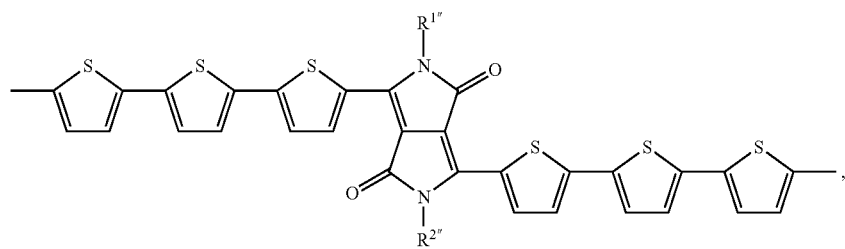
(IIc)
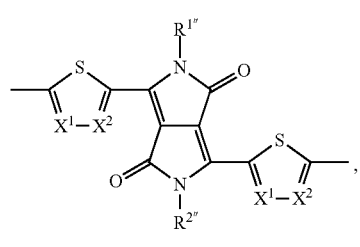
(IId)
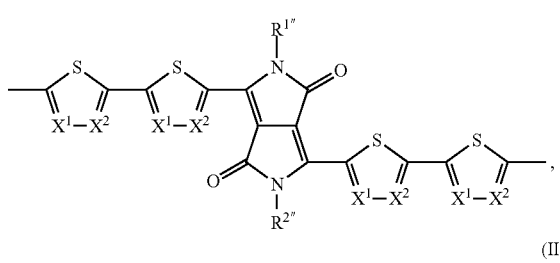
(IIe)
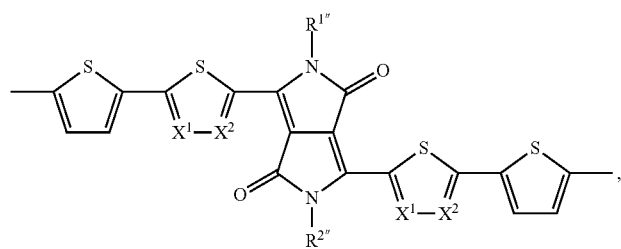
(IIf)

(IIg)
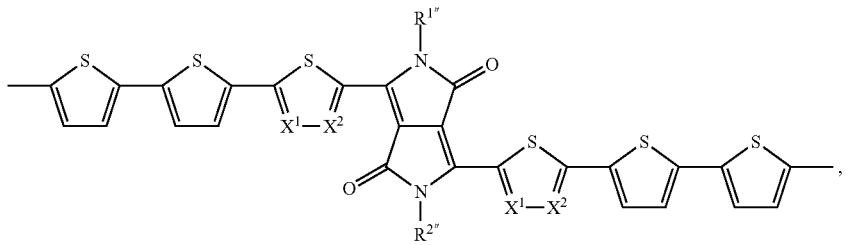
(IIh)
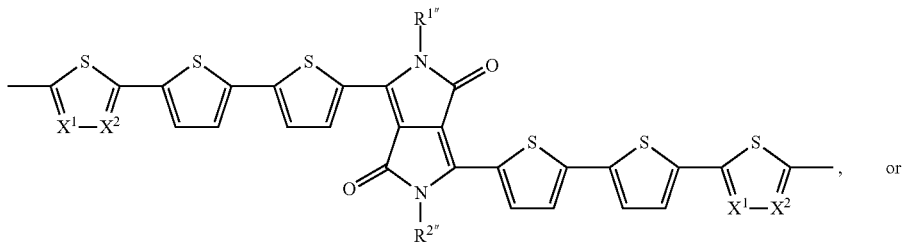
or
(IIi)
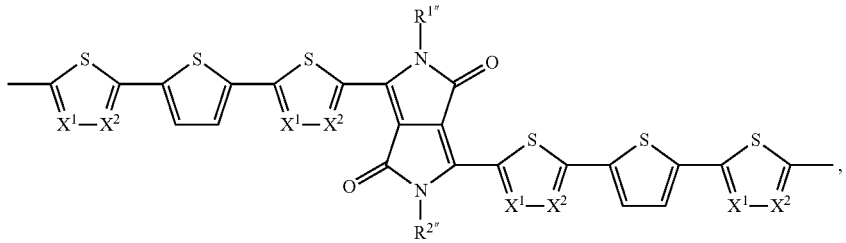
or a group of formula Ia, Ib, Ic, Id, Ie, If, or Ig, with the proviso that B is different from A,
$R^{1''}$ and $R^{2''}$ are a $C_8$-$C_{35}$alkyl group,
one of $X^1$ and $X^2$ is N and the other is CH,
D is a group of formula
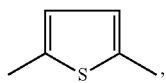,
or
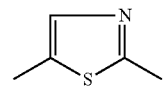
and
$x=0.995$ to $0.005$, $y=0.005$ to $0.995$, and wherein $x+y=1$.
5. A polymer of formula
(IIIa)
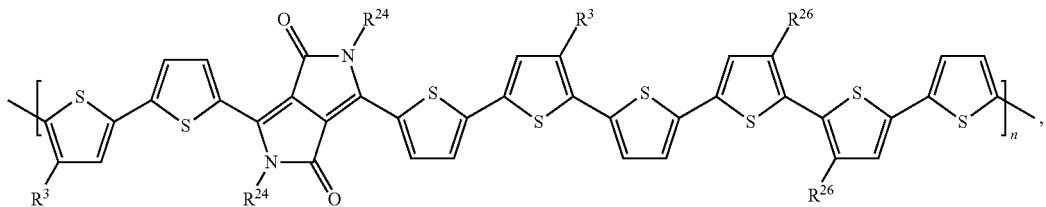
(IIIb)
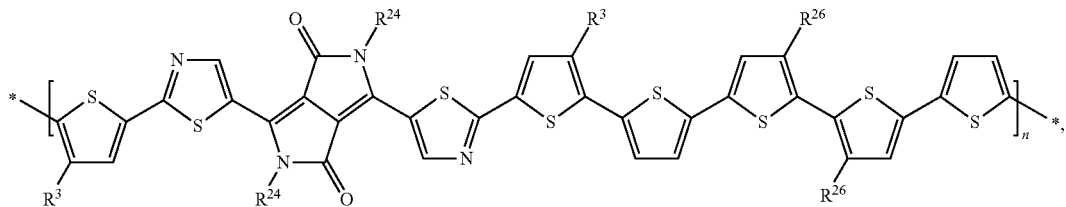

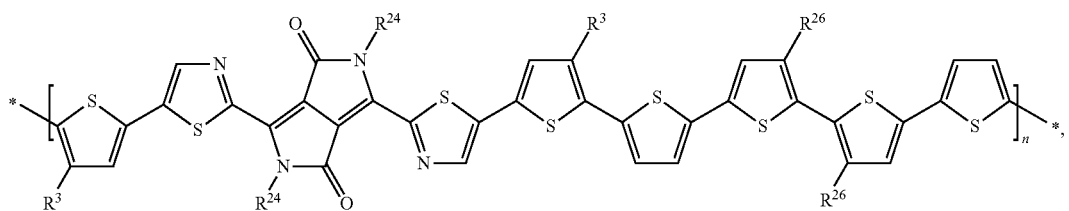
(IIIc)
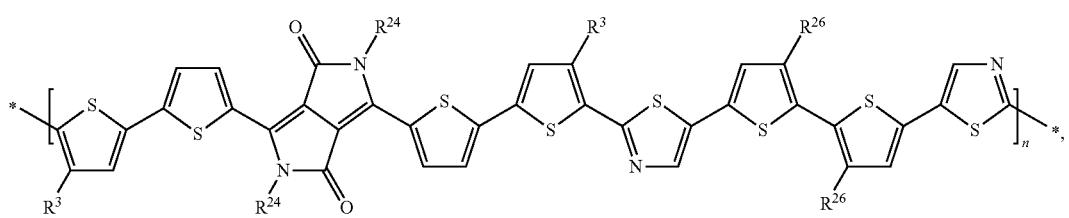
(IIId)
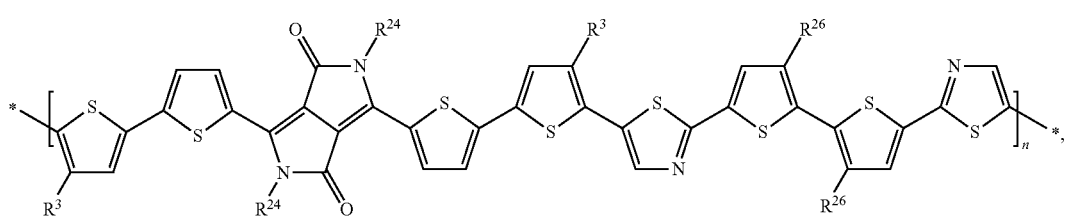
(IIIe)
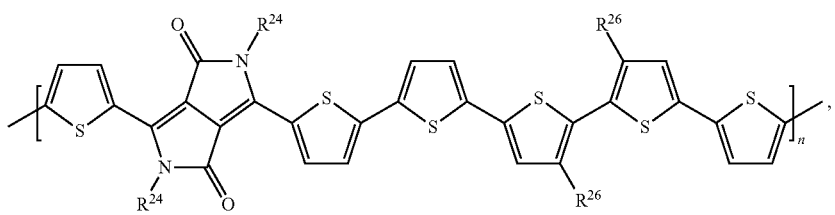
(IVa)
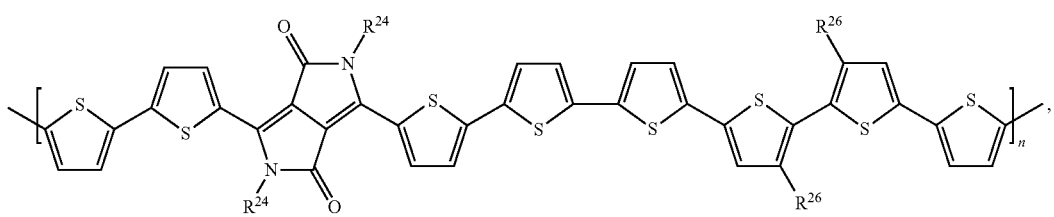
(IVb)
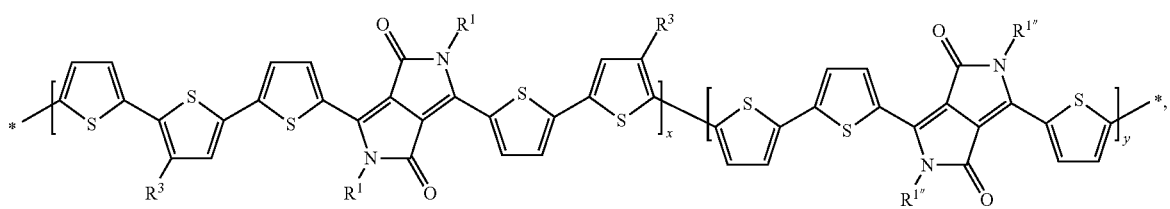
(VIIa)
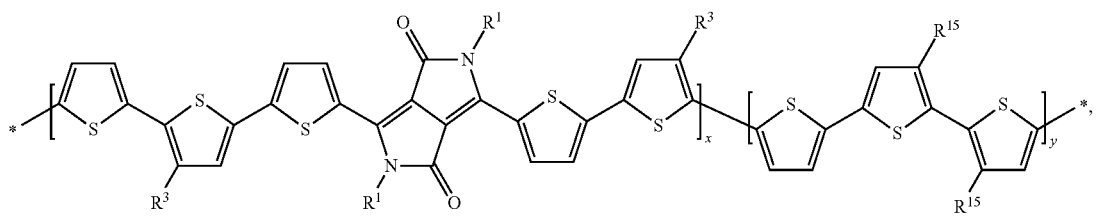
(VIIb)

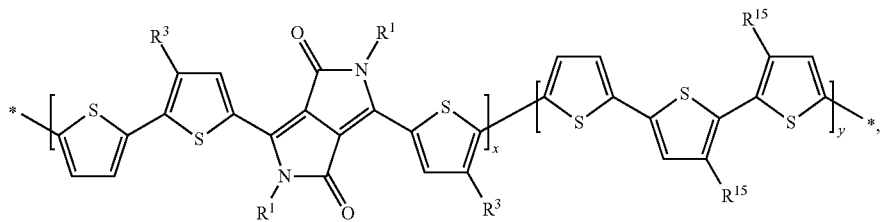
(VIIc)
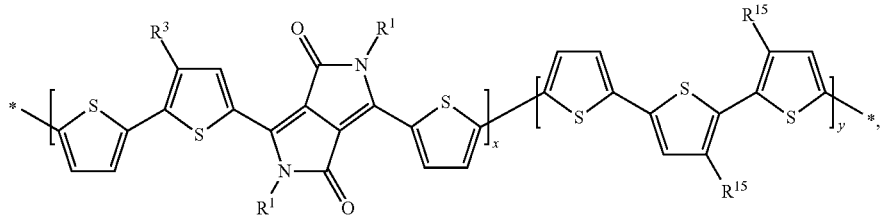
(VIId)
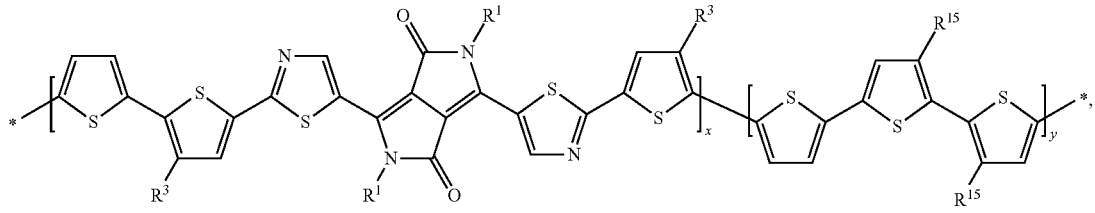
(VIIe)
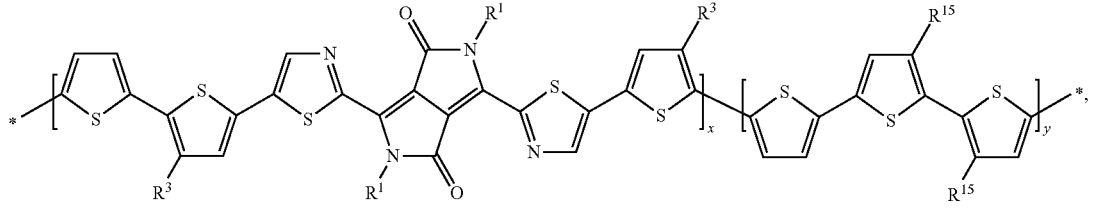
(VIIf)
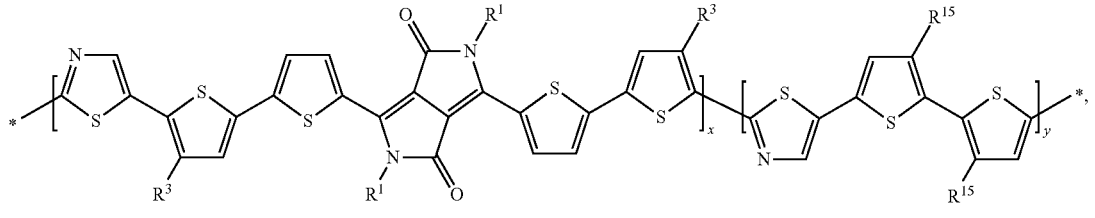
(VIIg)
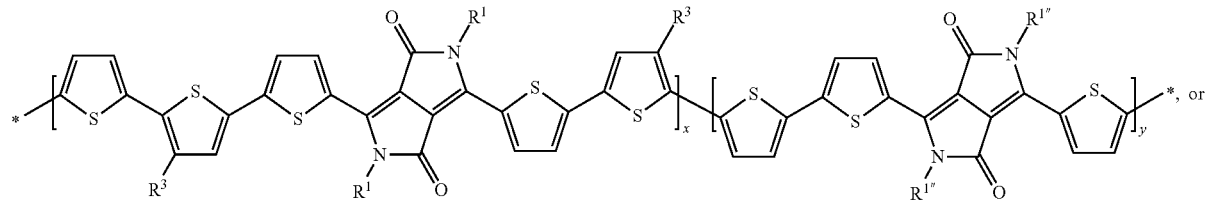
(VIIh), or
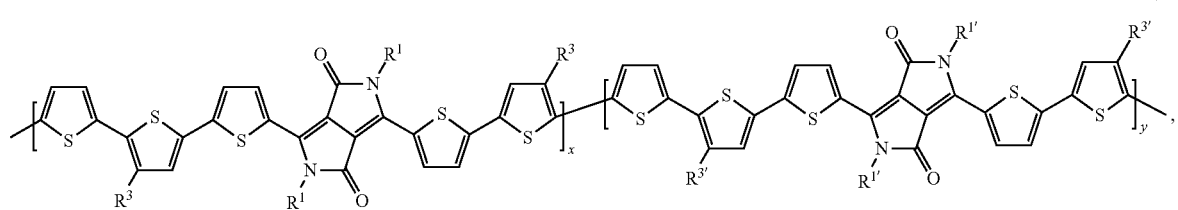
(VIIi)

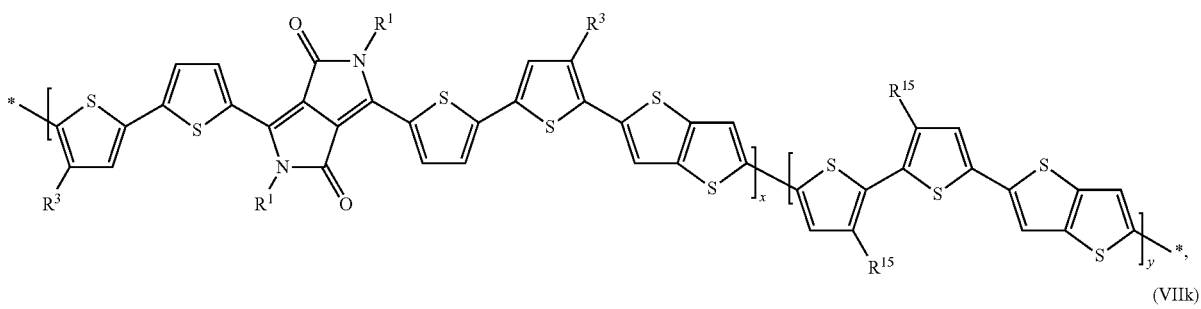

(VIIk)

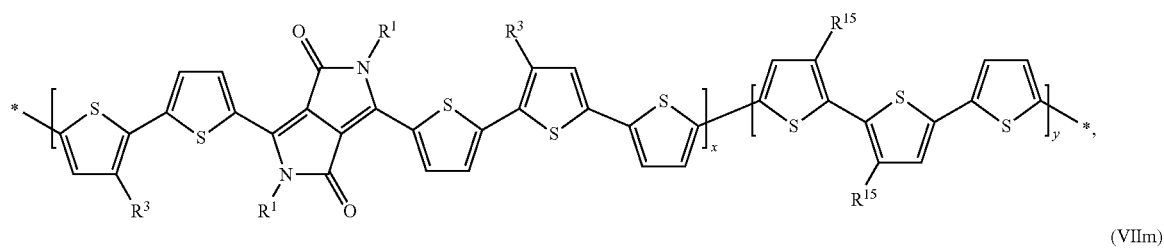

(VIIm)

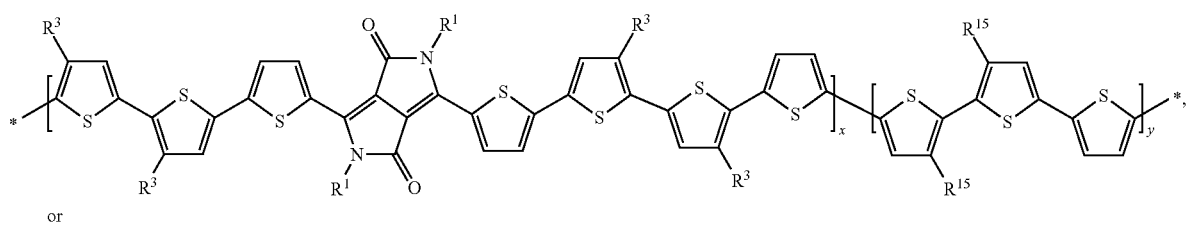

or (VIIn)

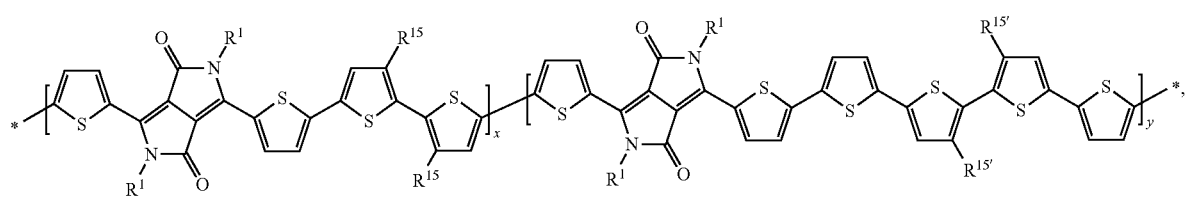

wherein
$R^{24}$, $R^1$ and $R^{1'''}$ are a $C_8$-$C_{38}$alkyl group,
$R^{15}$, $R^{15'}$, $R^3$ and $R^{26}$ are a $C_1$-$C_{18}$alkyl group,
$R^{1'}$ is $C_8$-$C_{36}$alkyl,
$R^{3'}$ is $C_1$-$C_{18}$alkyl, $R^1 \neq R^{1'}$ and/or $R^3 \neq R^{3'}$,
n is 4 to 1000,
x is 0.005 to 0.995,
y is 0.995 to 0.005, and
wherein m+n=1.

6. The polymer according to claim 1 wherein $R^1$ and $R^2$ are a (branched) $C_8$-$C_{36}$alkyl group.

7. An organic semiconductor material, layer or component, comprising the polymer according to claim 1.

8. A semiconductor device, comprising the polymer according to claim 1.

9. The semiconductor device according to claim 8, which is an organic photovoltaic (PV) device, a photodiode, or an organic field effect transistor.

10. The PV device according to claim 9, wherein the PV device comprises in this order:
(a) a cathode (electrode),
(b) optionally a transition layer,
(c) a photoactive layer,
(d) optionally a smoothing layer,
(e) an anode (electrode), and
(f) a substrate.

11. A process for preparation of an organic semiconductor device, which process comprises:
applying a solution and/or dispersion of the polymer according to claim 1 in an organic solvent to a suitable substrate; and
removing the solvent.

12. A method of using the polymer according to claim 1 comprising adding the polymer according to claim 1 in PV devices, photodiodes, or organic field effect transistors.

13. The polymer according to claim 5,
wherein n is 4 to 200.

14. The polymer according to claim 5,
wherein n is 5 to 100.

15. The PV device according to claim 10,
wherein the transition layer is an alkali halogenide.

16. The PV device according to claim 15,
wherein the alkali halogenide is lithium fluoride.

* * * * *